United States Patent
Gardner et al.

(10) Patent No.: US 12,501,602 B2
(45) Date of Patent: Dec. 16, 2025

(54) 3D HYBRID MEMORY USING HORIZONTALLY ORIENTED CONDUCTIVE DIELECTRIC CHANNEL REGIONS

(71) Applicant: Tokyo Electron Limited, Tokyo (JP)

(72) Inventors: Mark I. Gardner, Albany, NY (US);
H. Jim Fulford, Albany, NY (US);
Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 637 days.

(21) Appl. No.: 17/866,154

(22) Filed: Jul. 15, 2022

(65) Prior Publication Data

US 2023/0019692 A1 Jan. 19, 2023

Related U.S. Application Data

(60) Provisional application No. 63/222,868, filed on Jul. 16, 2021.

(51) Int. Cl.
| | | |
|---|---|---|
| *H01L 27/108* | (2006.01) | |
| *H01L 29/06* | (2006.01) | |
| *H01L 29/423* | (2006.01) | |
| *H01L 29/775* | (2006.01) | |
| *H01L 29/786* | (2006.01) | |
| *H10B 12/00* | (2023.01) | |
| *H10D 30/43* | (2025.01) | |
| *H10D 30/67* | (2025.01) | |
| *H10D 62/10* | (2025.01) | |

(52) U.S. Cl.
CPC ............ *H10B 12/00* (2023.02); *H10D 30/43* (2025.01); *H10D 30/6735* (2025.01); *H10D 30/6755* (2025.01); *H10D 30/6757* (2025.01); *H10D 62/121* (2025.01)

(58) Field of Classification Search
CPC ........ H10B 12/00; H10B 12/03; H10B 12/05; H10B 12/30; H10D 30/43; H10D 30/6735; H10D 30/6755; H10D 30/6757; H10D 62/121; H10D 99/00; H10D 30/014
USPC .......................................................... 257/66
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 10,840,146 B1* | 11/2020 | Paul ..................... | H10D 64/017 |
| 2018/0040695 A1 | 2/2018 | Smith et al. | |
| 2020/0098756 A1 | 3/2020 | Lilak et al. | |
| 2020/0105751 A1* | 4/2020 | Dewey ................. | H10D 62/235 |
| 2021/0083120 A1 | 3/2021 | Lin et al. | |
| 2021/0184052 A1* | 6/2021 | Gomes ............... | H10D 30/6735 |

\* cited by examiner

*Primary Examiner* — Tong-Ho Kim
(74) *Attorney, Agent, or Firm* — Foley & Lardner LLP

(57) ABSTRACT

Semiconductor devices and corresponding methods of manufacturing the same are disclosed. For example, a semiconductor device includes a first transistor comprising a first channel region. The first channel region includes one or more first nanostructures formed of a semiconductor material. The semiconductor device includes a second transistor disposed vertically with respect to the first transistor and comprising a second channel region. The second channel region includes one or more second nanostructures formed of a conductive oxide material.

20 Claims, 56 Drawing Sheets

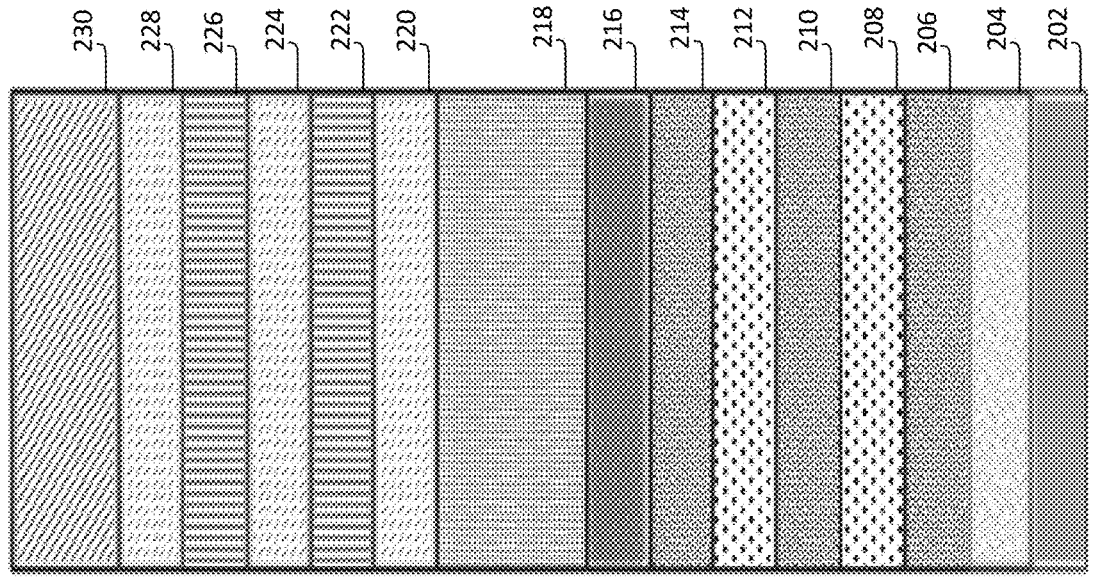
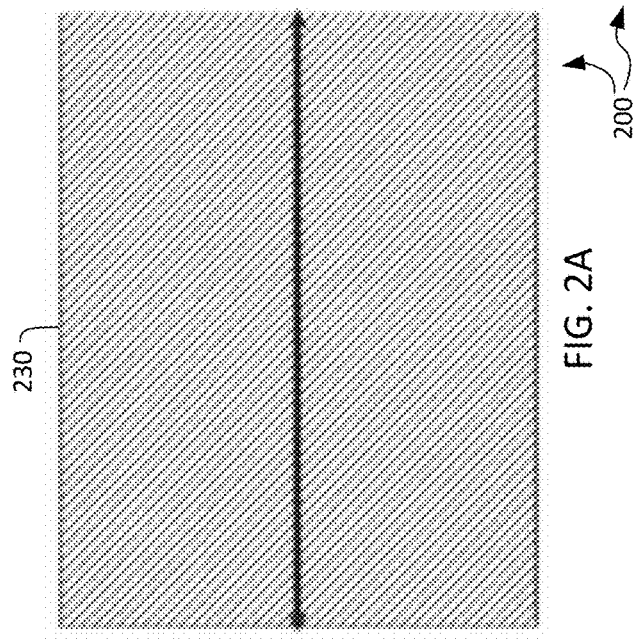
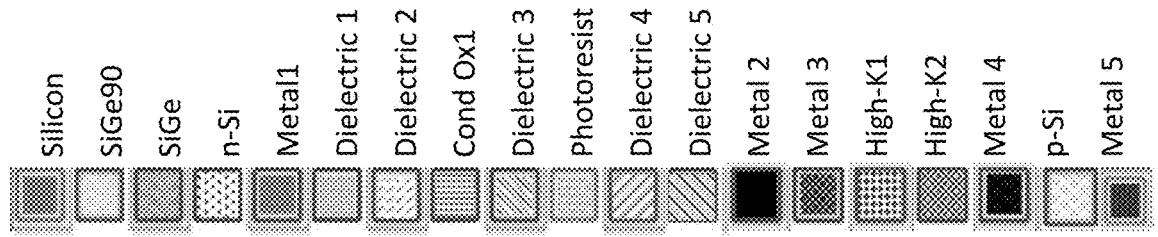
FIG. 2A
FIG. 2B

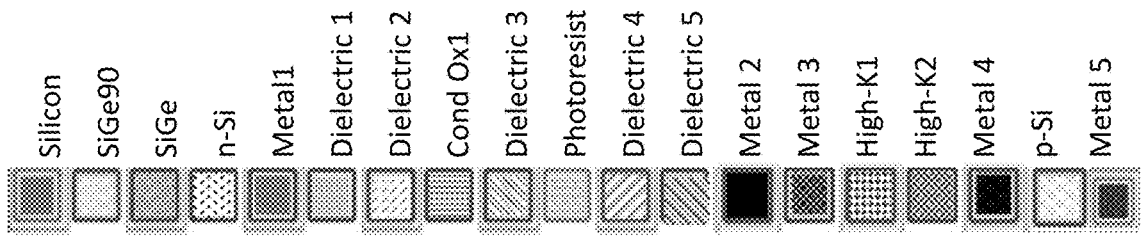
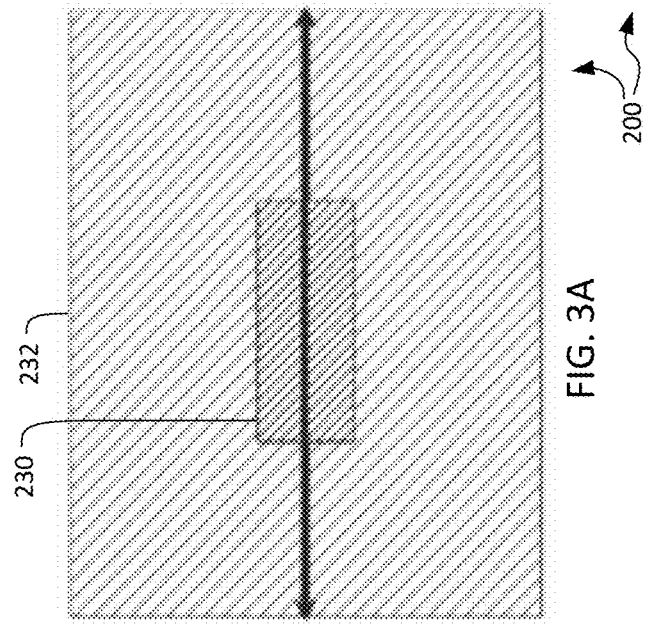
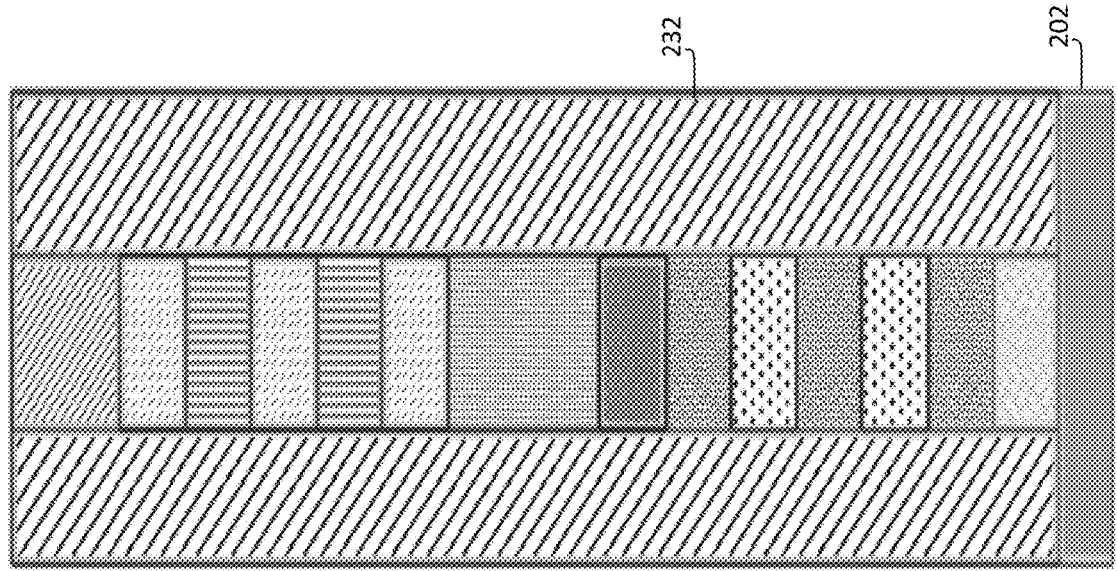
FIG. 3A
FIG. 3B

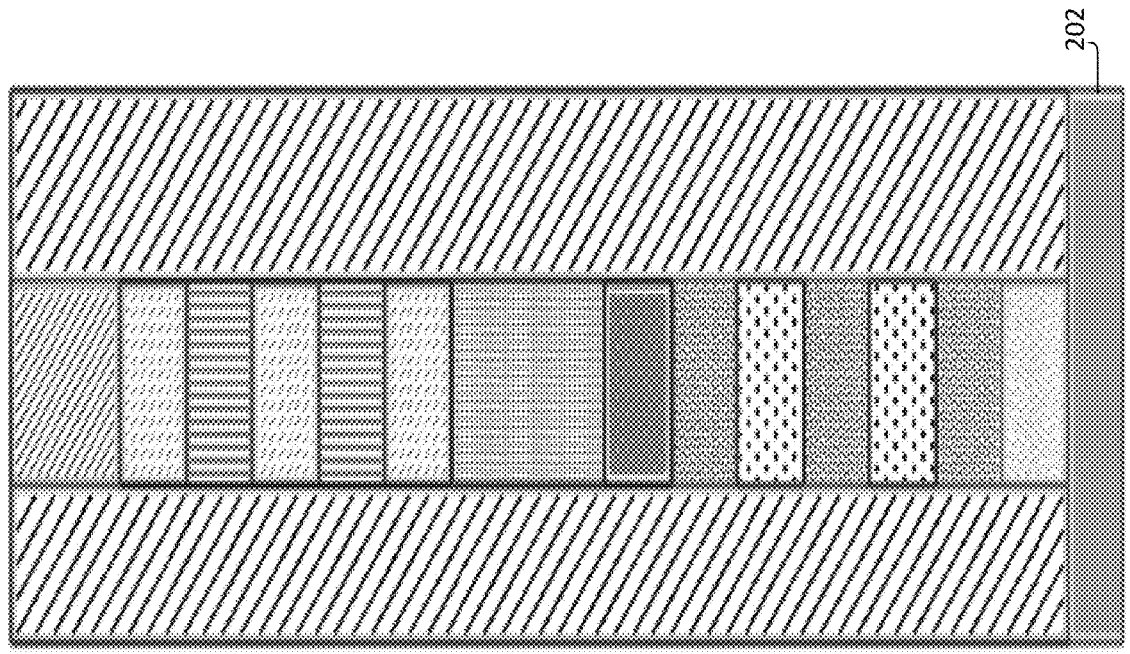
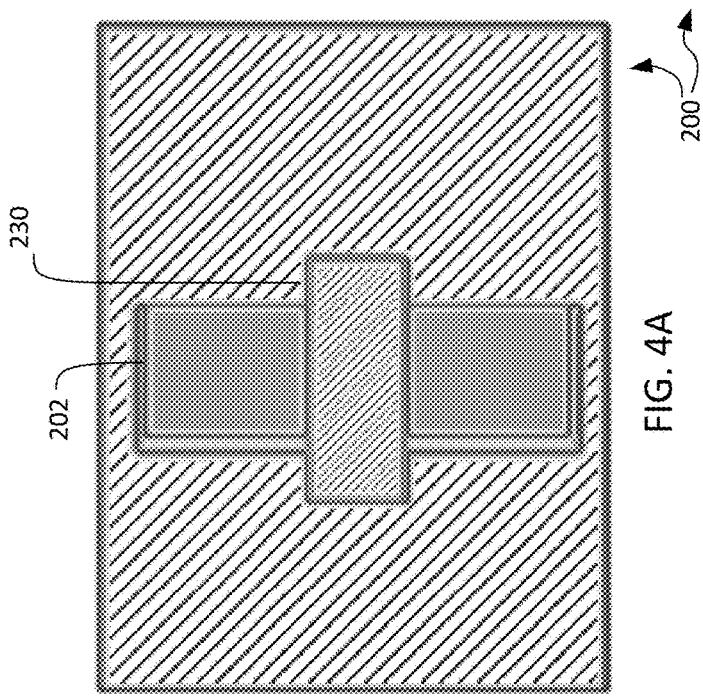
FIG. 4A
FIG. 4B
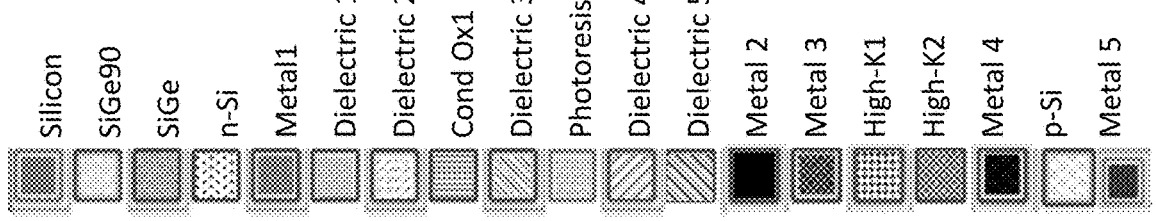

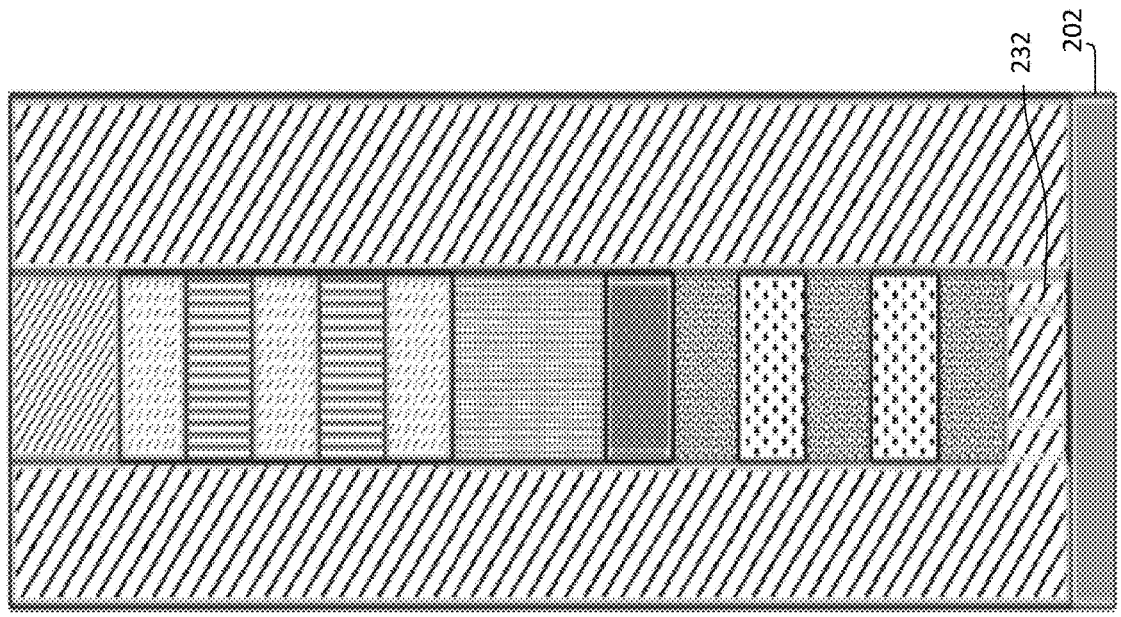
FIG. 5B
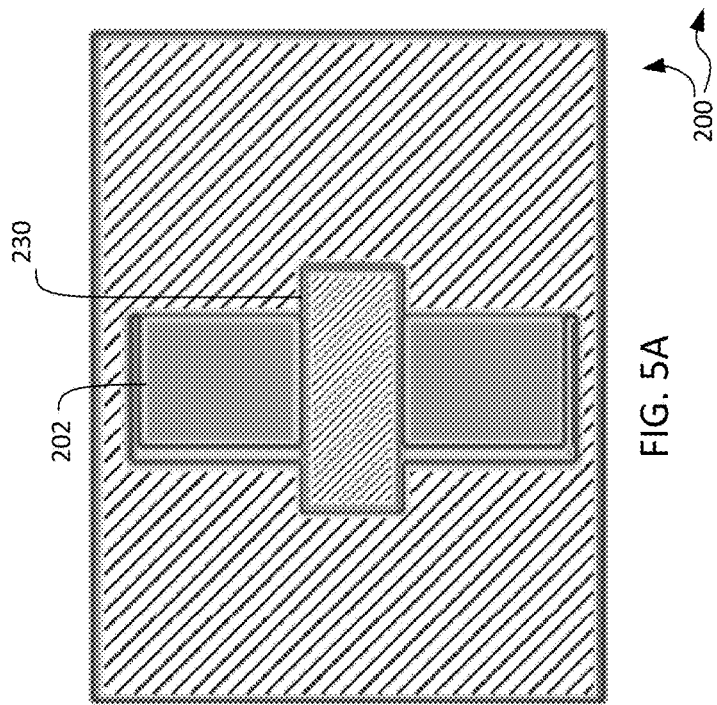
FIG. 5A
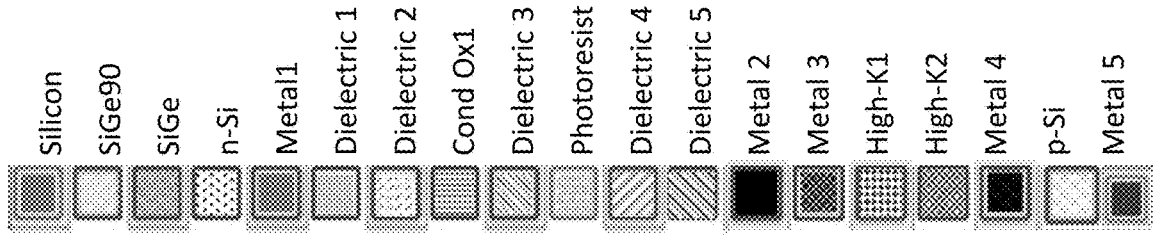

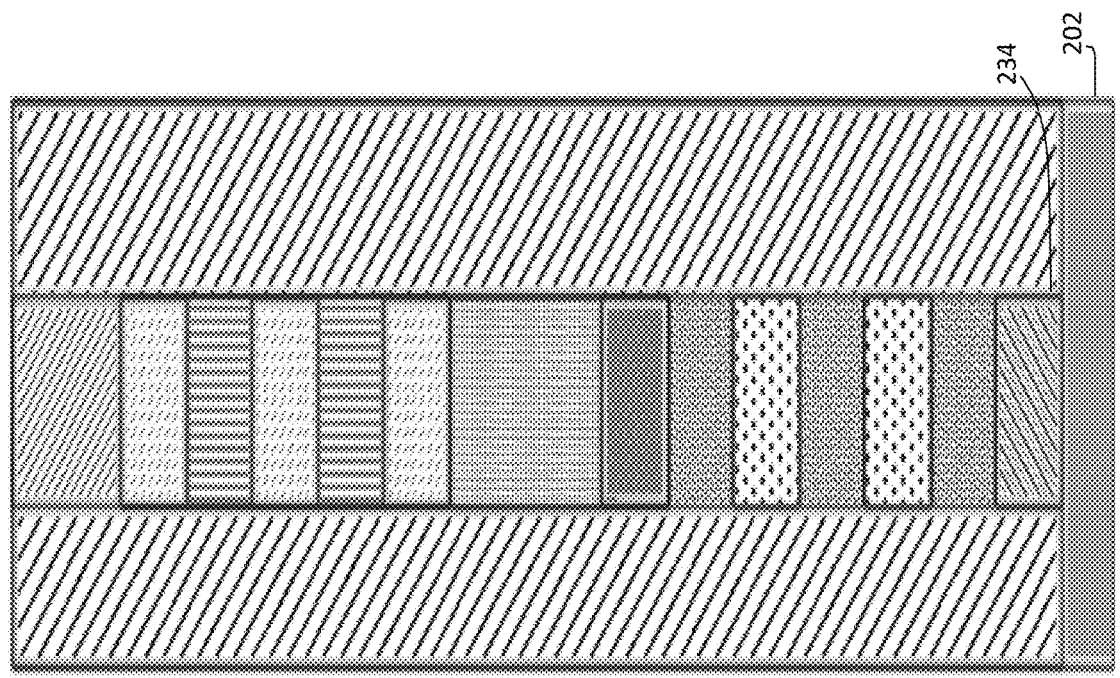
FIG. 6B
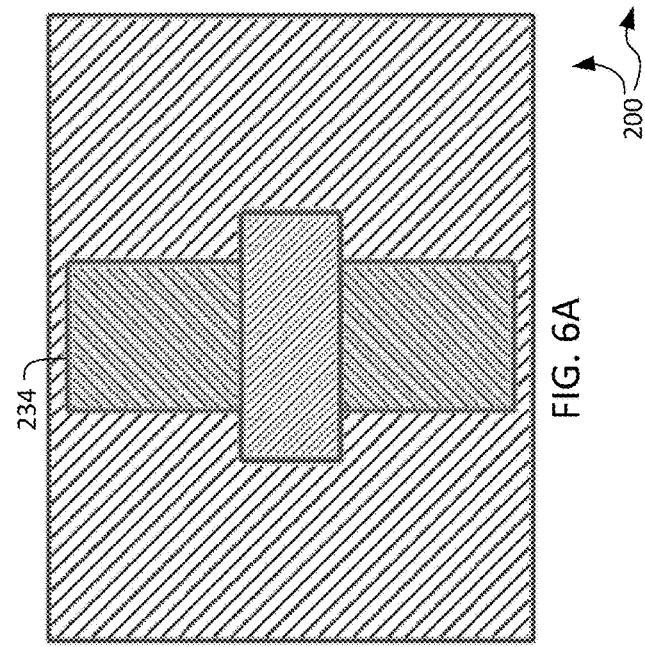
FIG. 6A
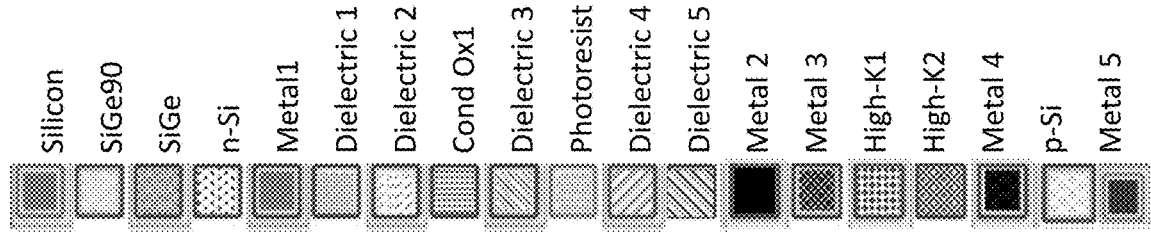

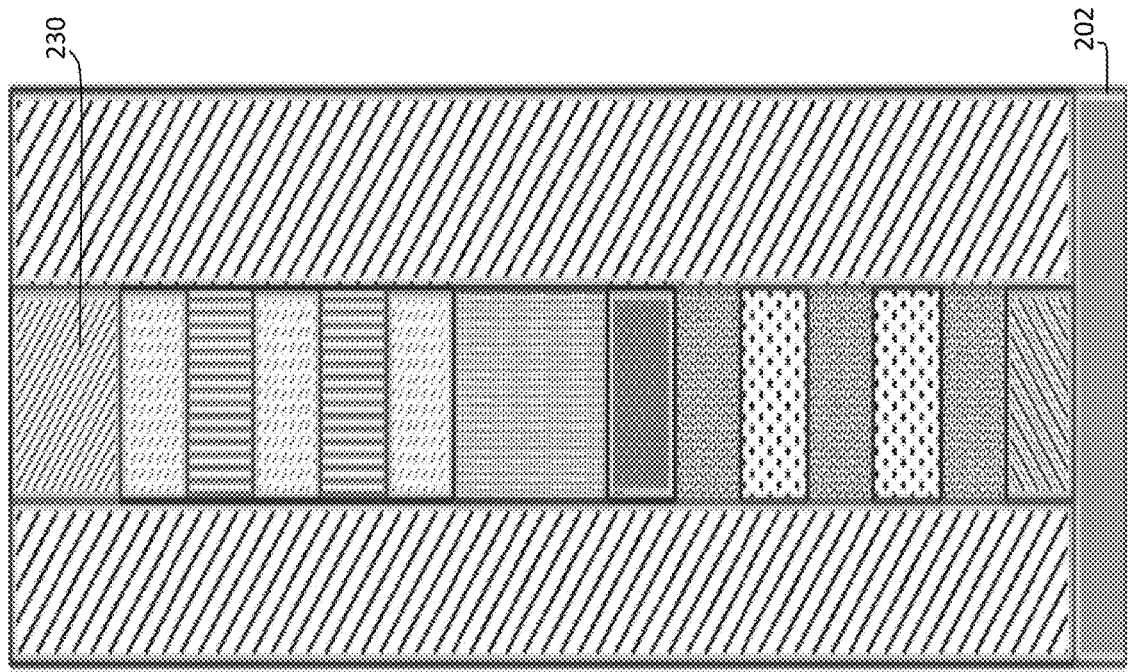
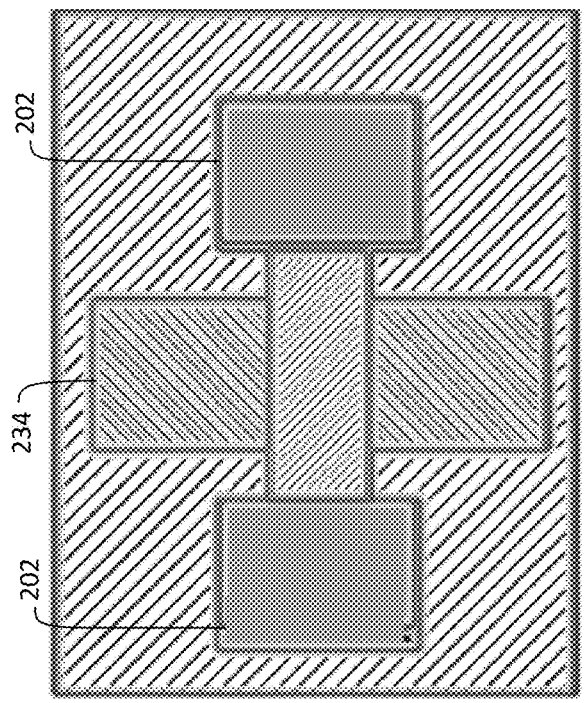
FIG. 7A
FIG. 7B
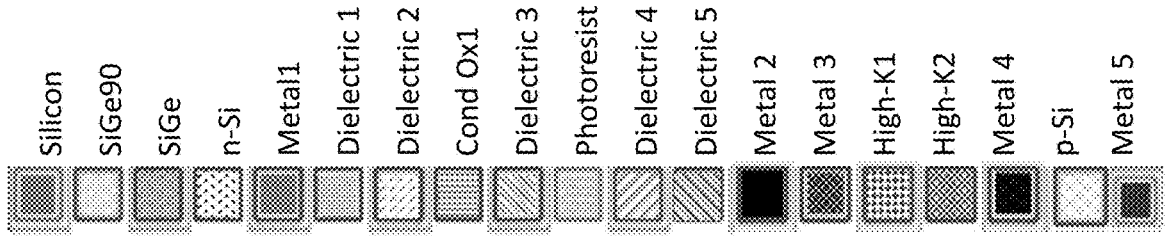

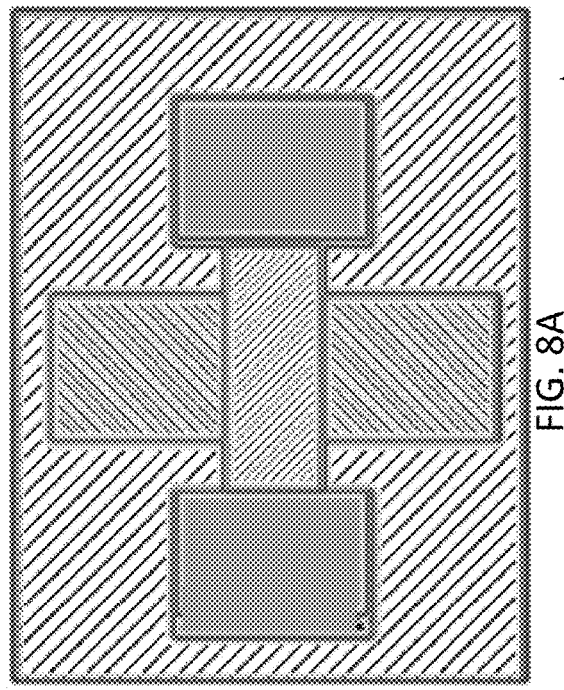
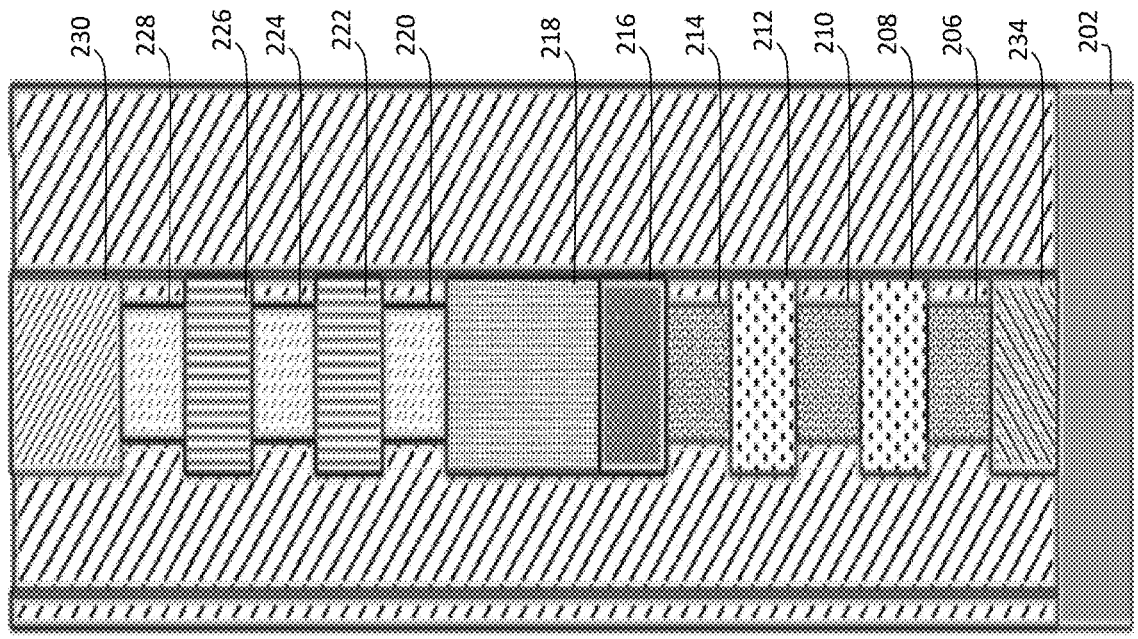
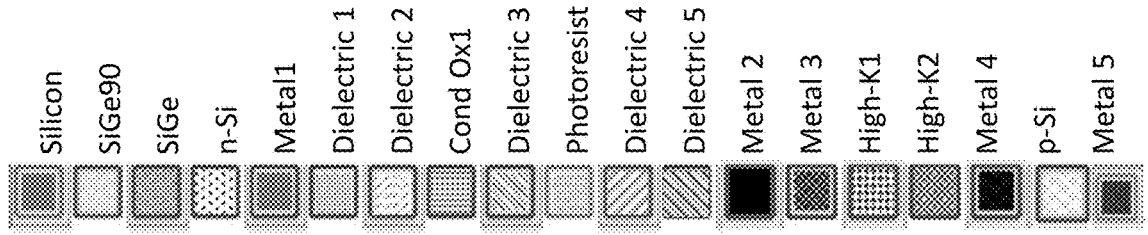
FIG. 8A
FIG. 8B

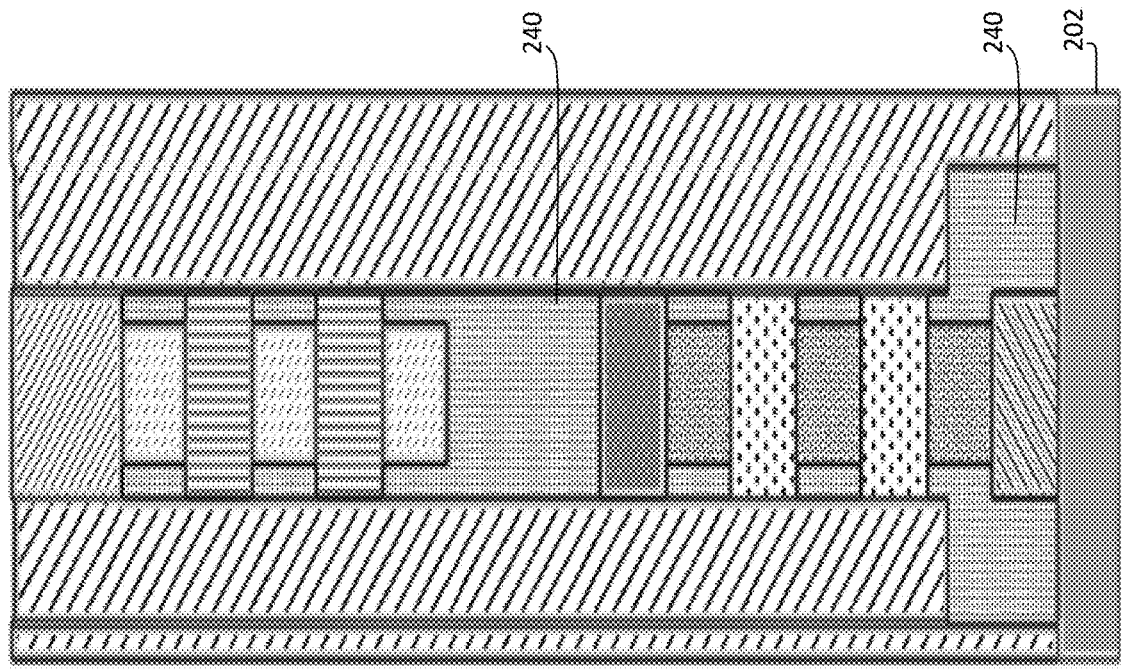
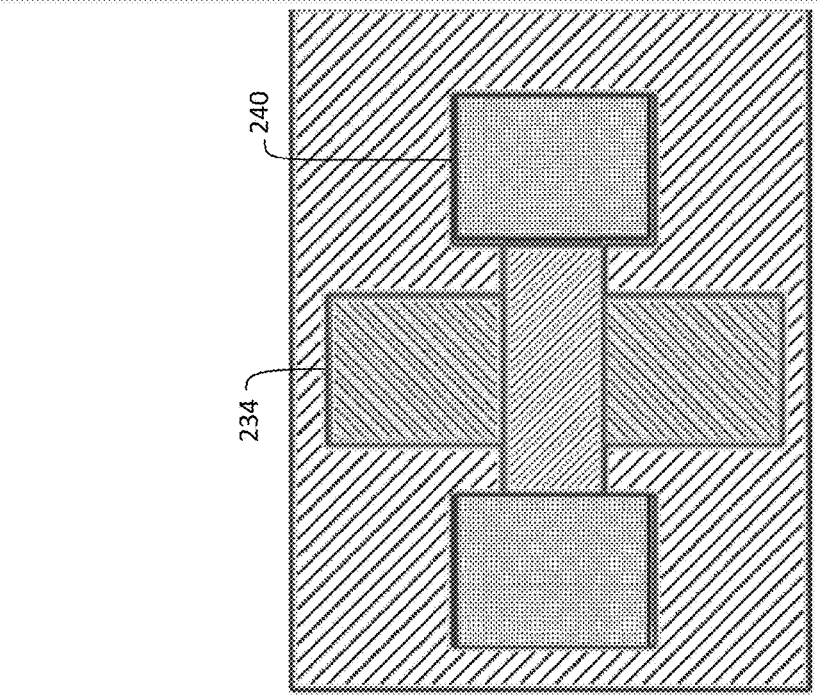
FIG. 9A    FIG. 9B
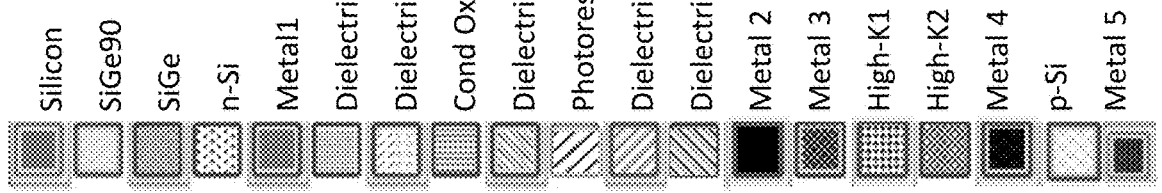

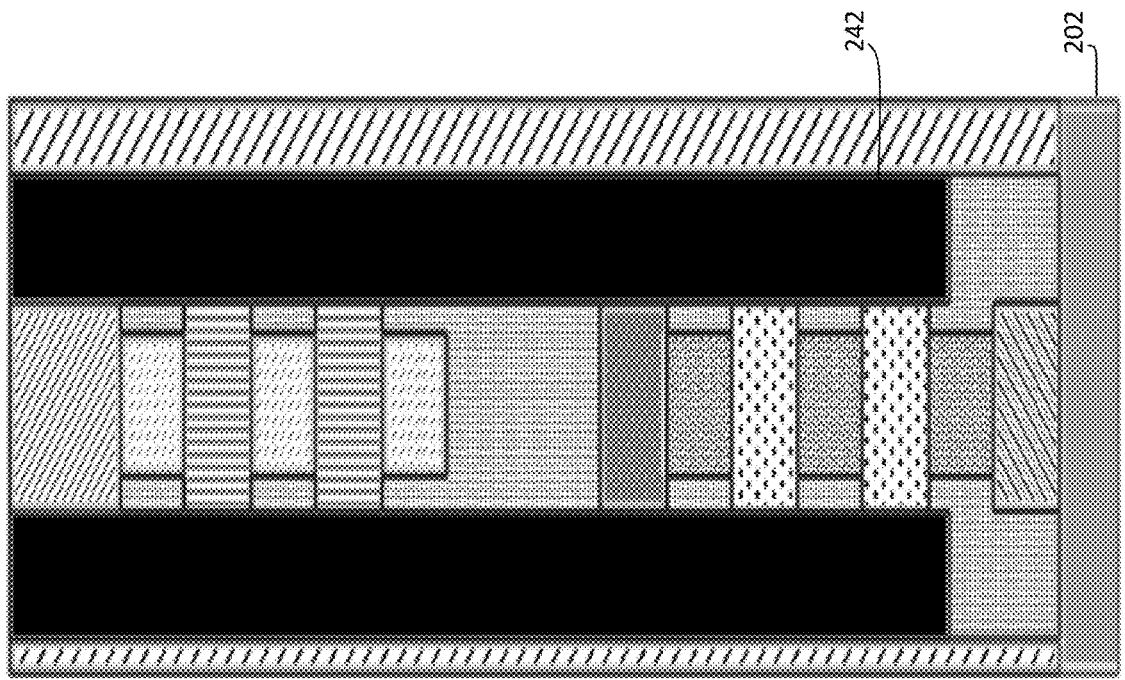
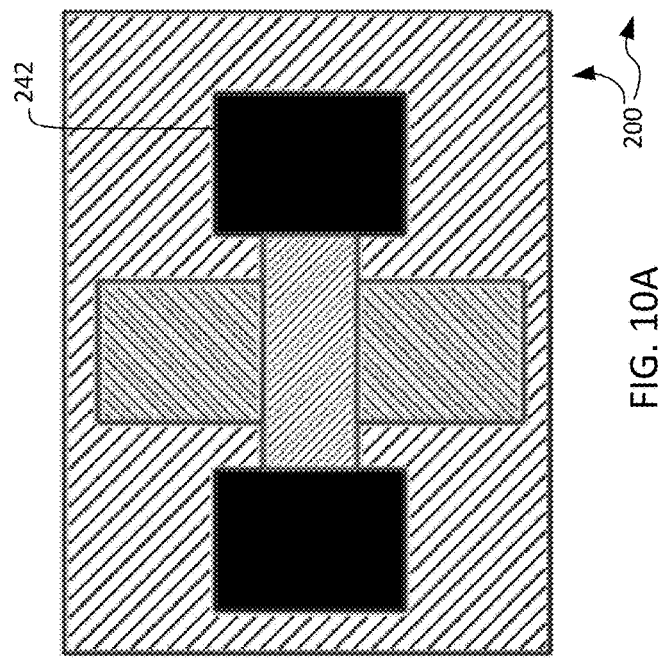
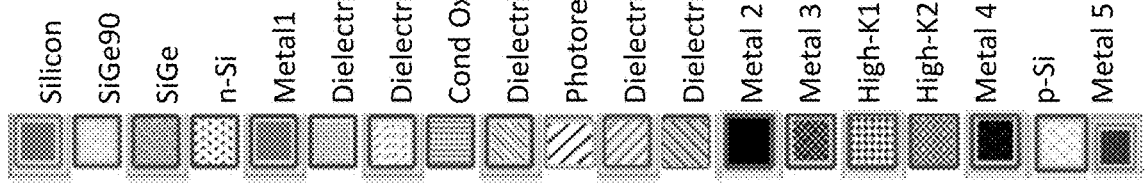
FIG. 10A
FIG. 10B

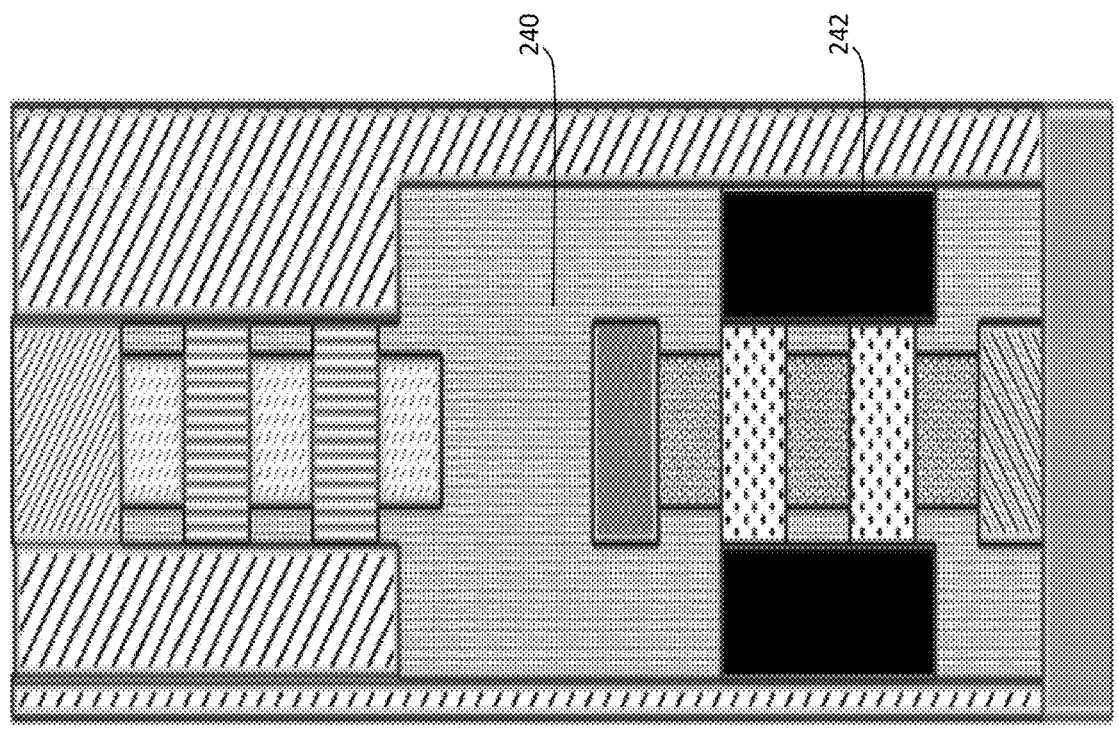
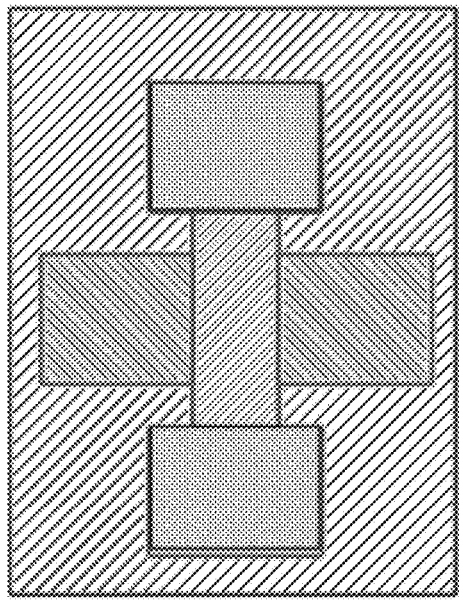
FIG. 11A
FIG. 11B
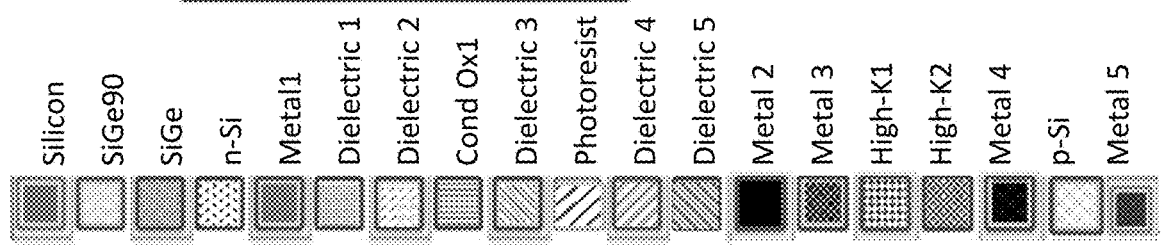

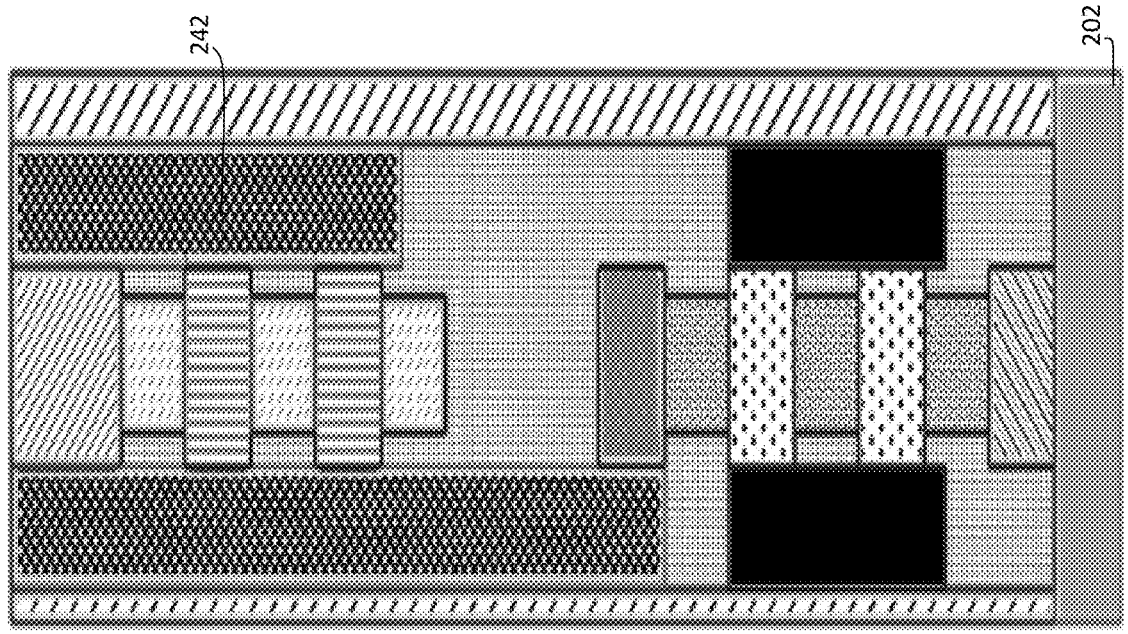
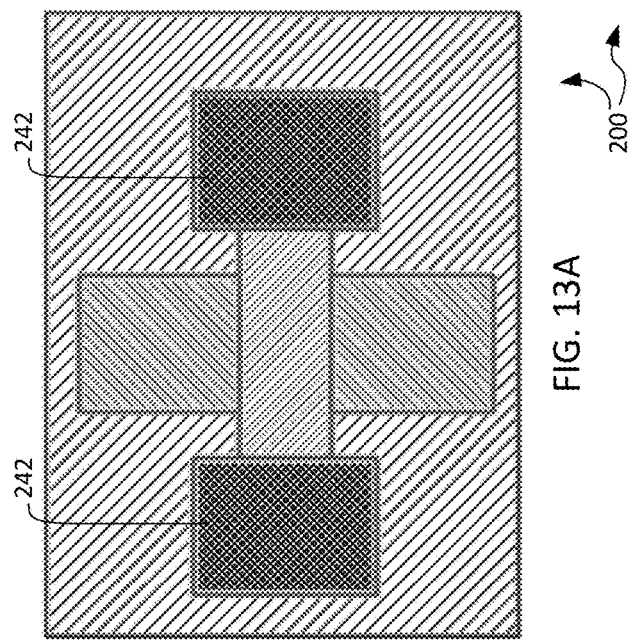
FIG. 13B
FIG. 13A
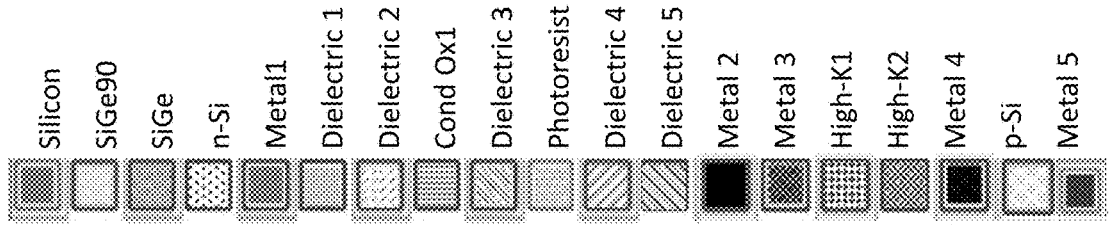

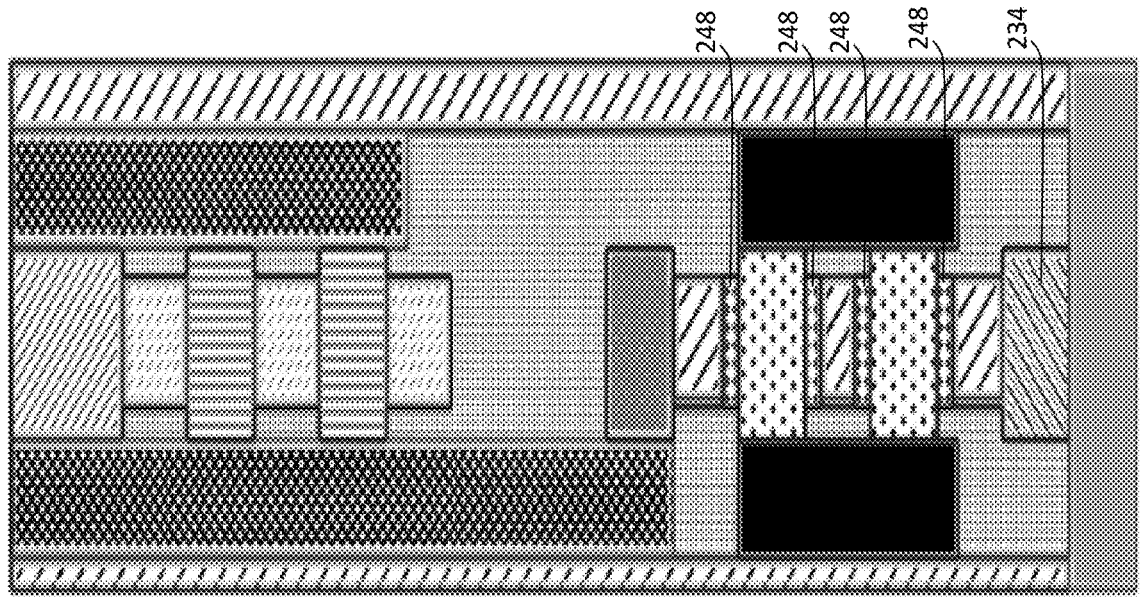
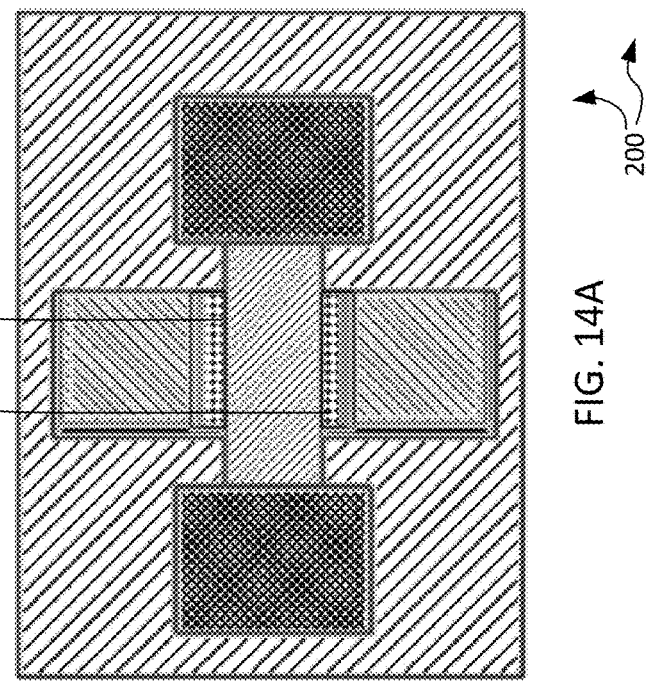
FIG. 14A
FIG. 14B
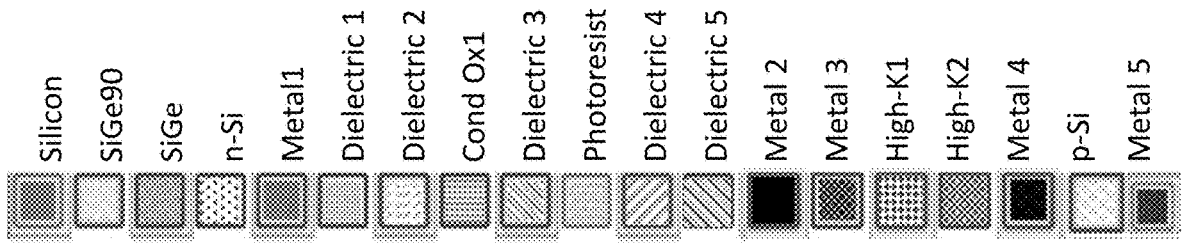

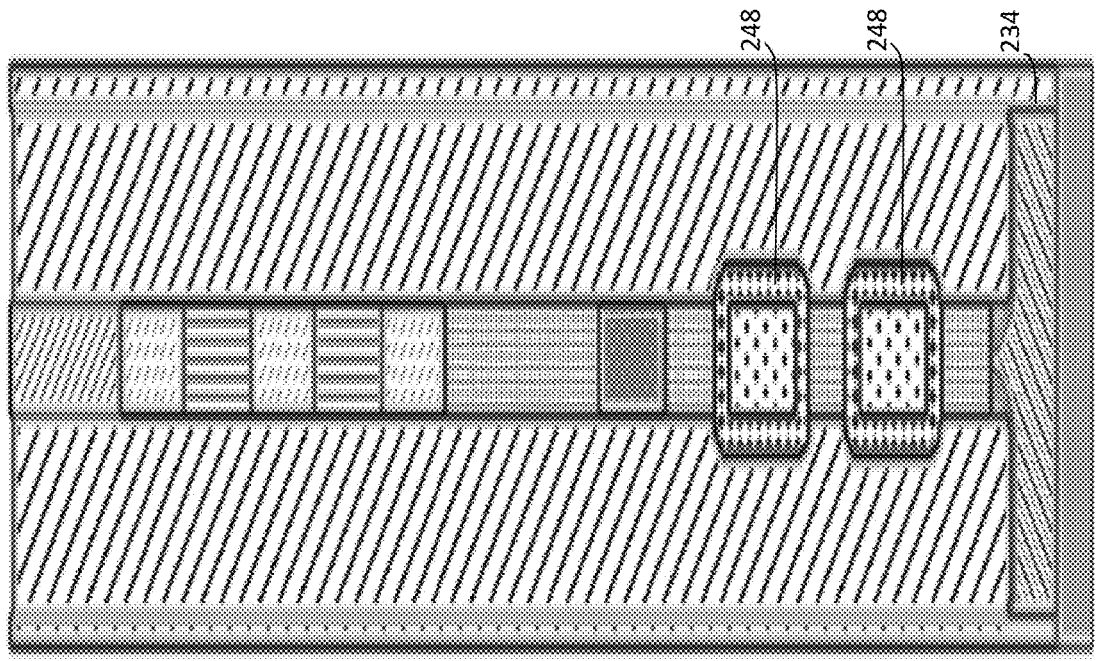
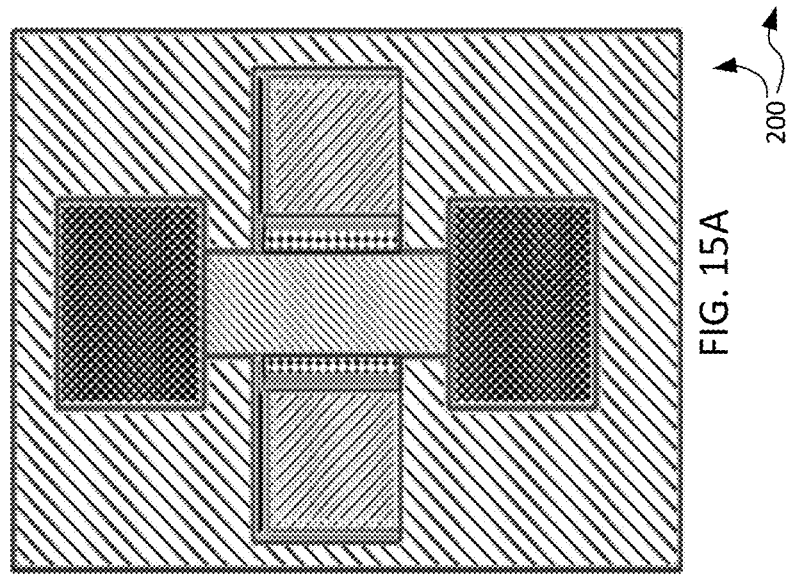
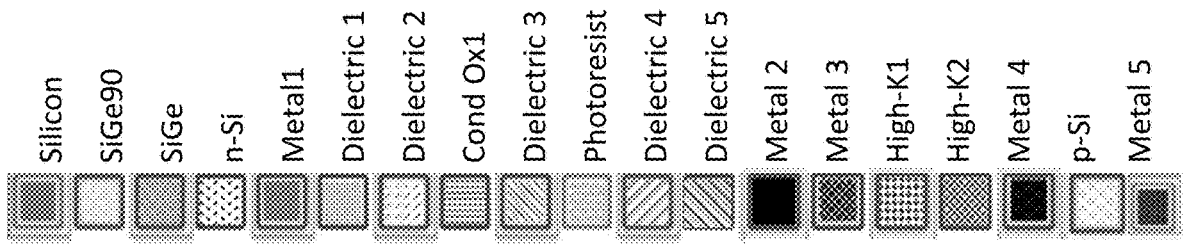
FIG. 15B
FIG. 15A

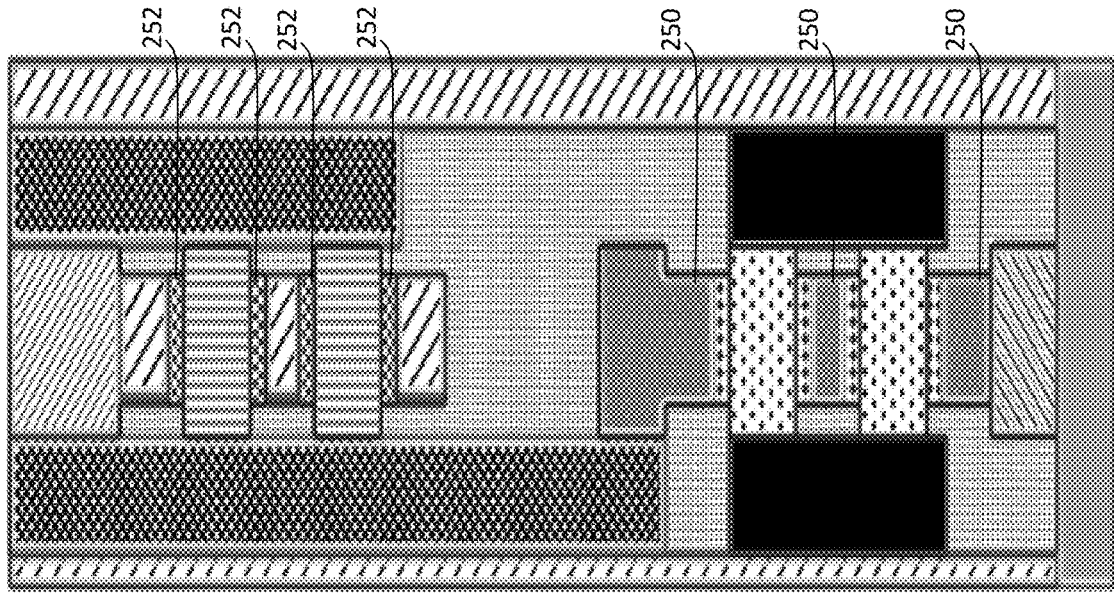
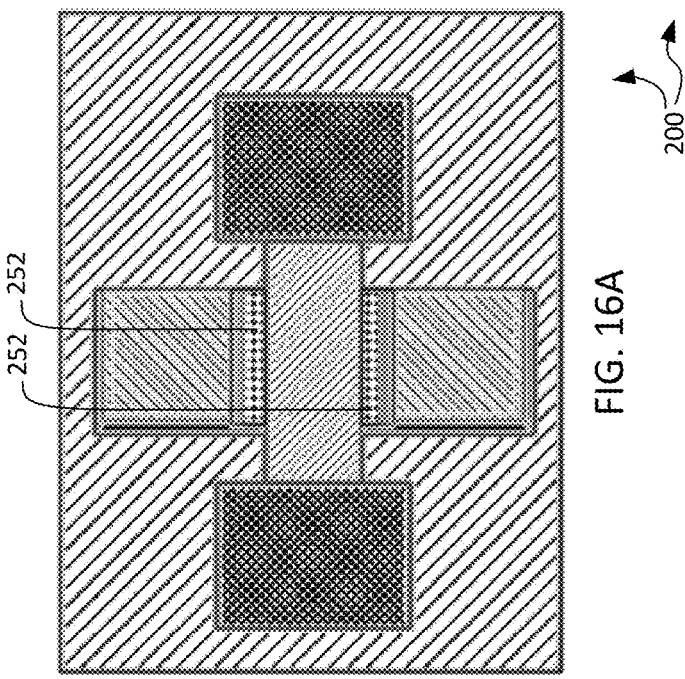
FIG. 16A
FIG. 16B
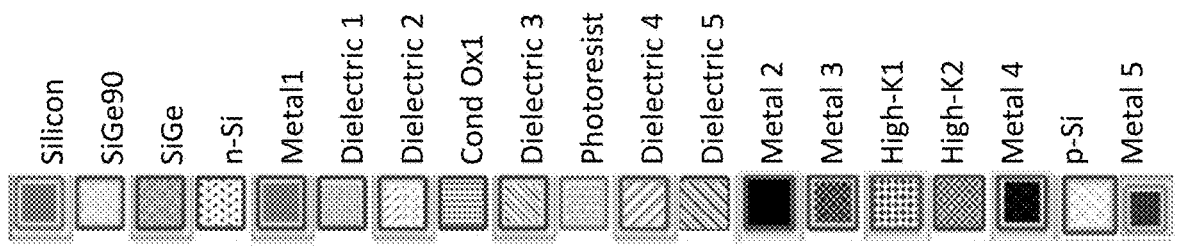

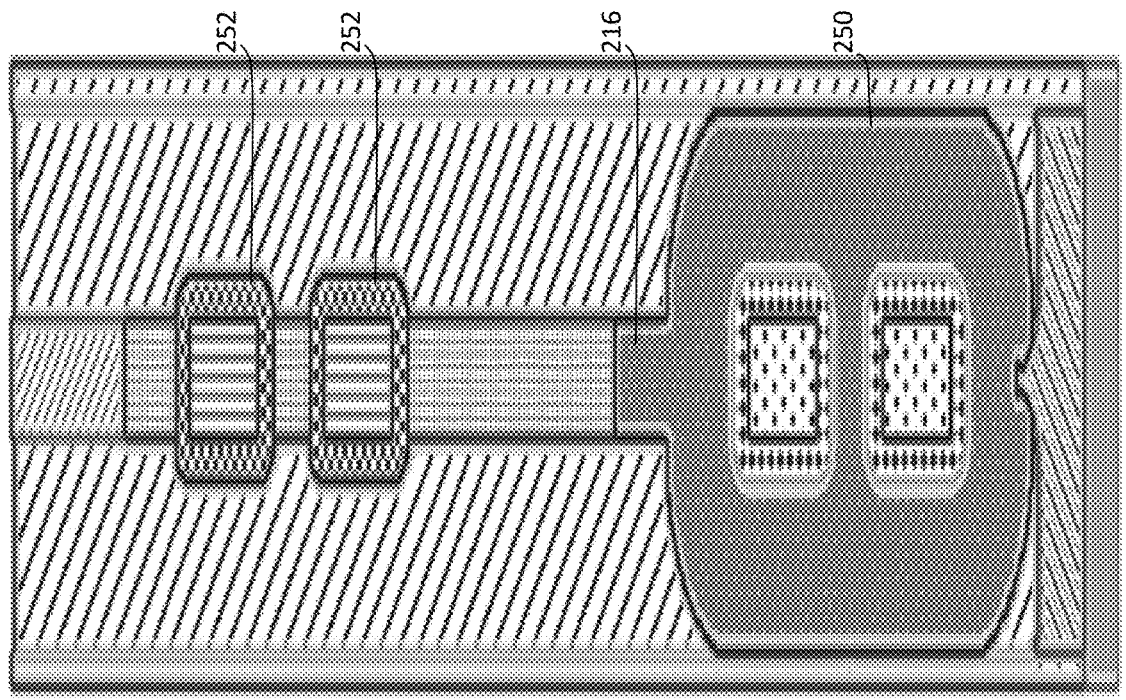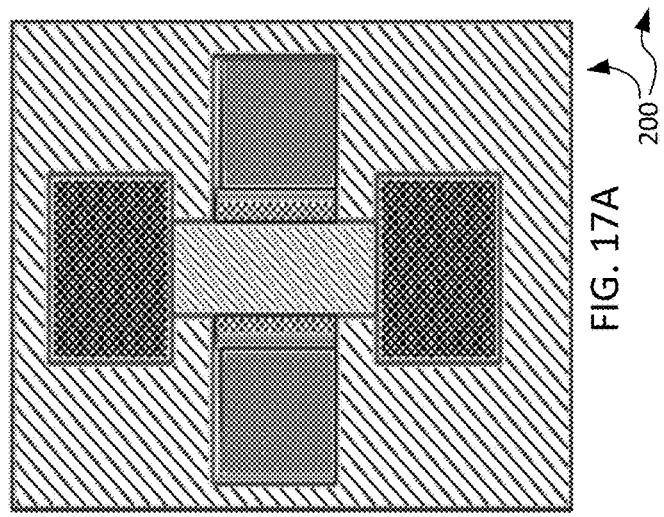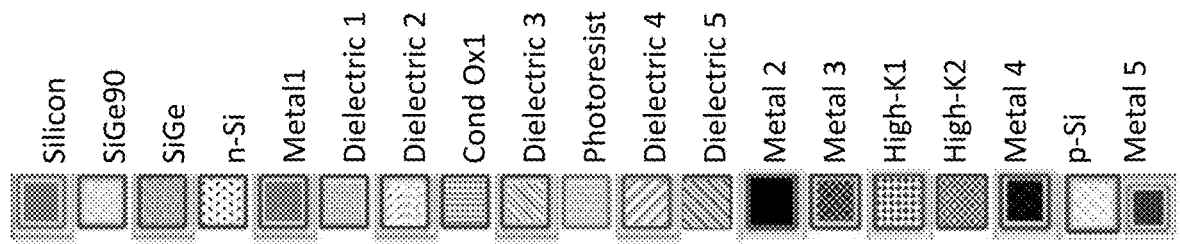
FIG. 17A
FIG. 17B

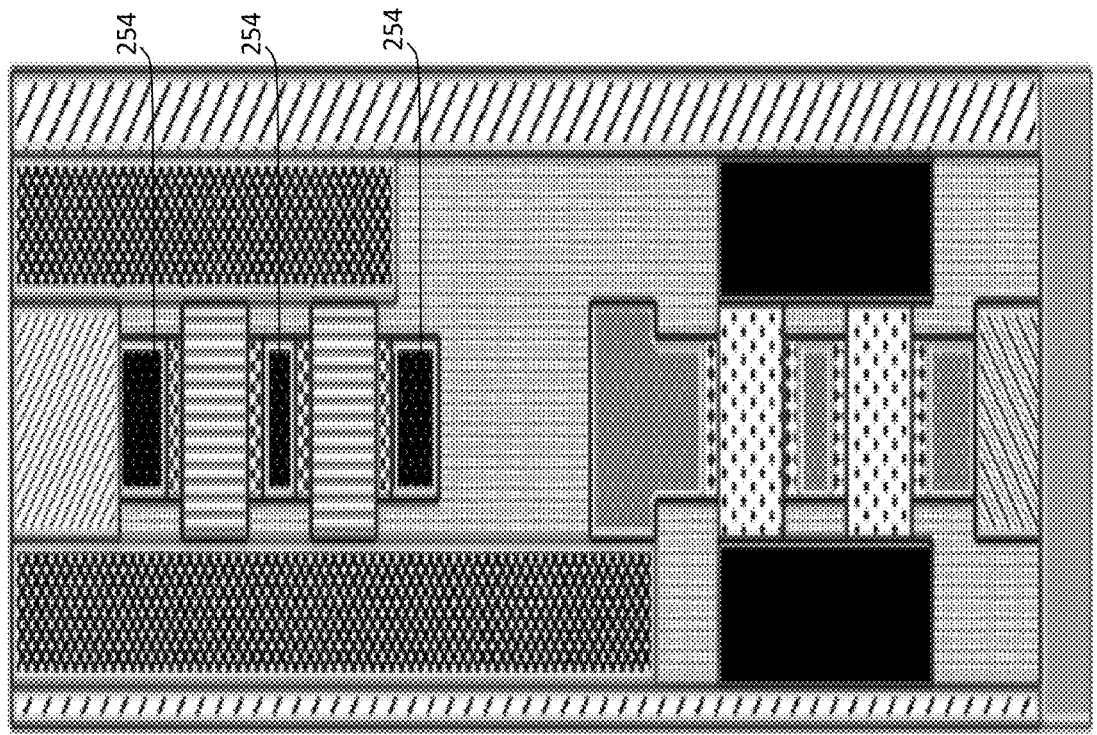
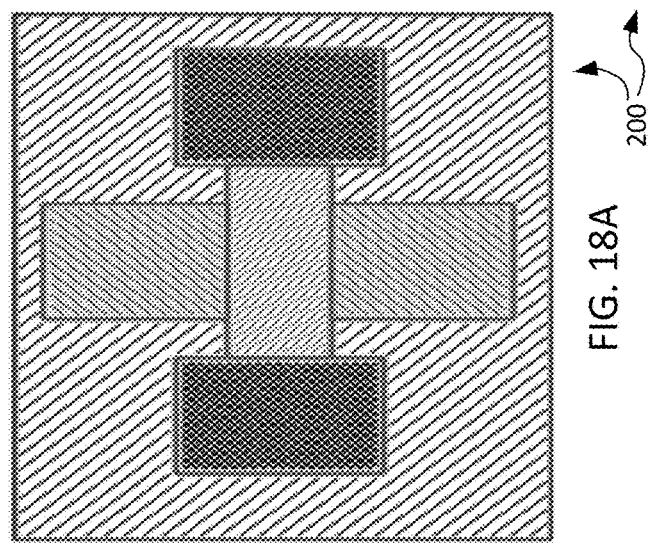
FIG. 18B
FIG. 18A
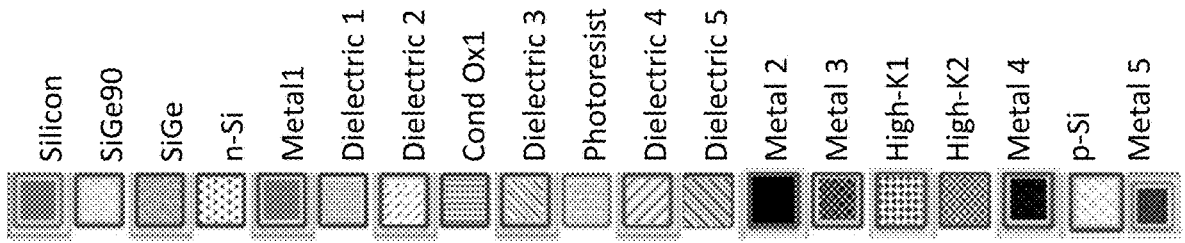

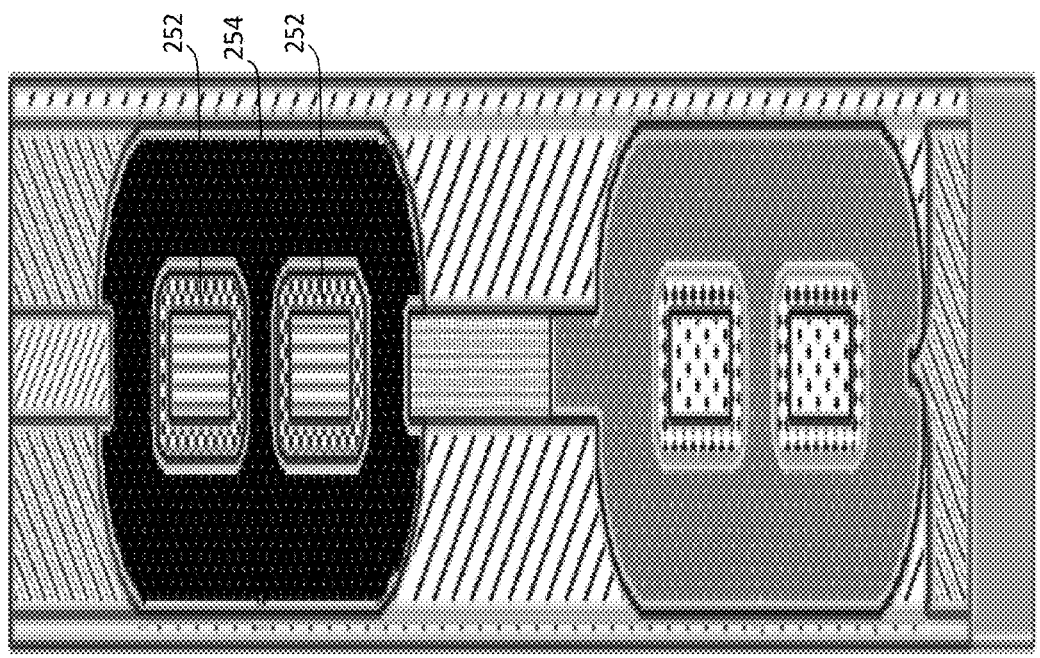
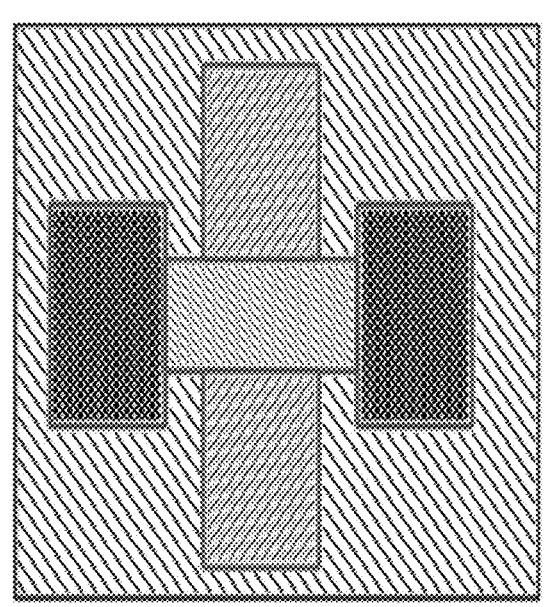
FIG. 19B
FIG. 19A
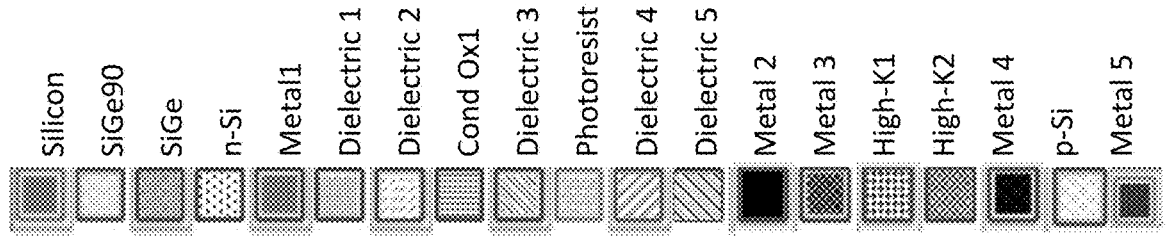

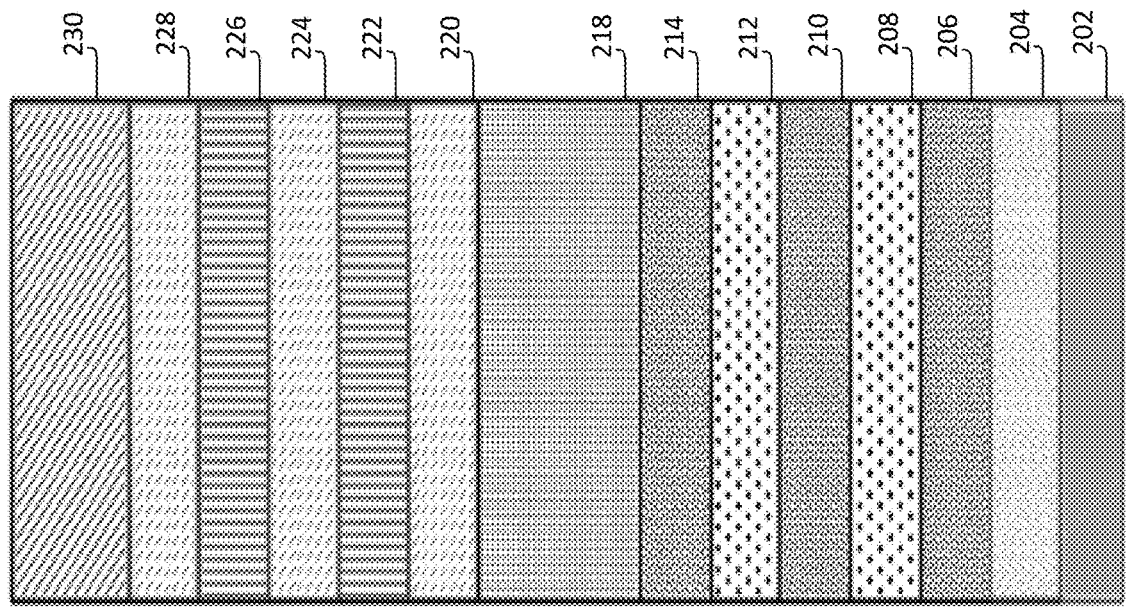
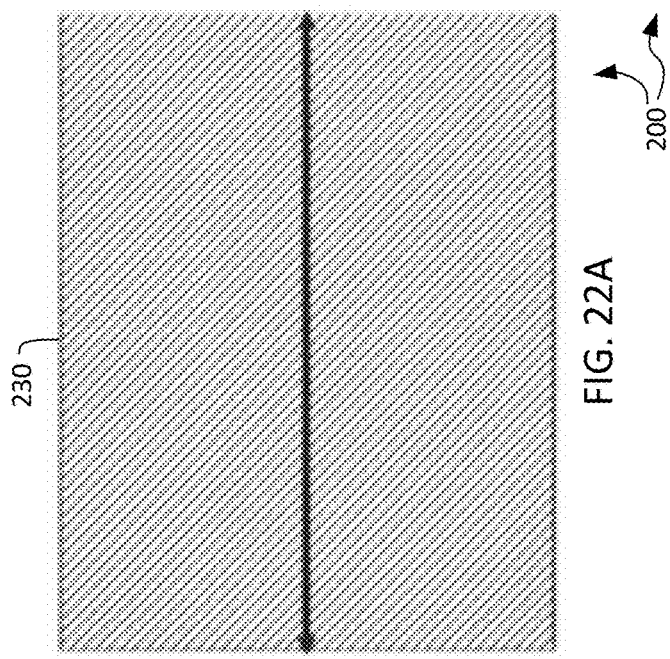
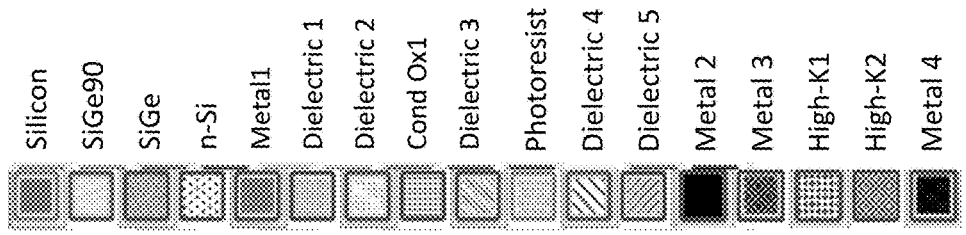
FIG. 22B
FIG. 22A

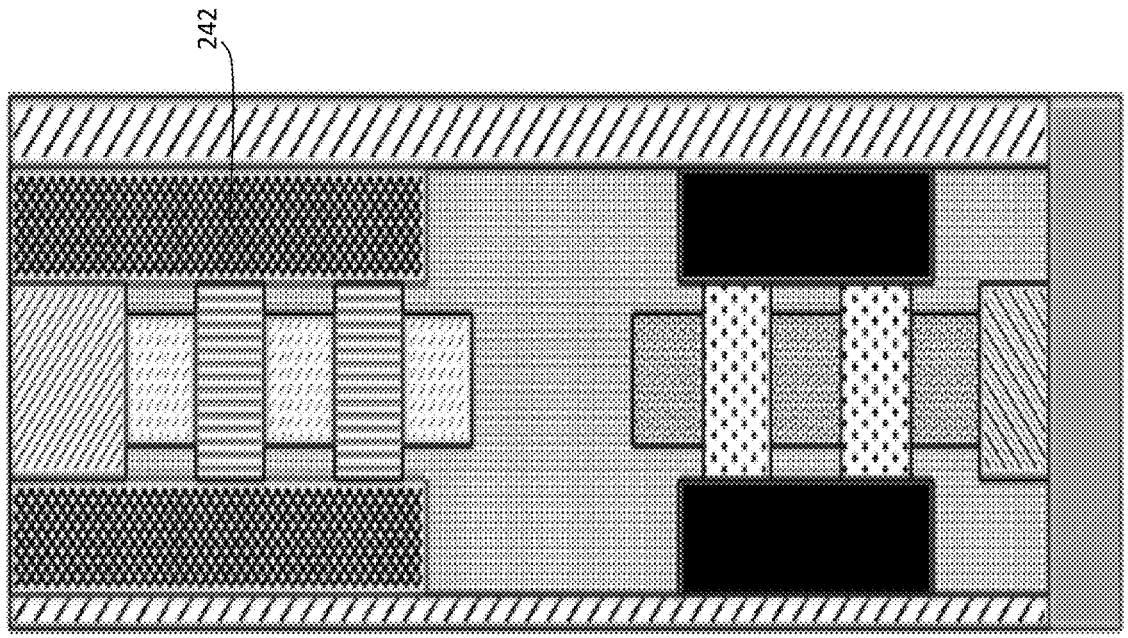
FIG. 23B
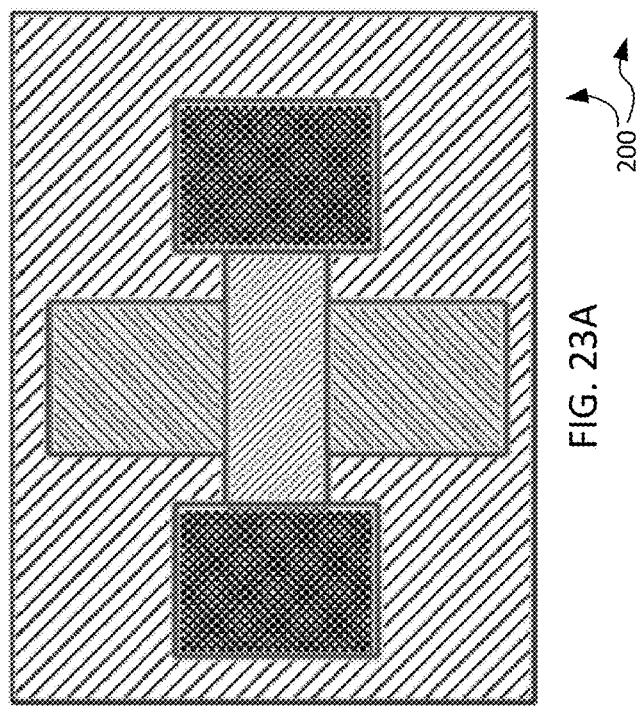
FIG. 23A
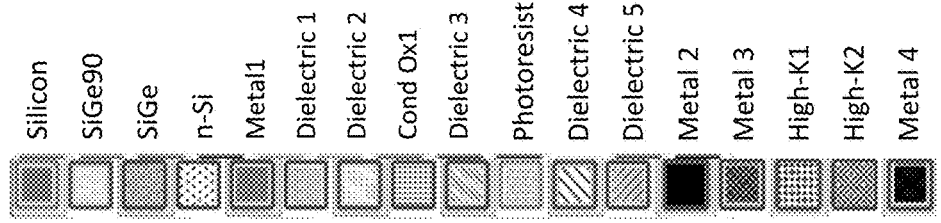

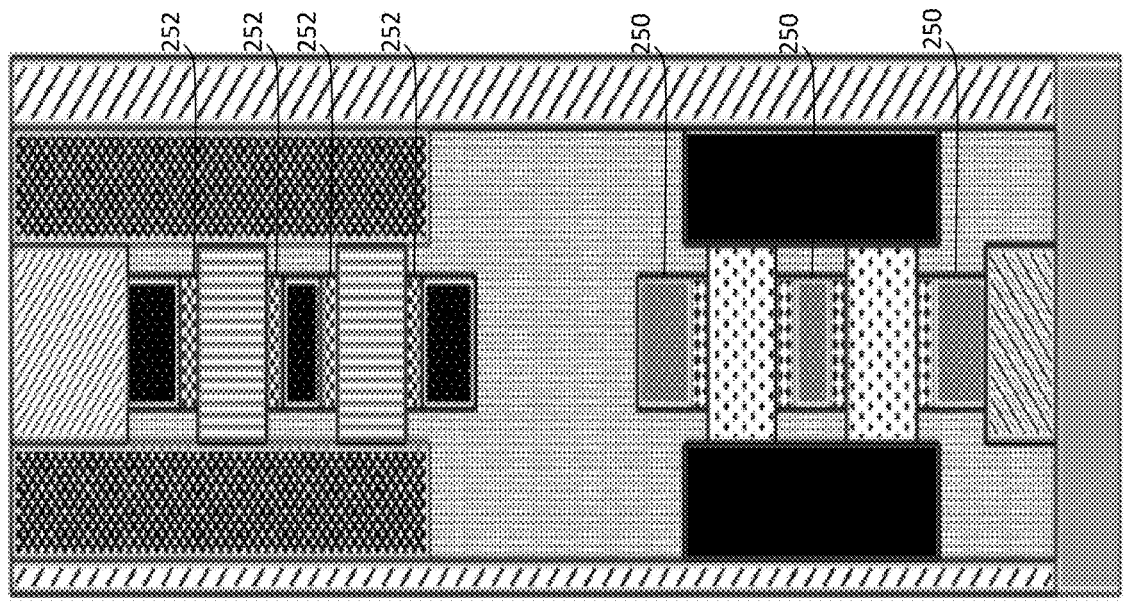
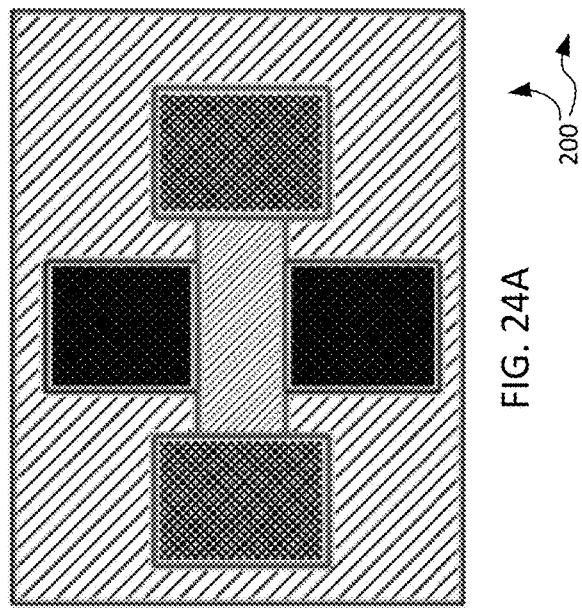
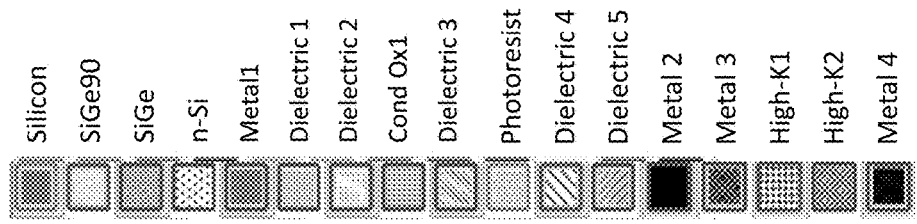
FIG. 24A
FIG. 24B

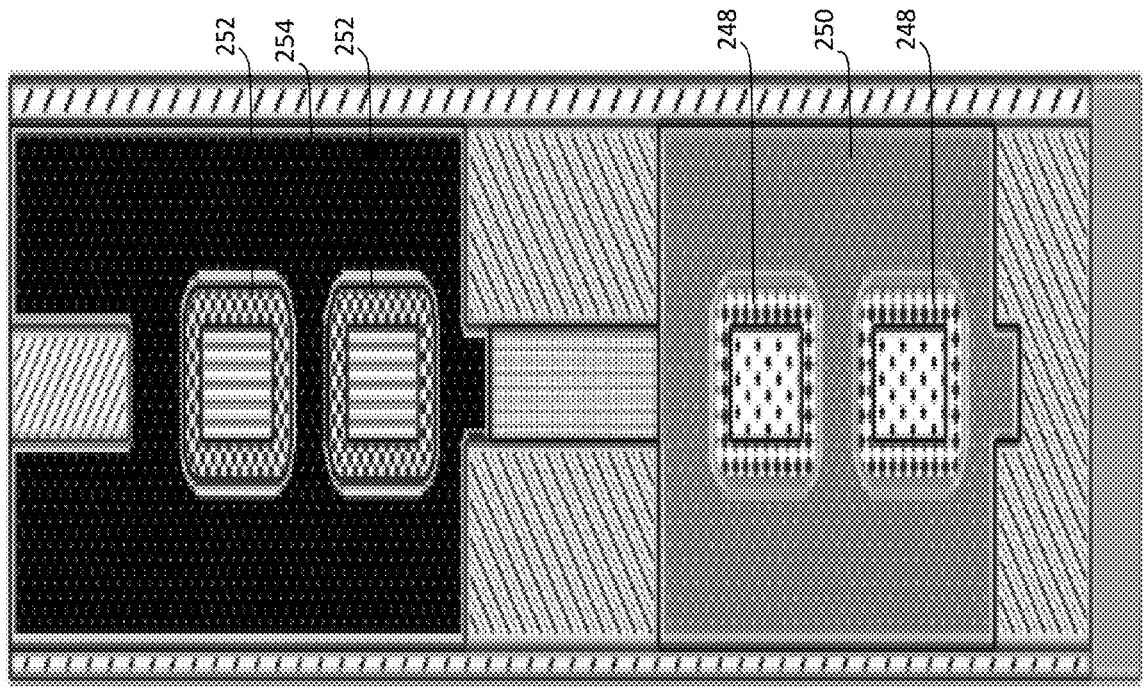
FIG. 25B
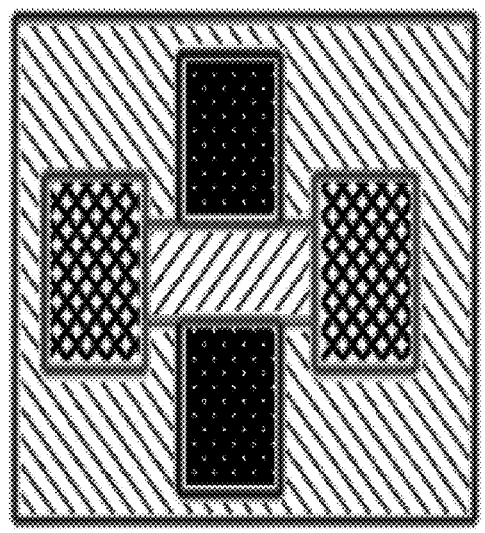
FIG. 25A
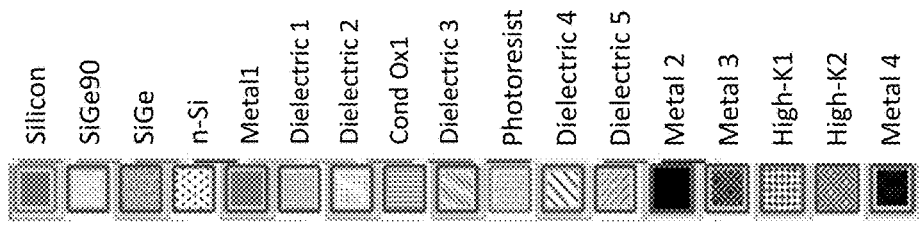

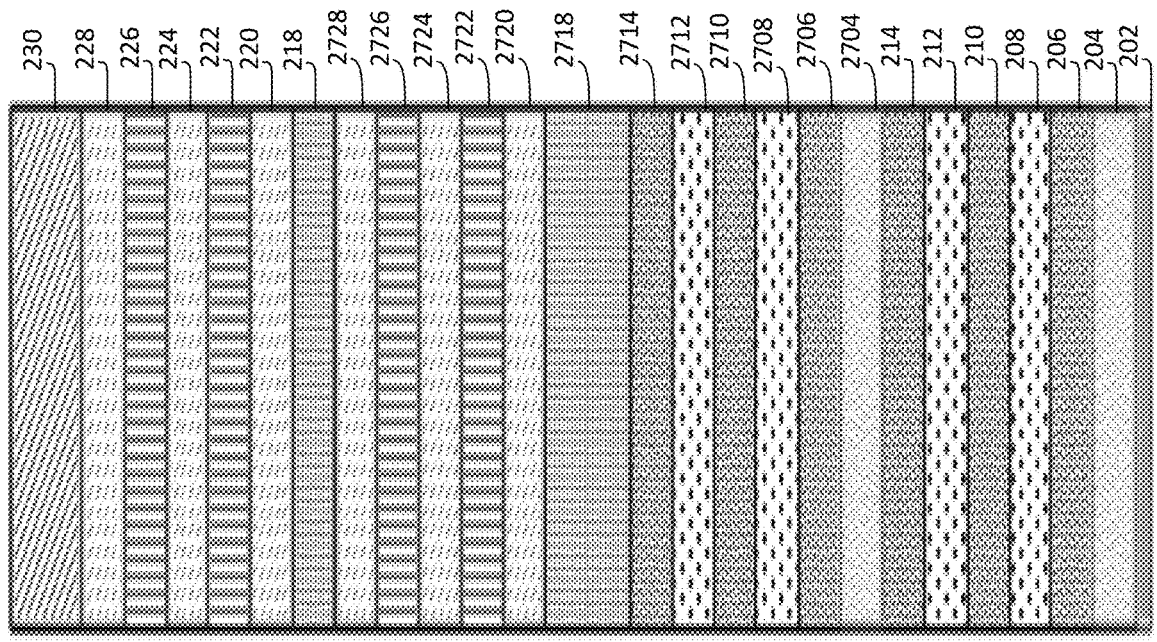
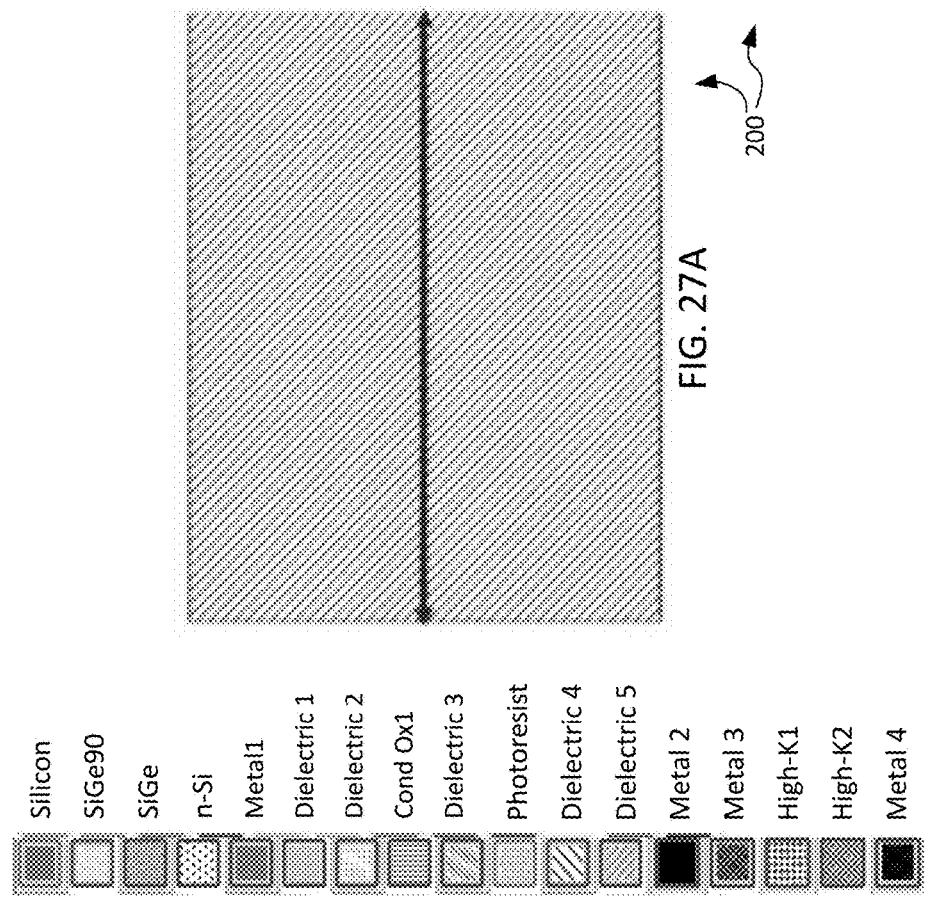
FIG. 27A
FIG. 27B

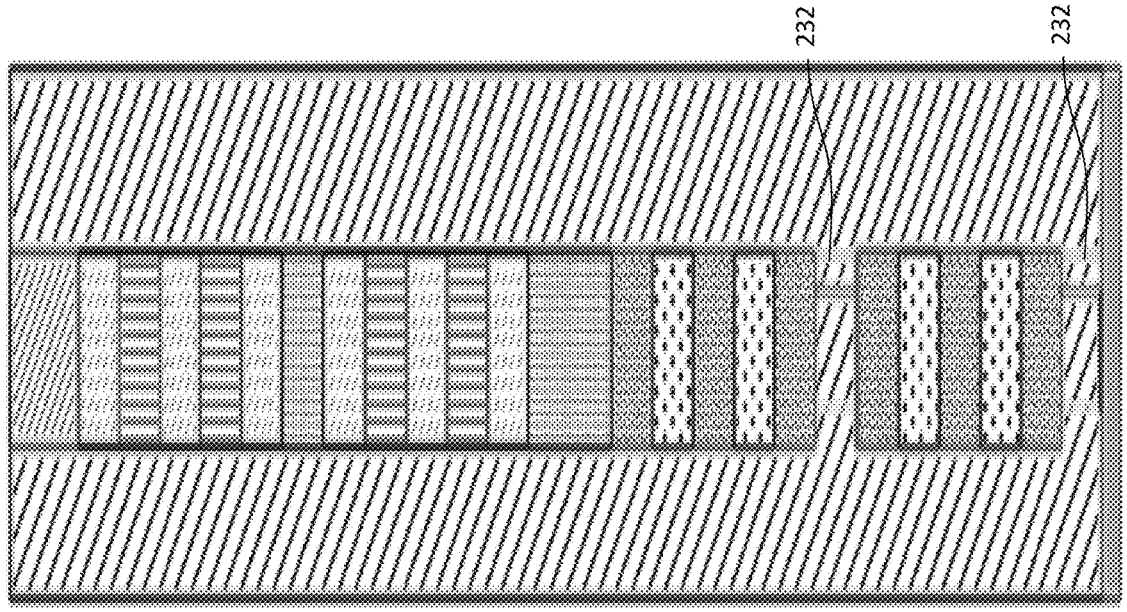
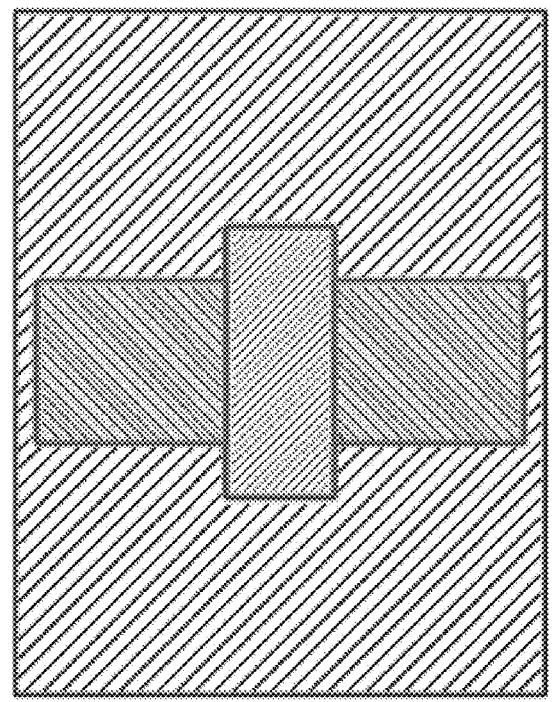
FIG. 28A    FIG. 28B
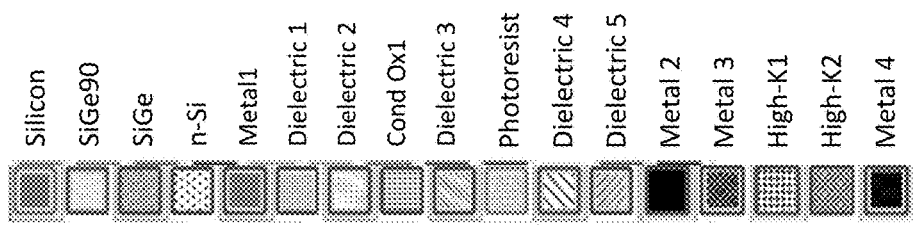

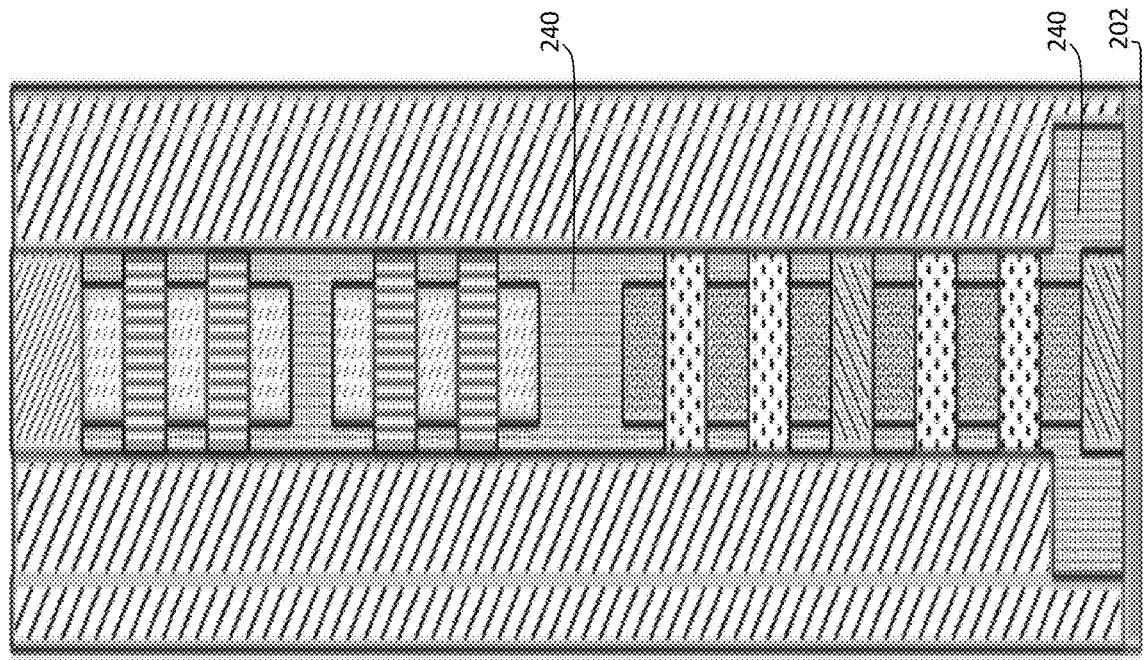
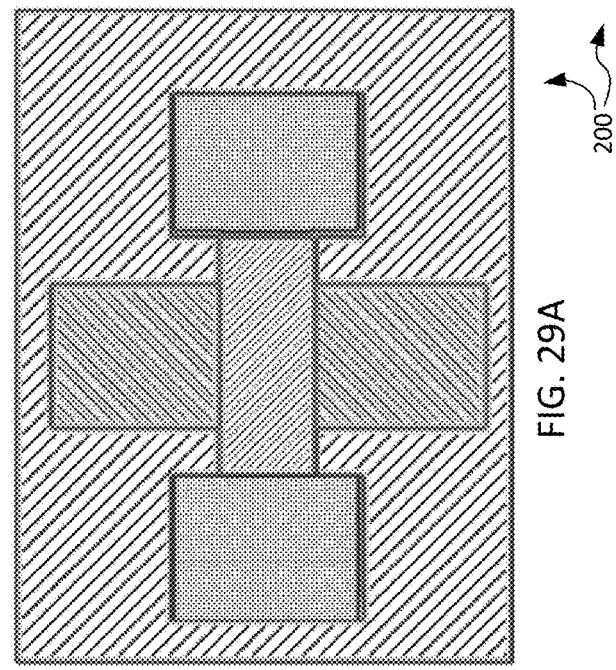
FIG. 29A
FIG. 29B
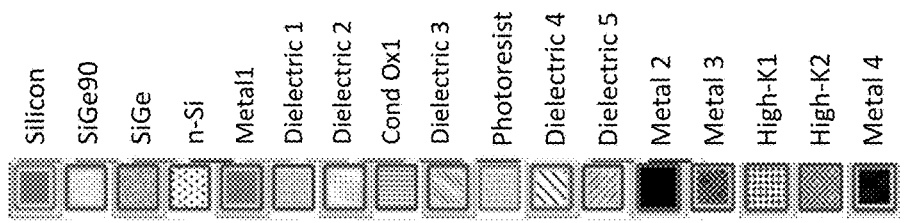

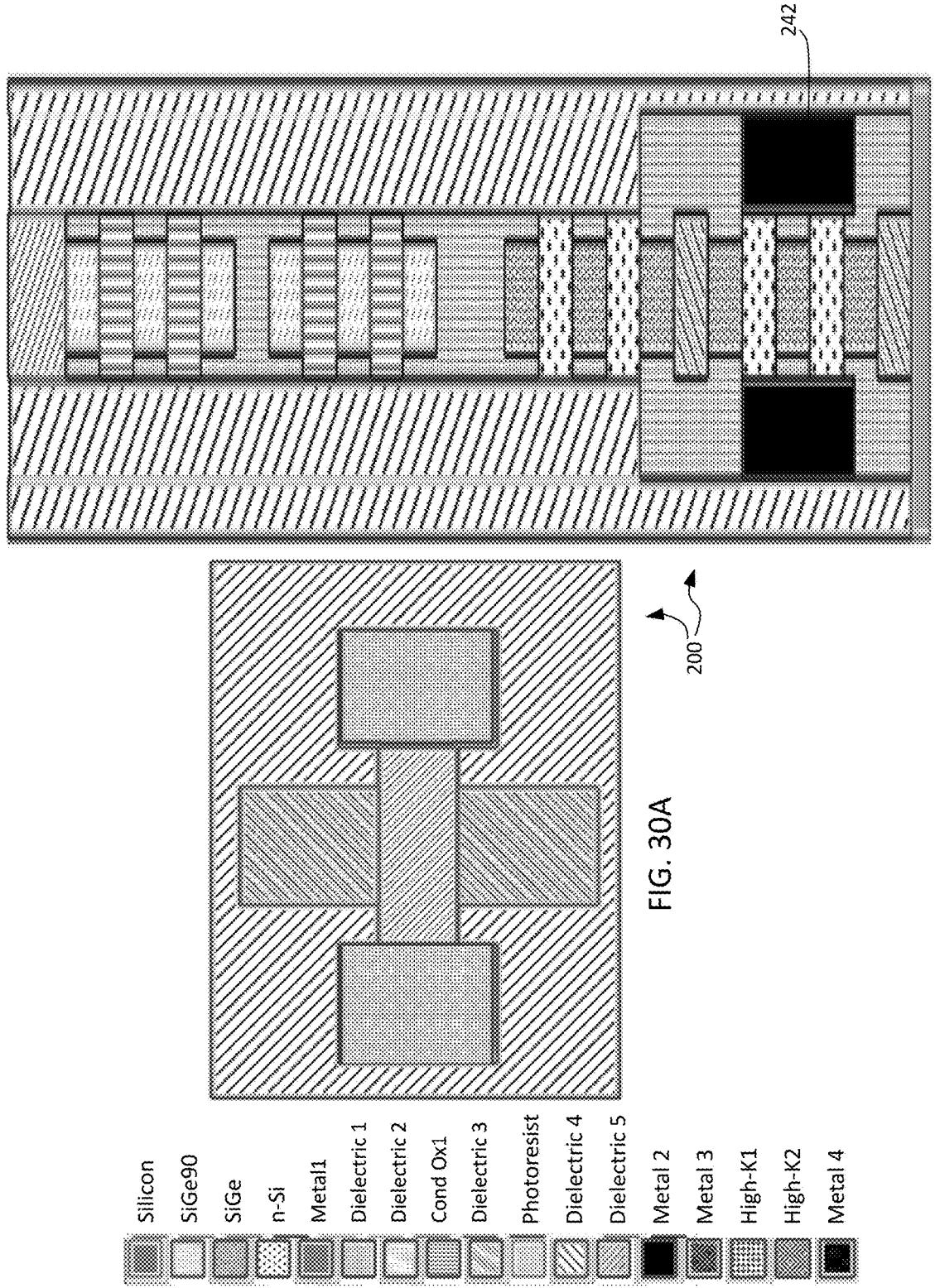

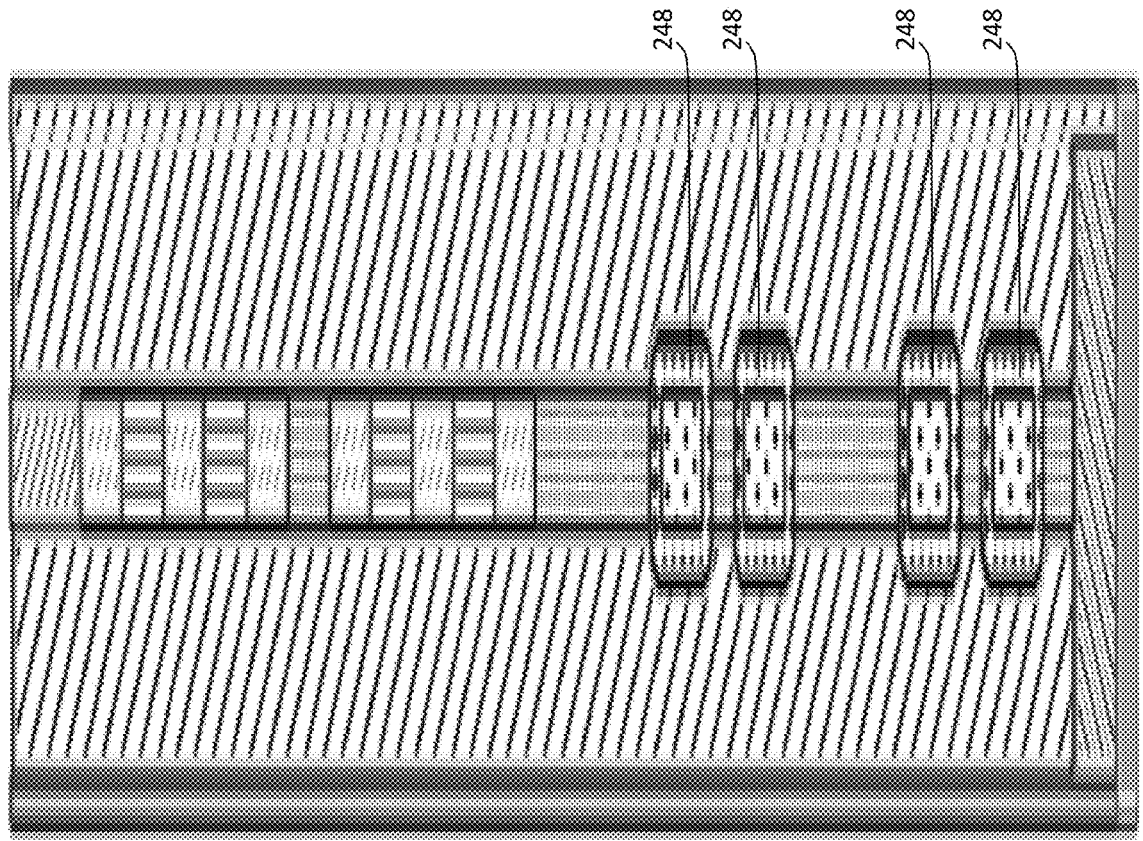
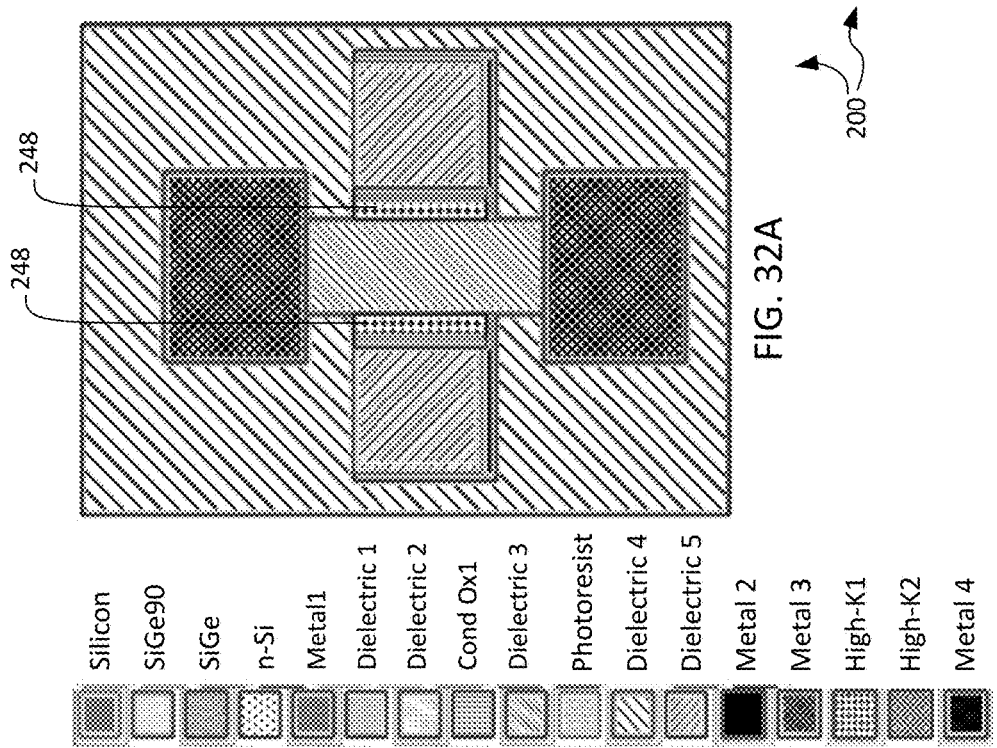
FIG. 32A
FIG. 32B

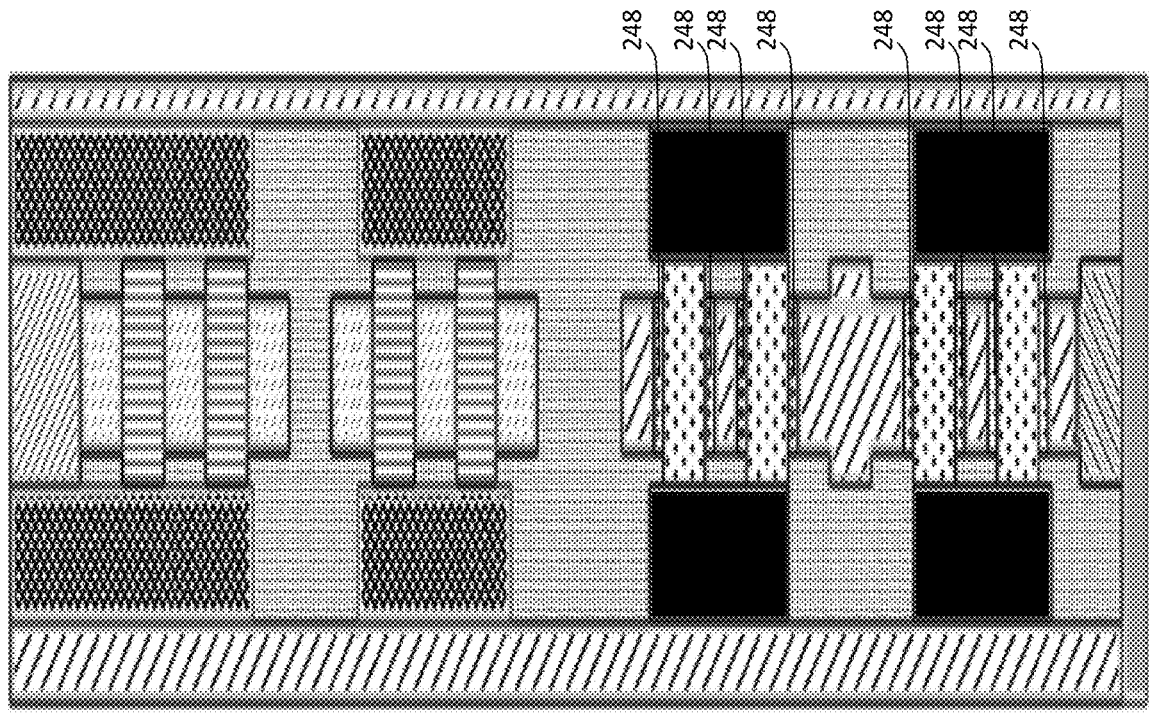
FIG. 33B
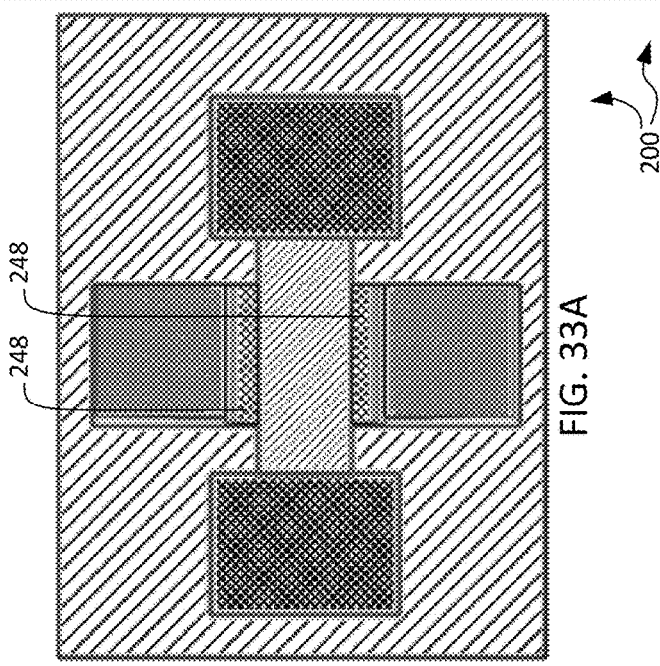
FIG. 33A
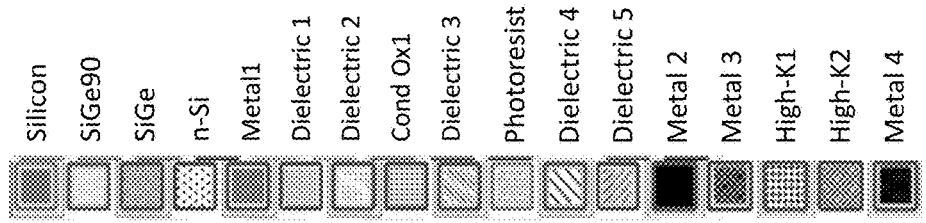

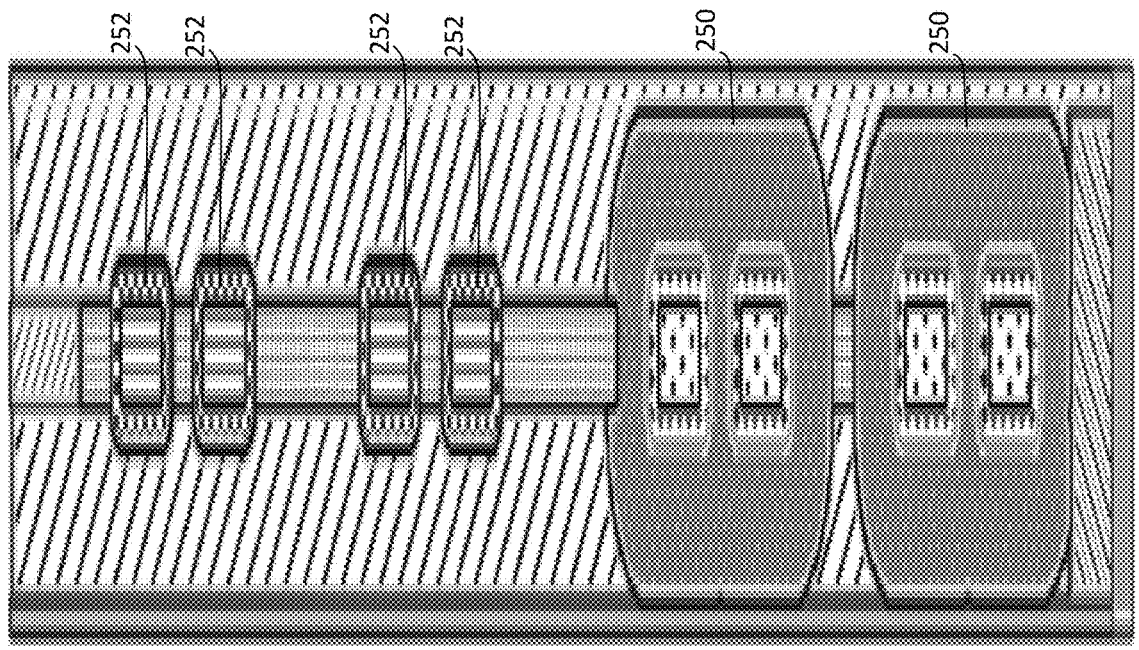
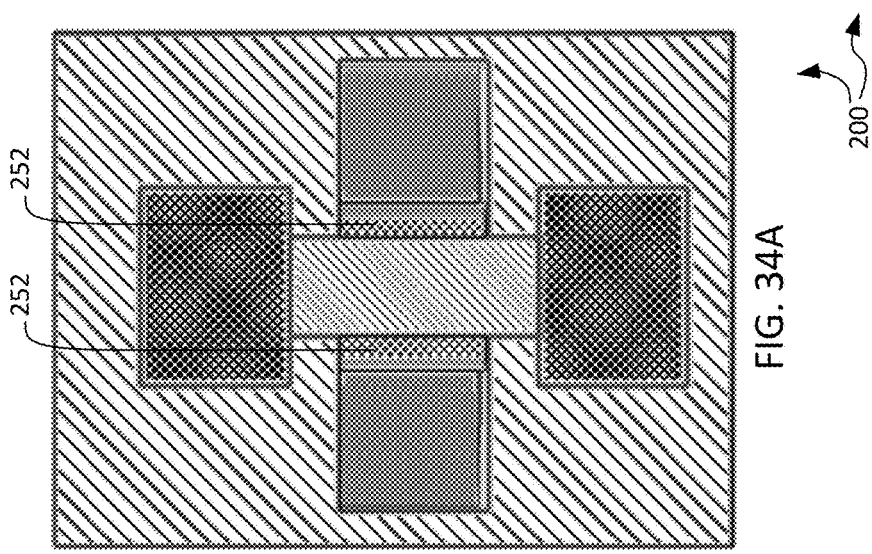
FIG. 34B
FIG. 34A
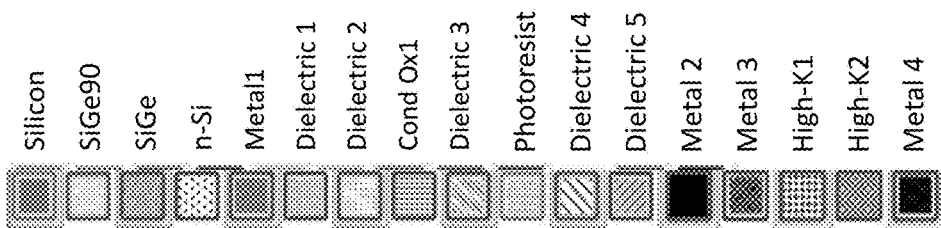

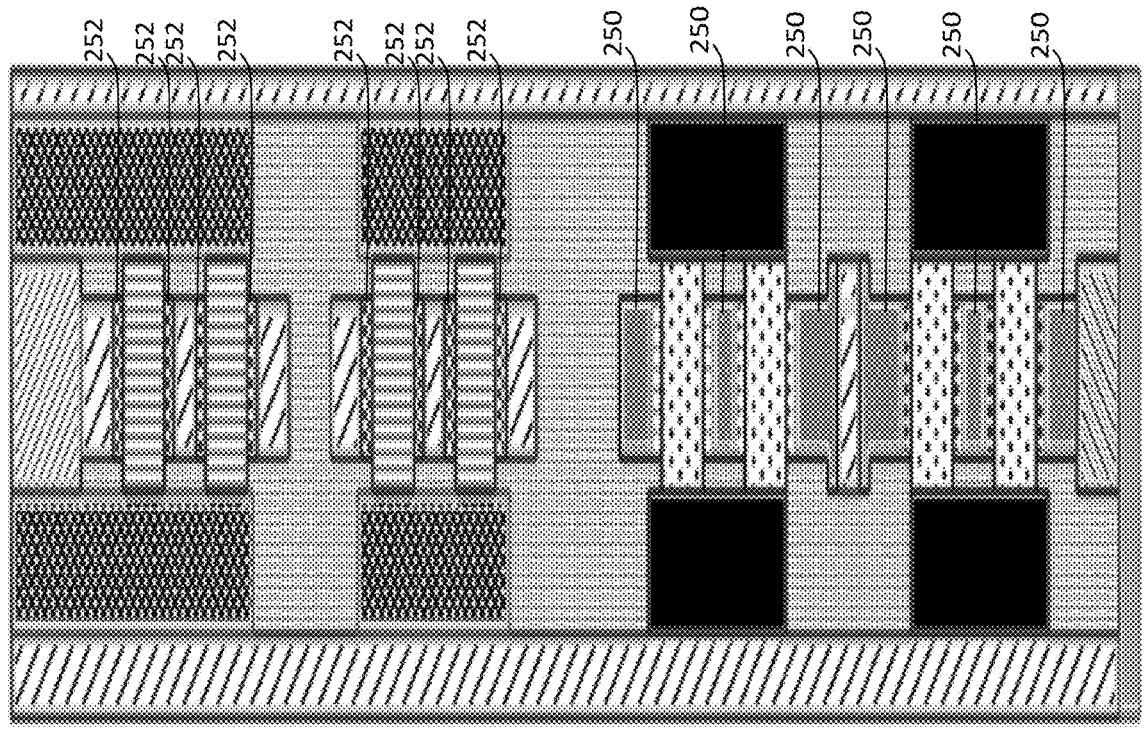
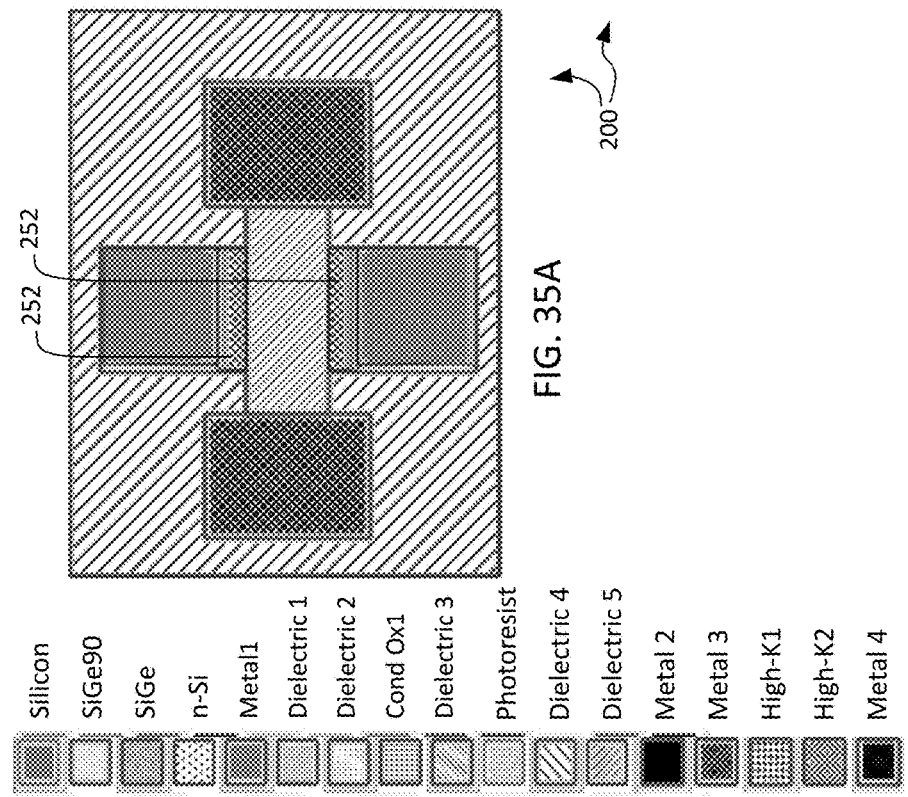
FIG. 35B
FIG. 35A

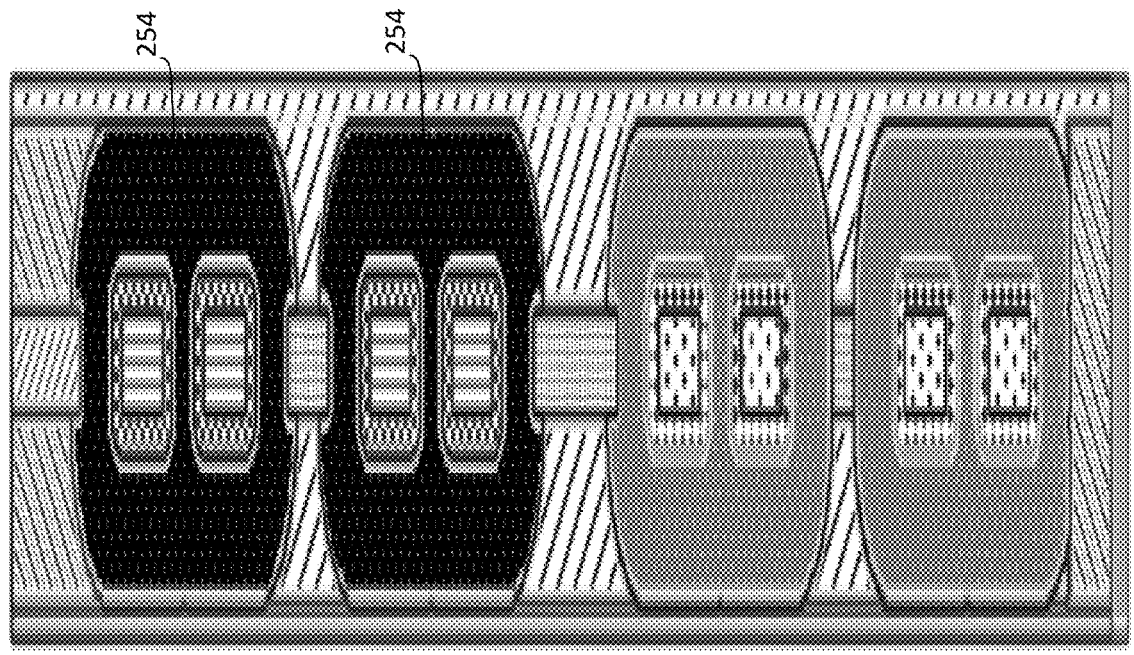
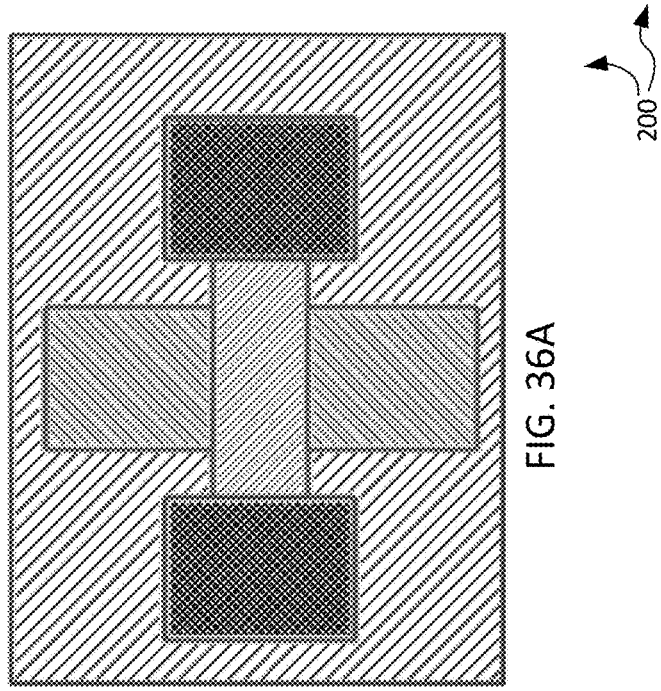
FIG. 36A
FIG. 36B
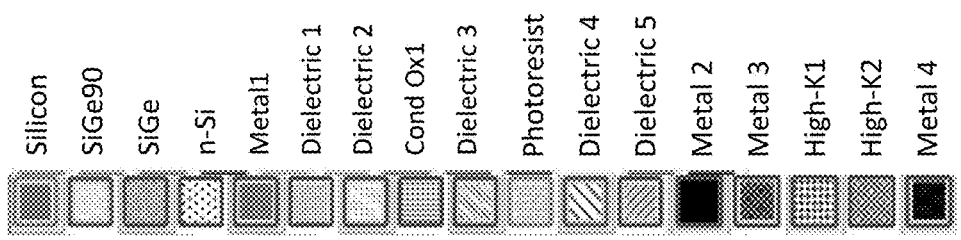

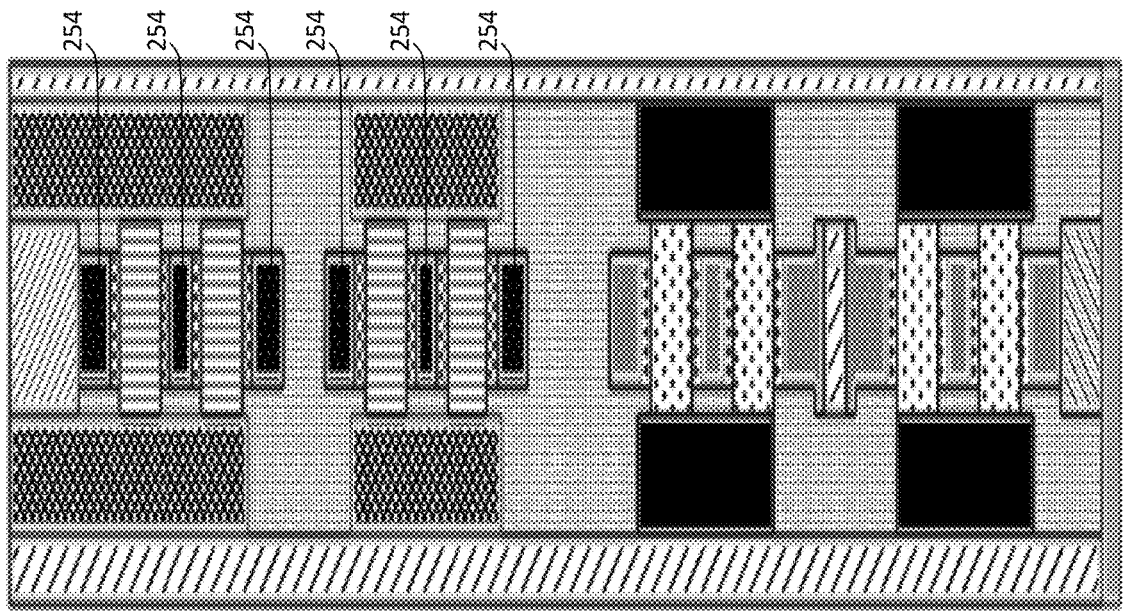
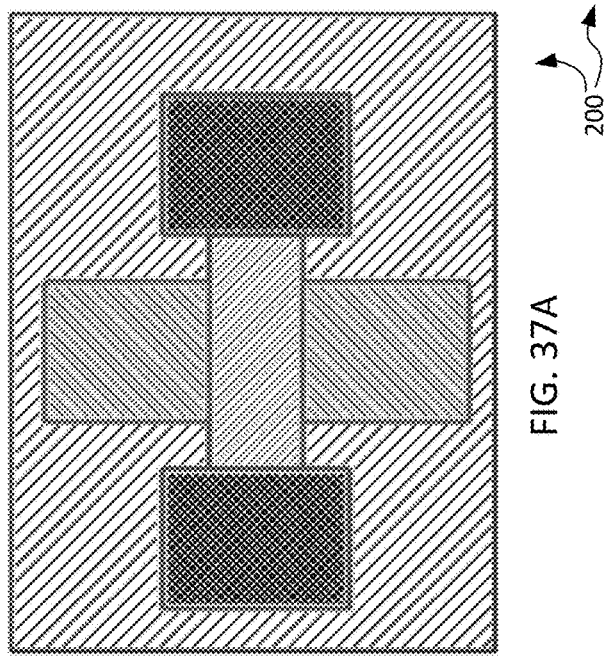
FIG. 37A
FIG. 37B
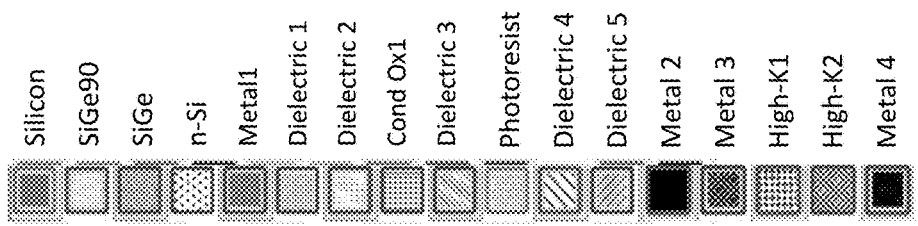

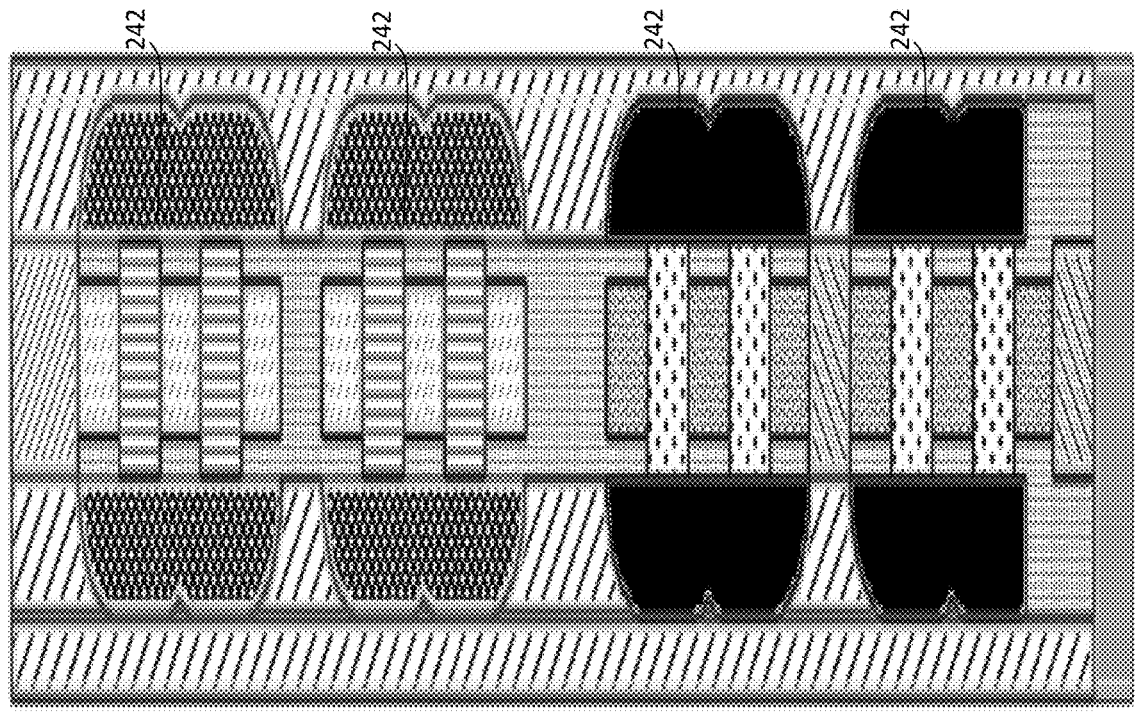
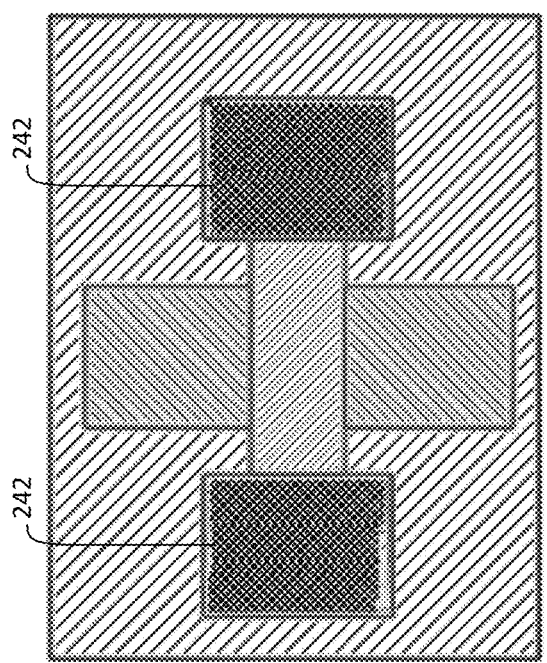
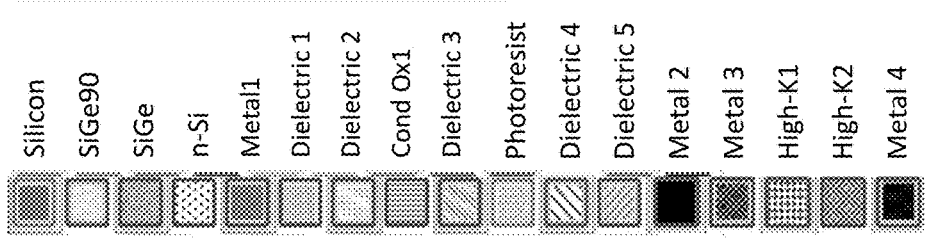
FIG. 39A
FIG. 39B

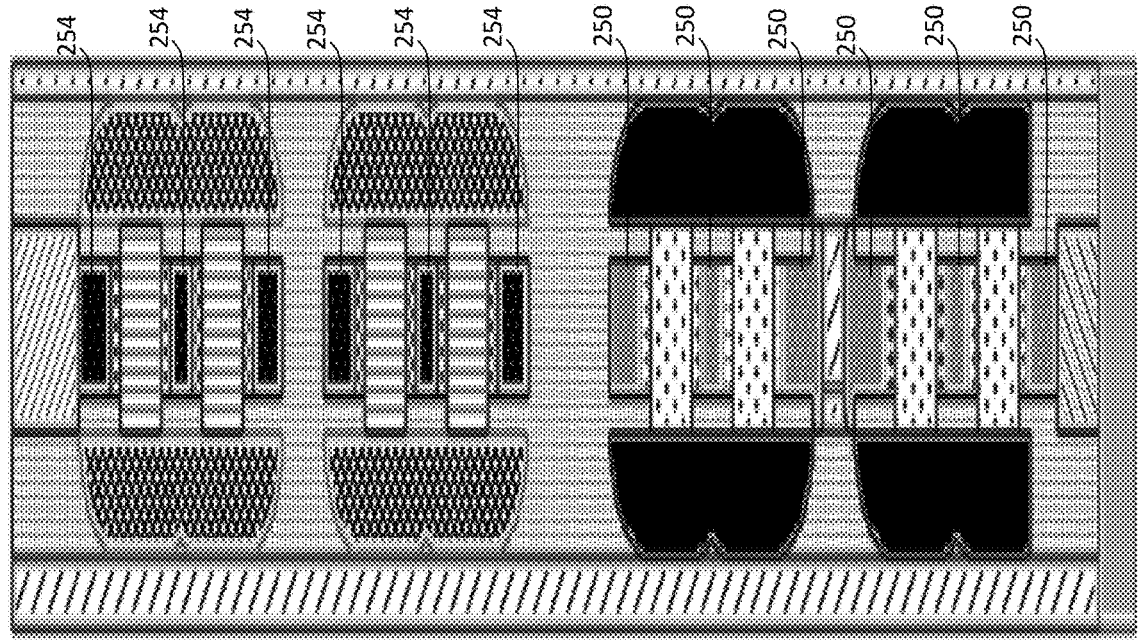
FIG. 40B
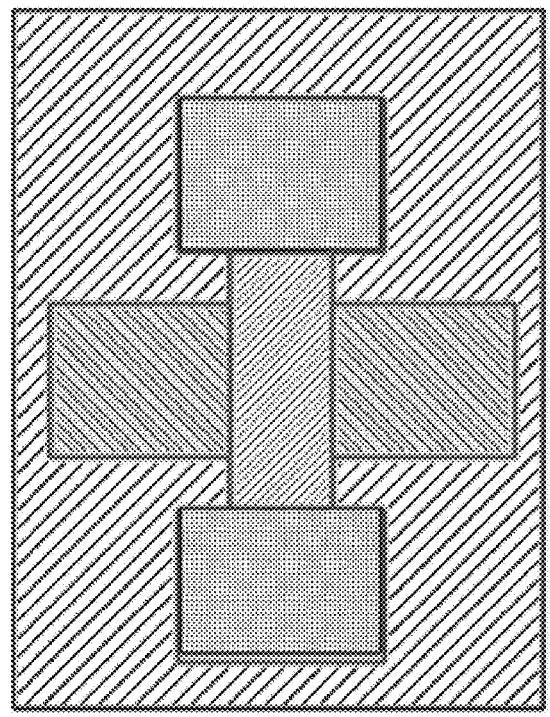
FIG. 40A
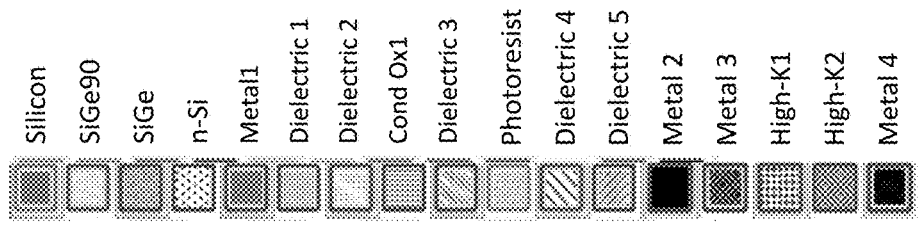

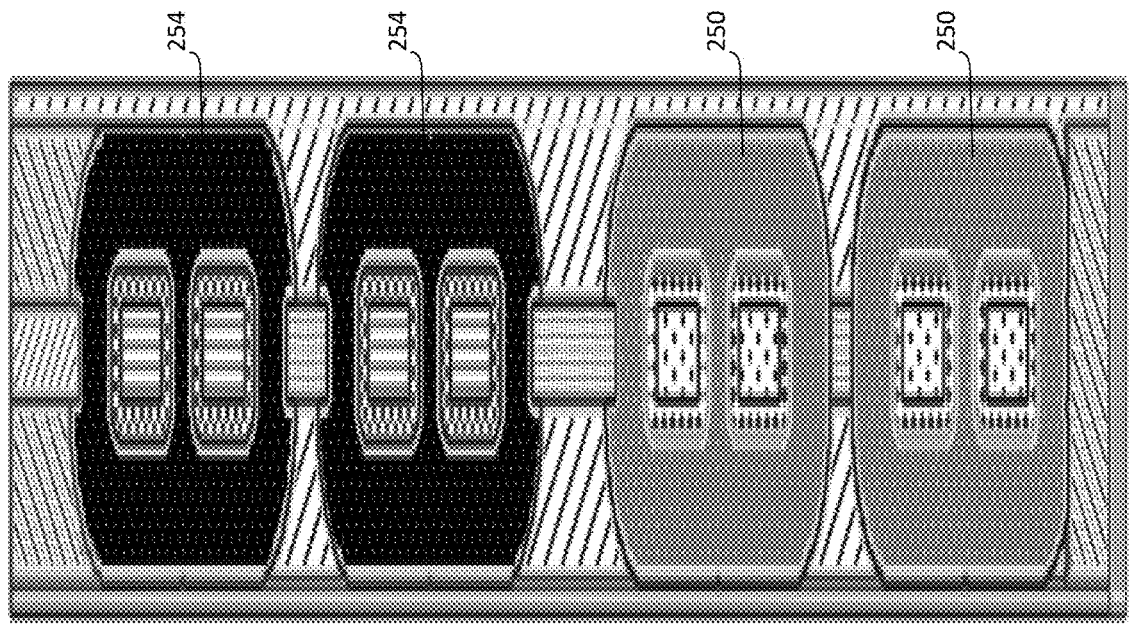
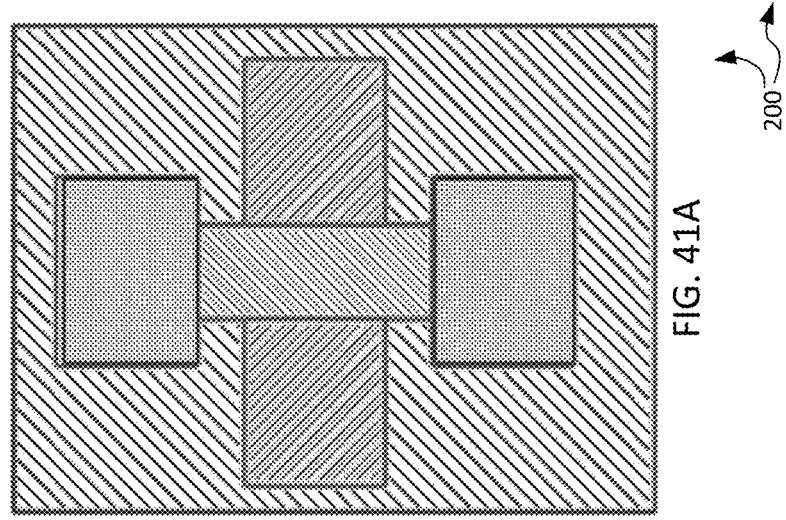
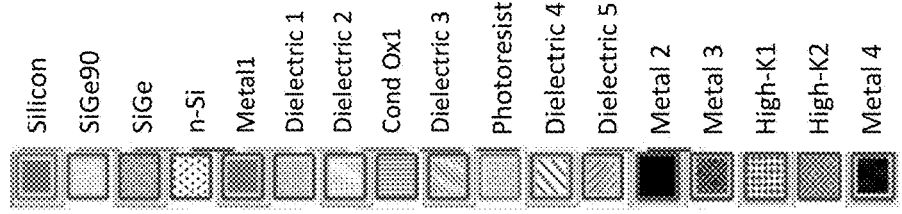
FIG. 41B
FIG. 41A

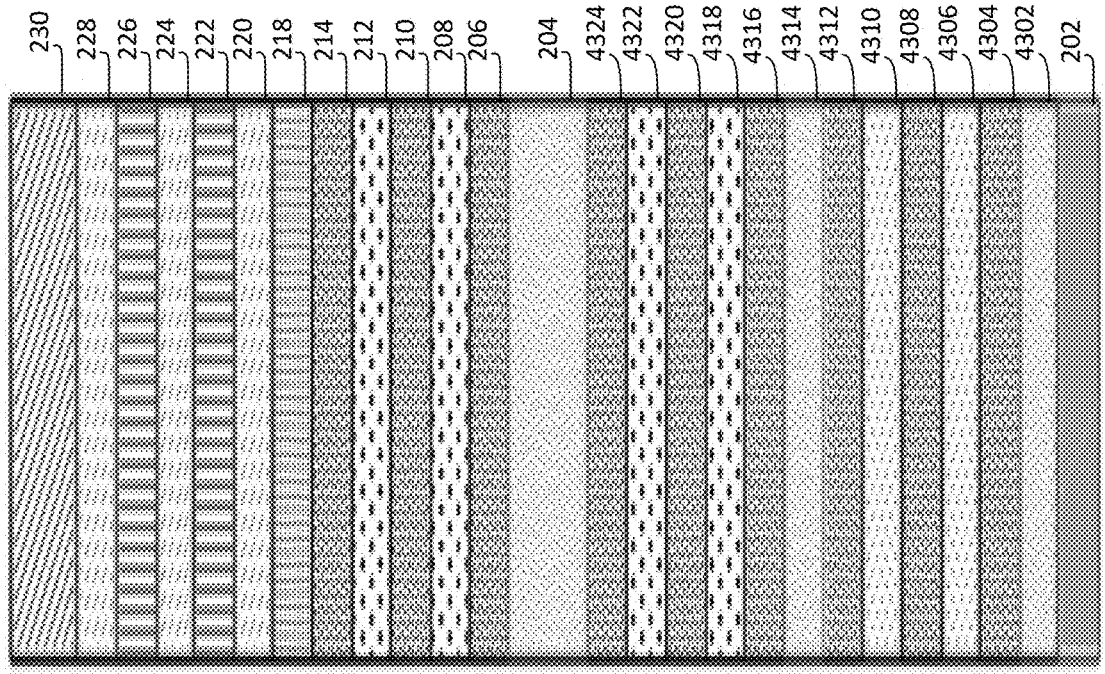
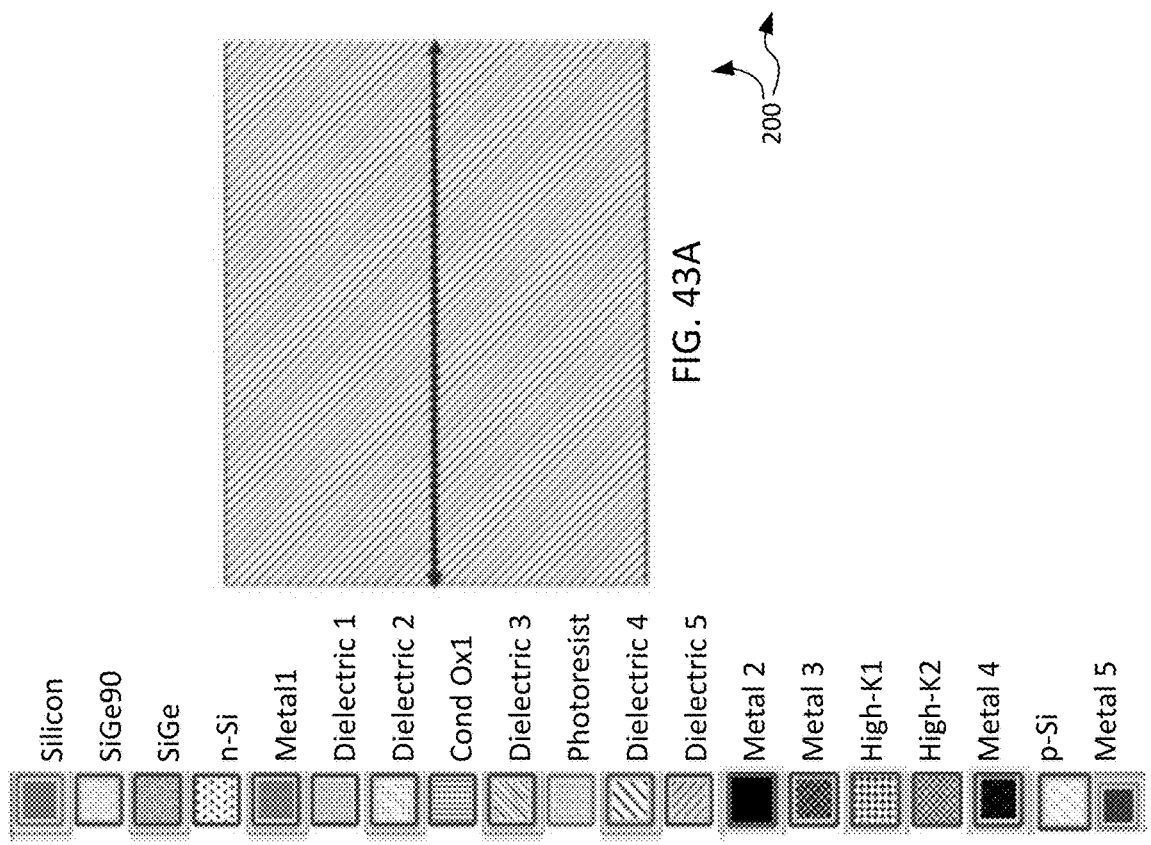
FIG. 43A
FIG. 43B

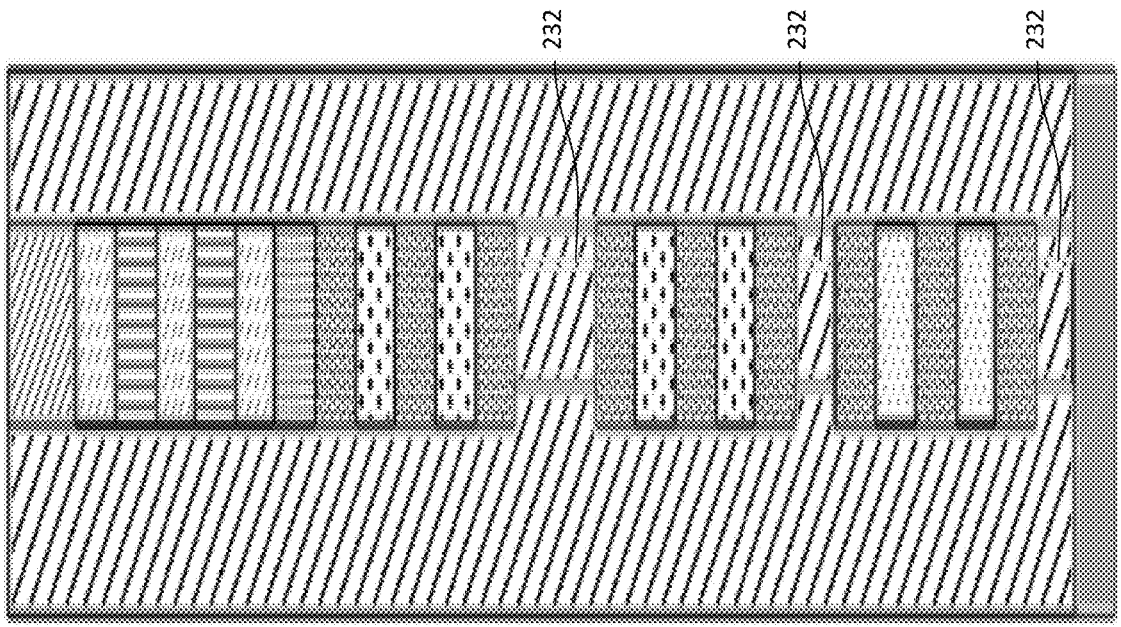
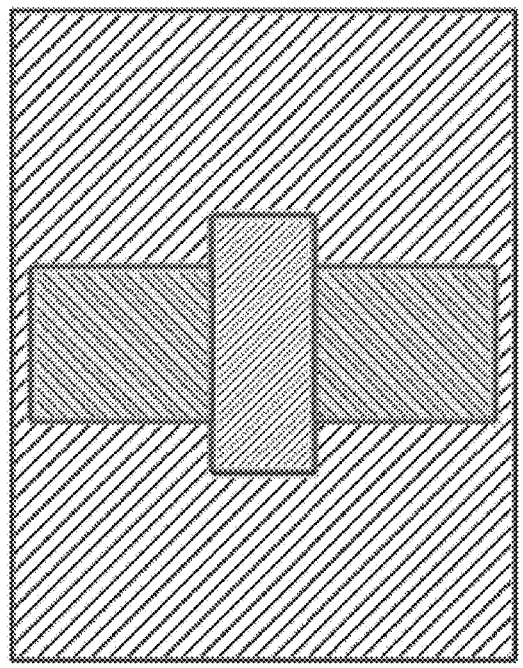
FIG. 44A
FIG. 44B
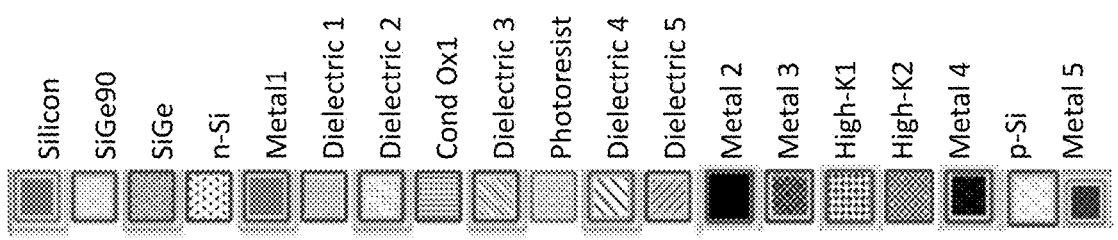

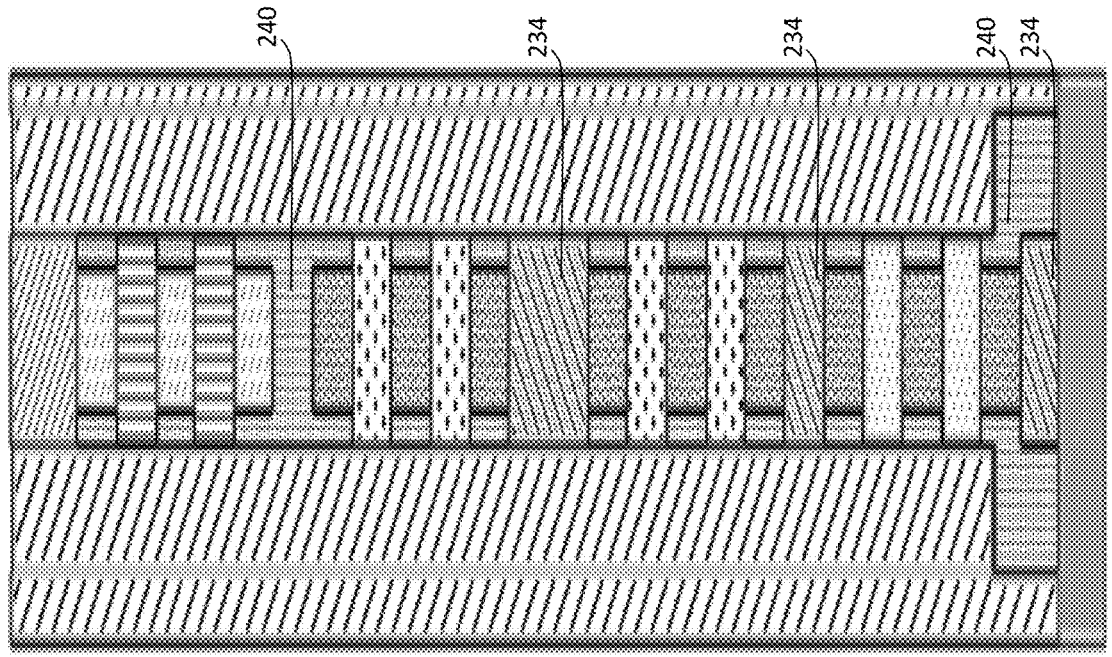
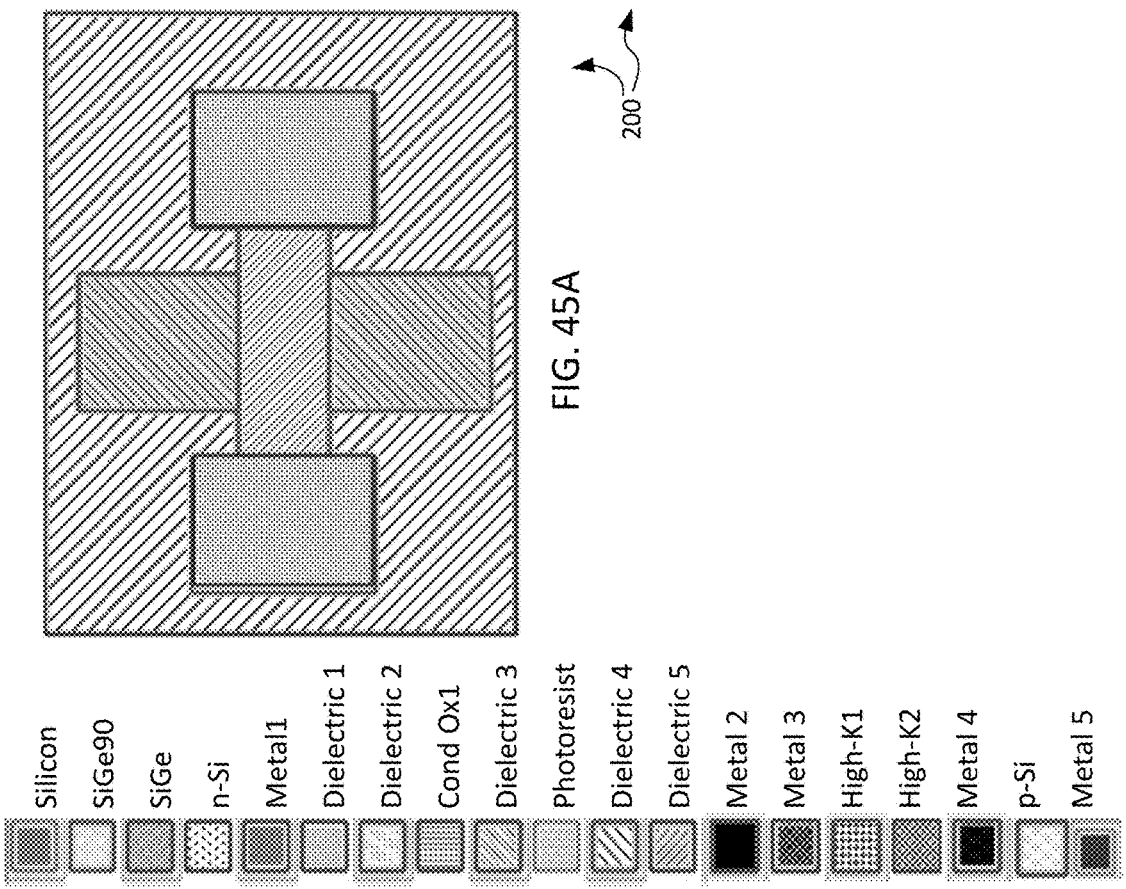
FIG. 45A
FIG. 45B

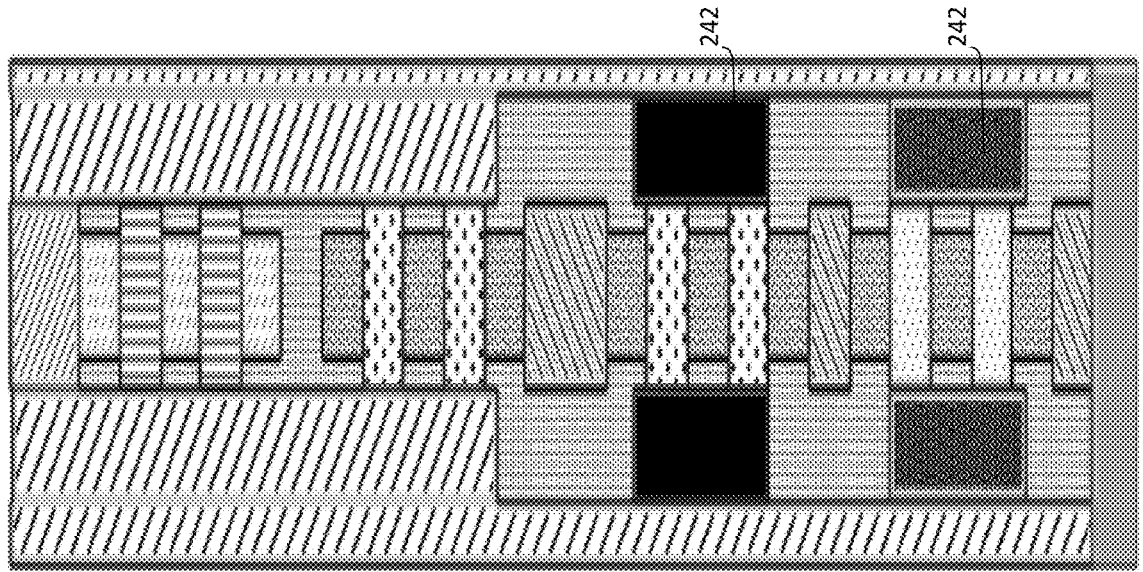
FIG. 46B
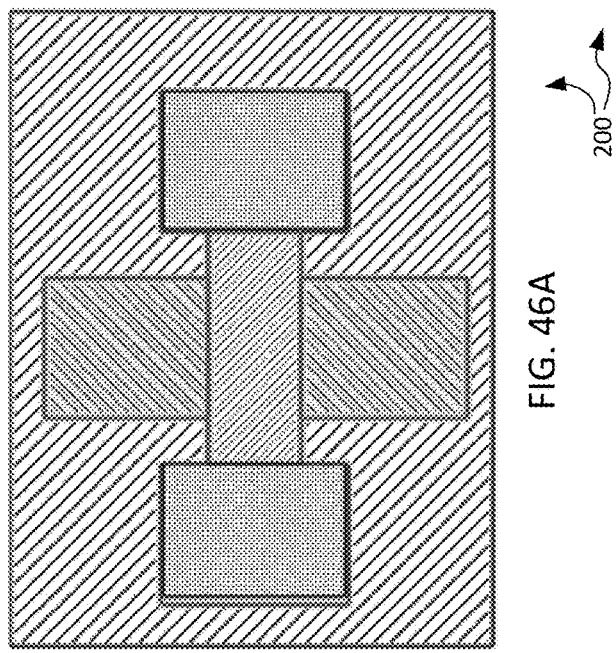
FIG. 46A
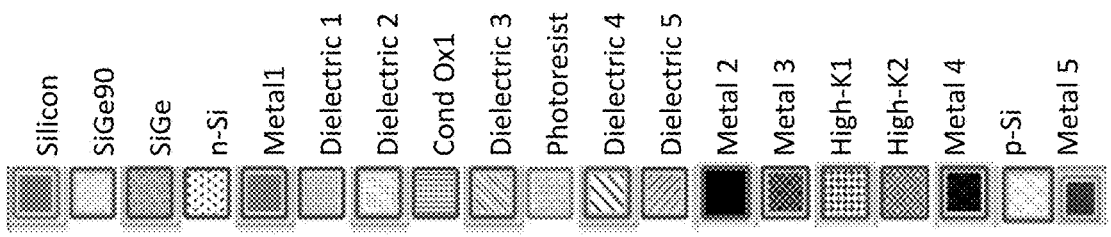

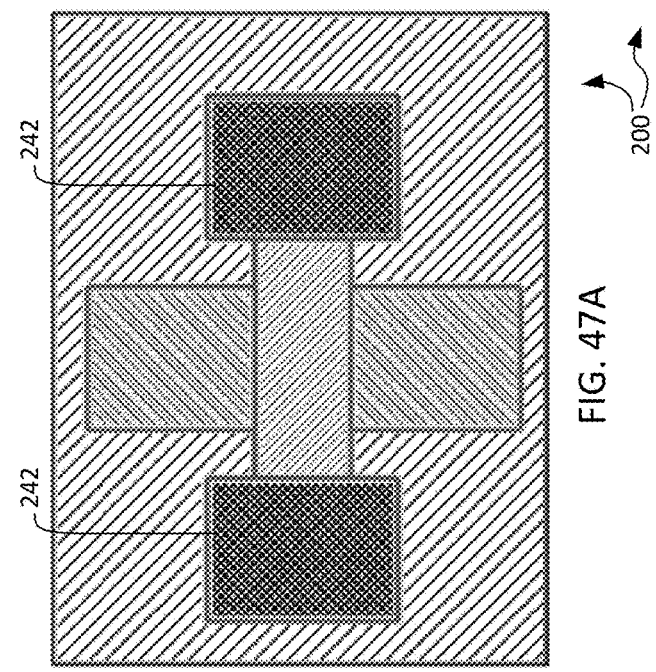
FIG. 47A
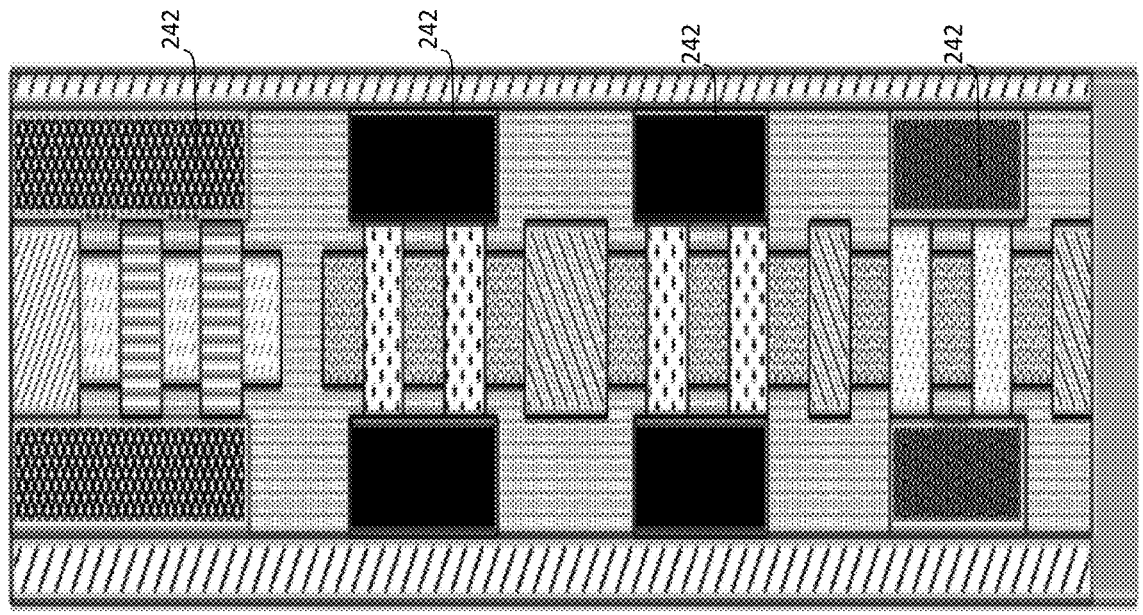
FIG. 47B
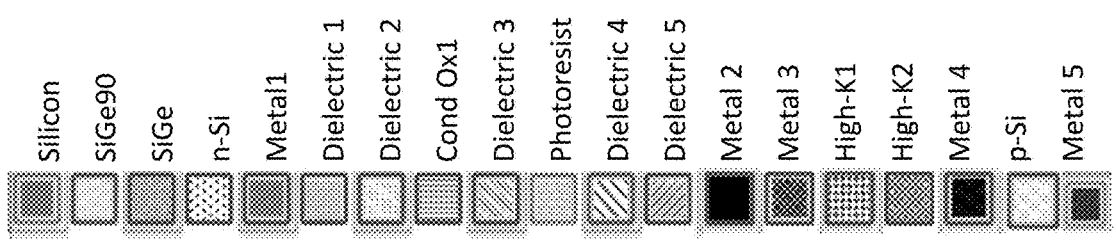

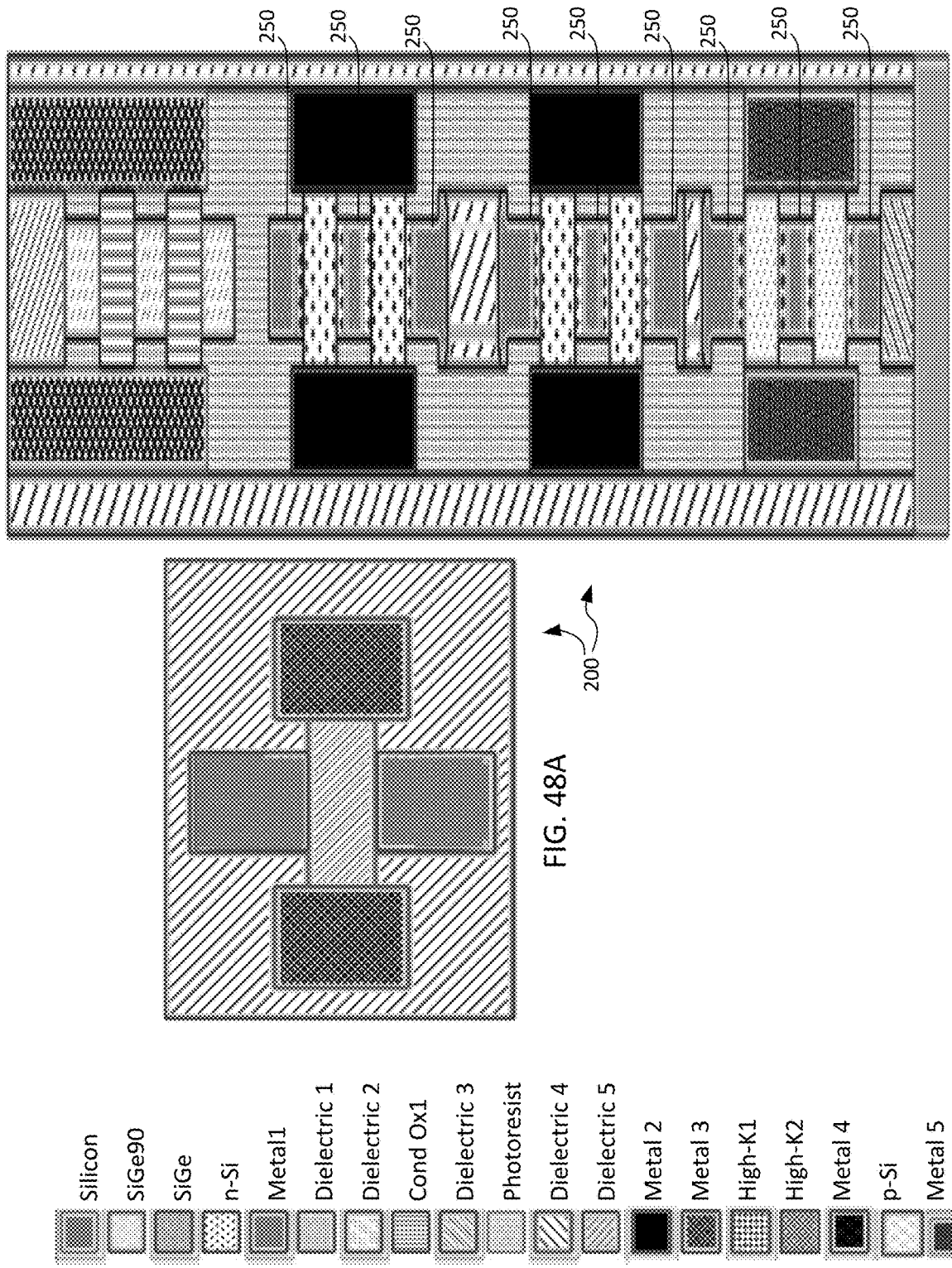

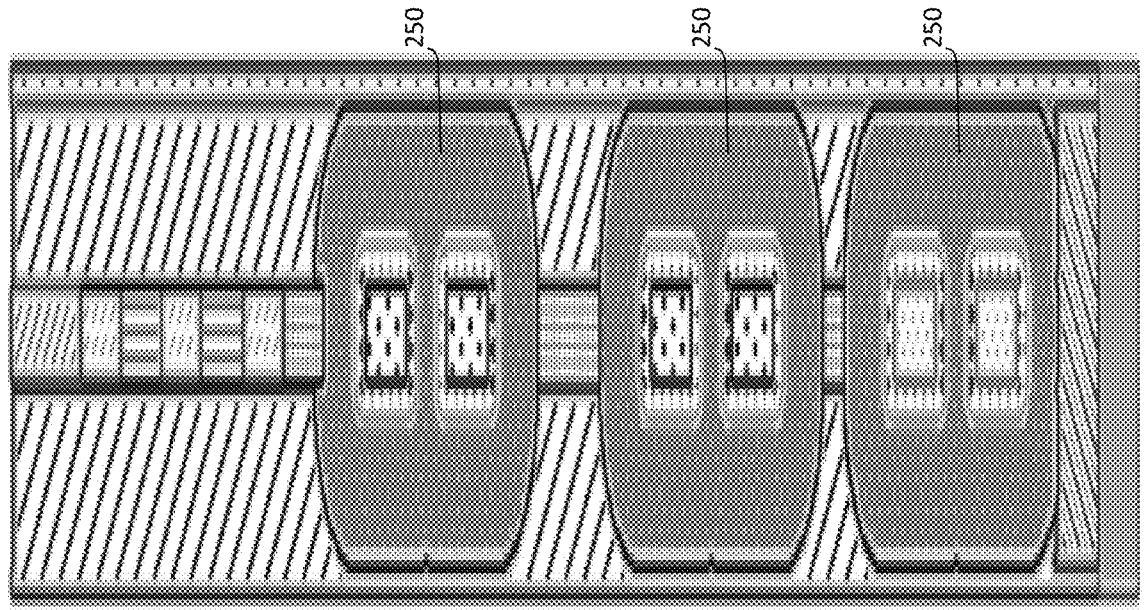
FIG. 49B
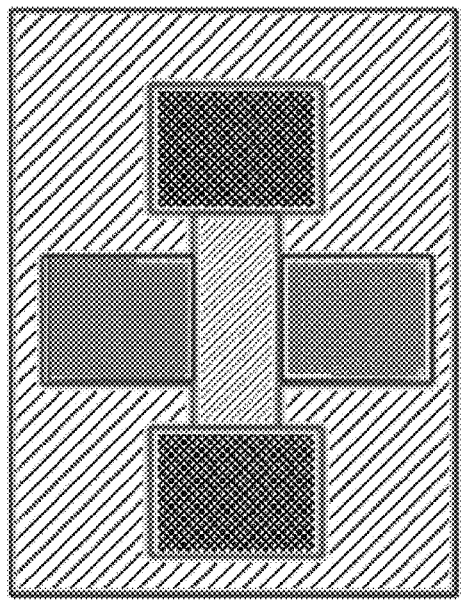
FIG. 49A
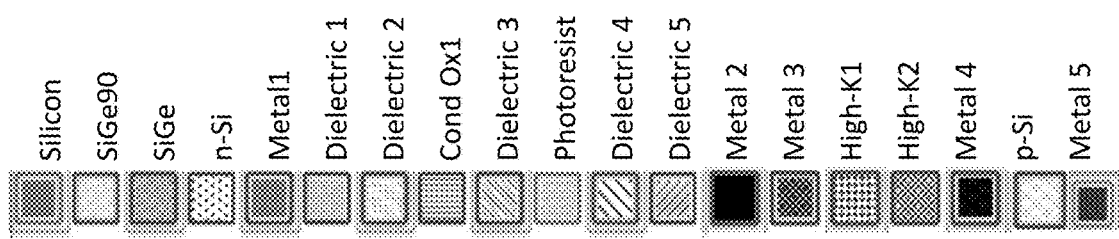

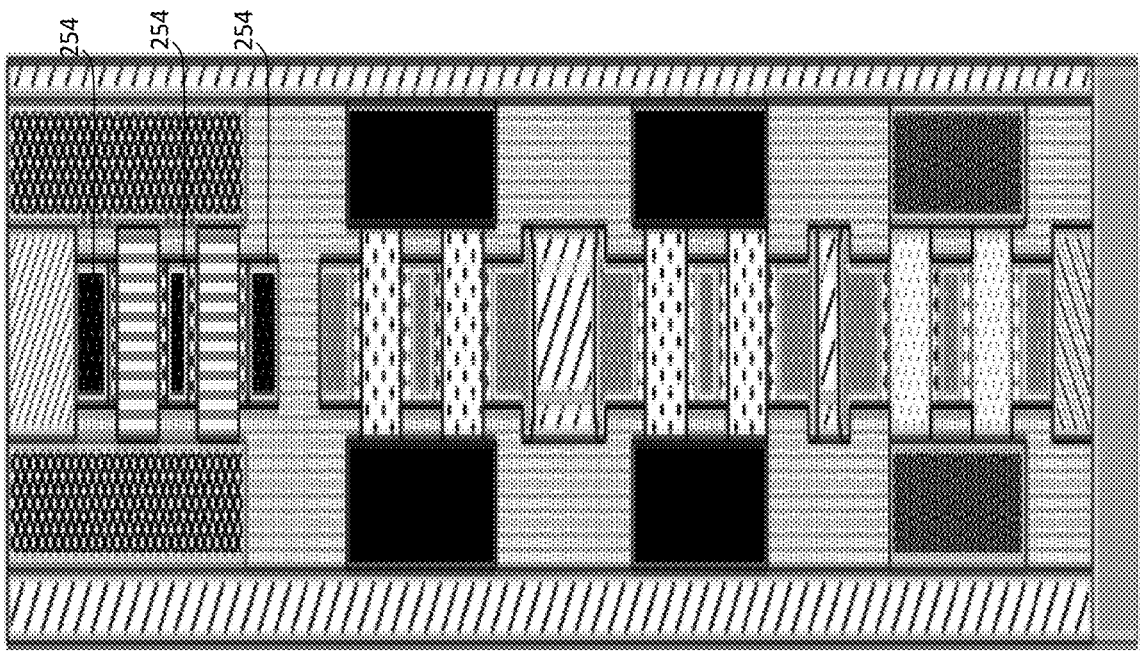
FIG. 50B
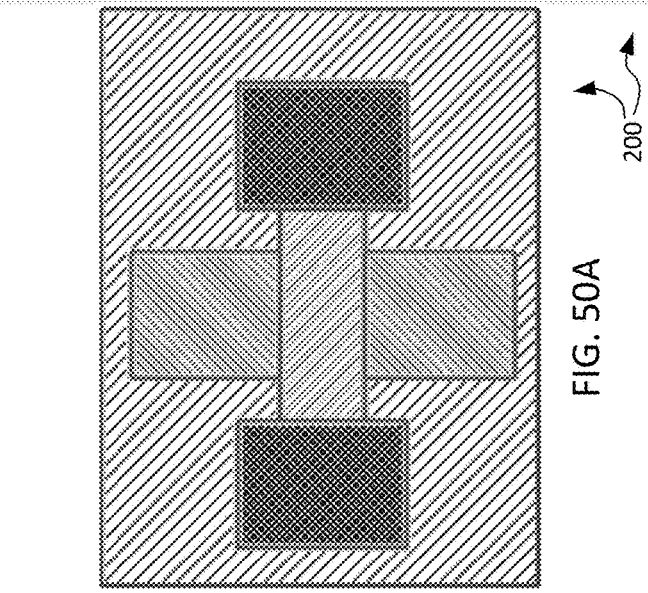
FIG. 50A
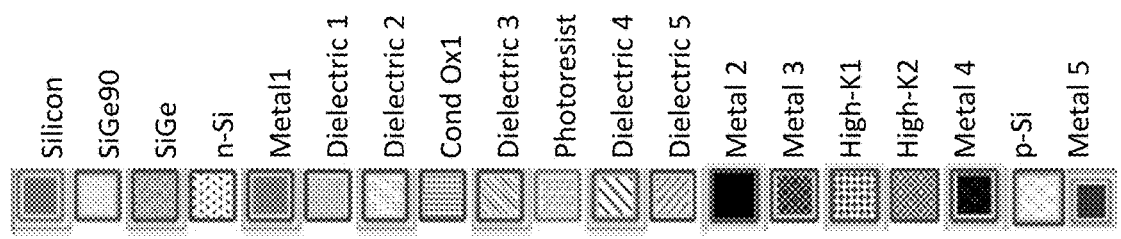

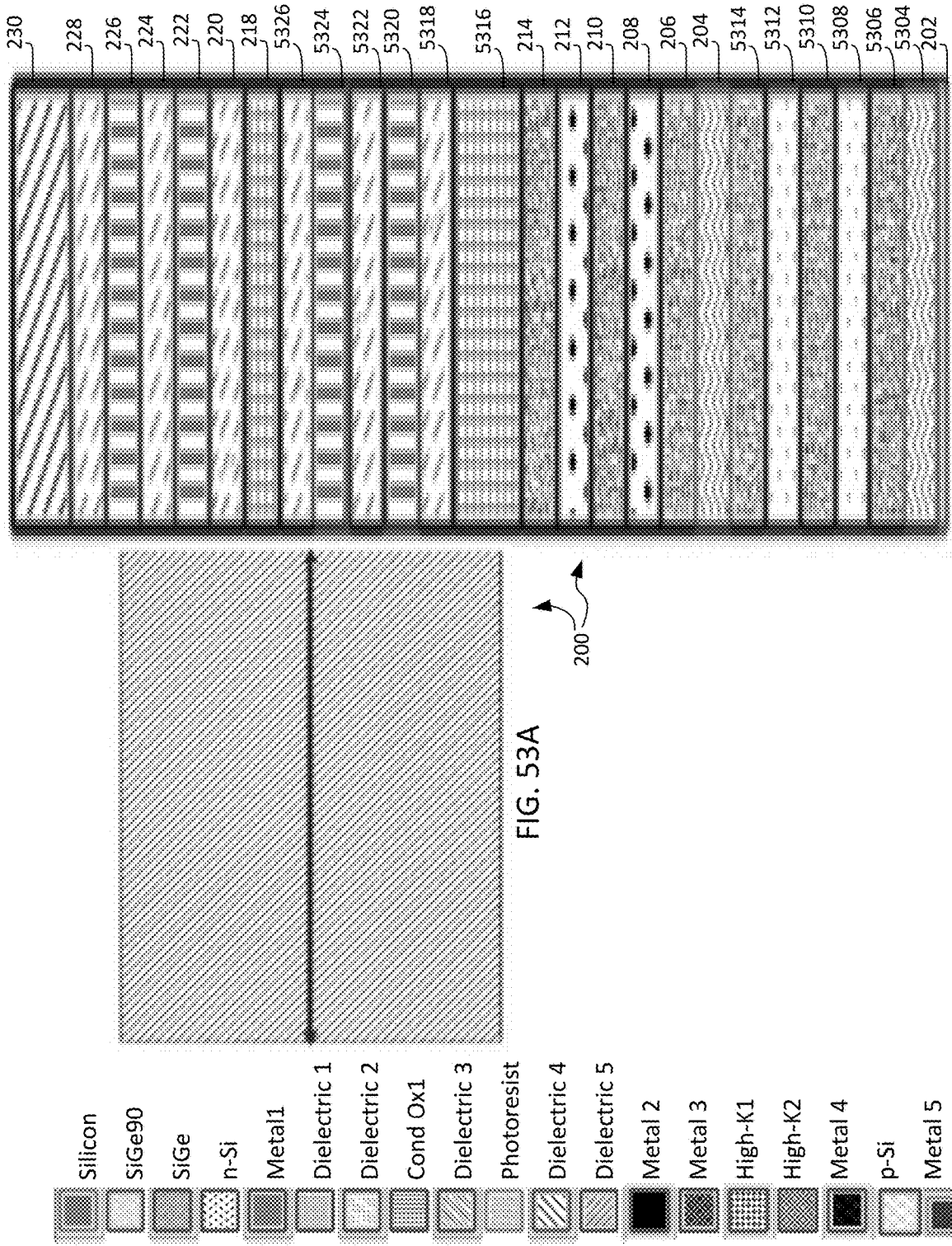

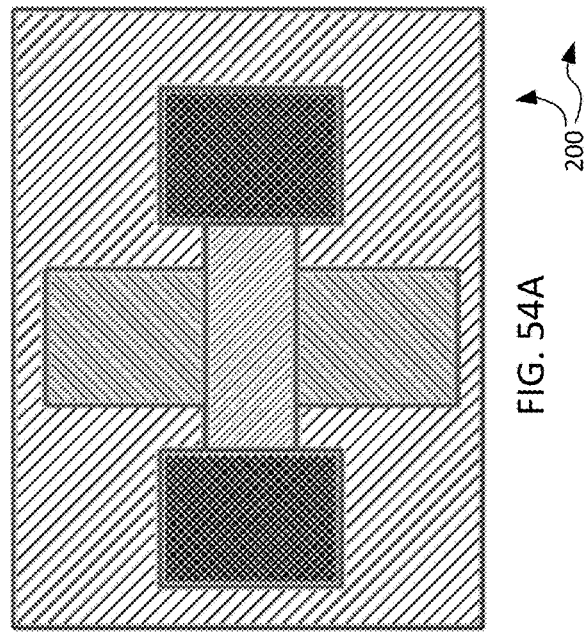
FIG. 54A
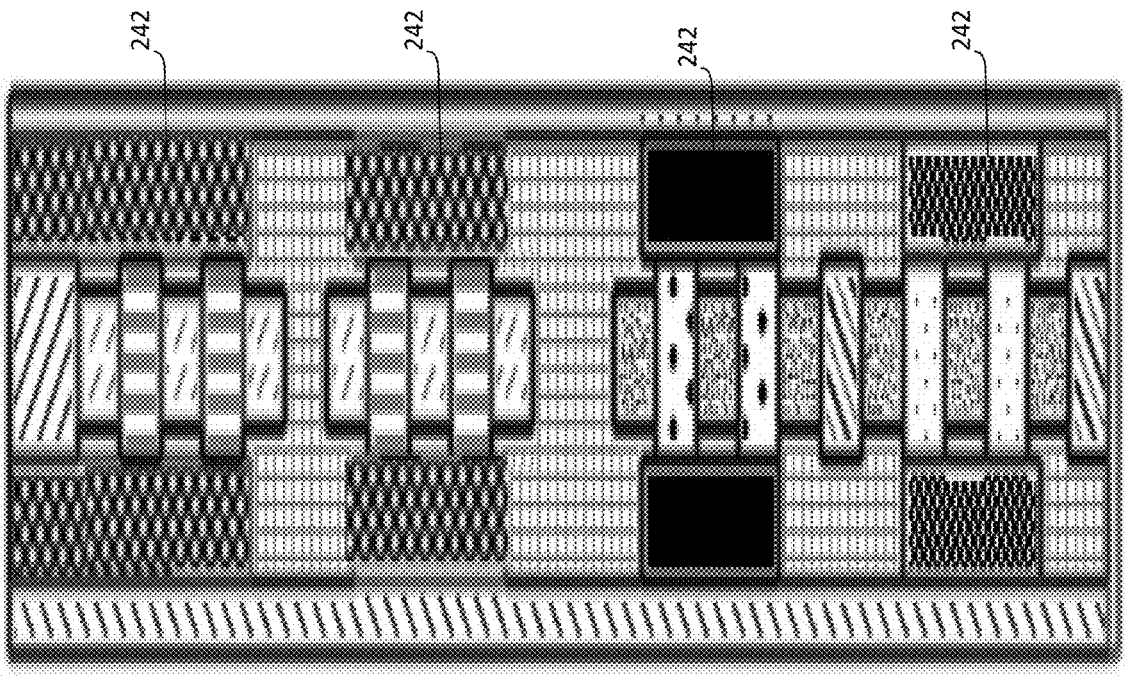
FIG. 54B
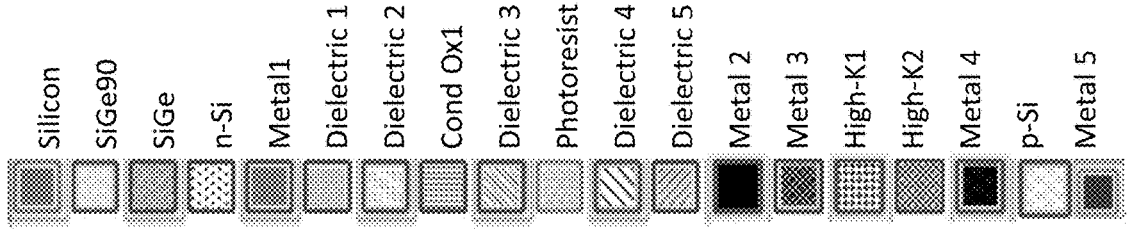

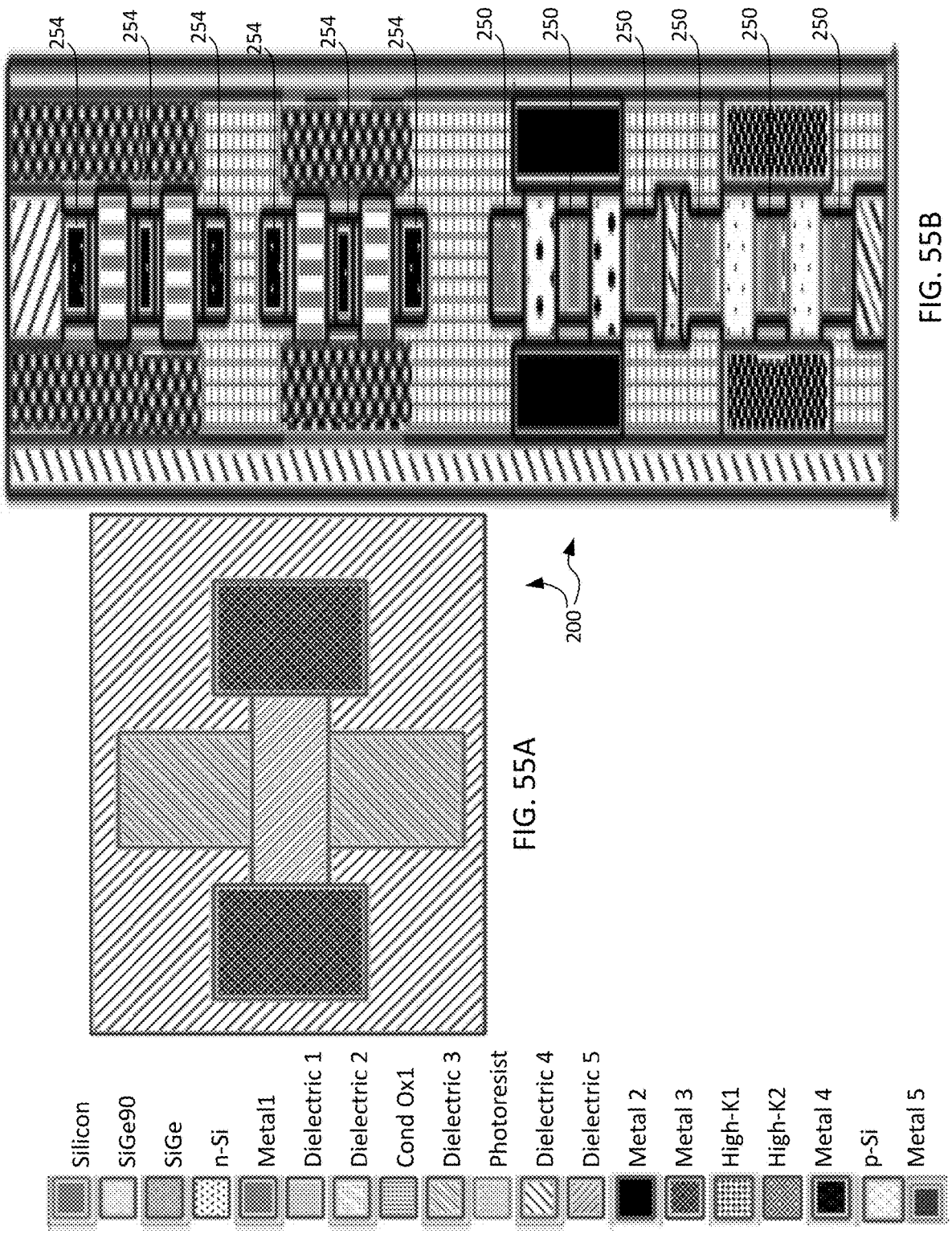

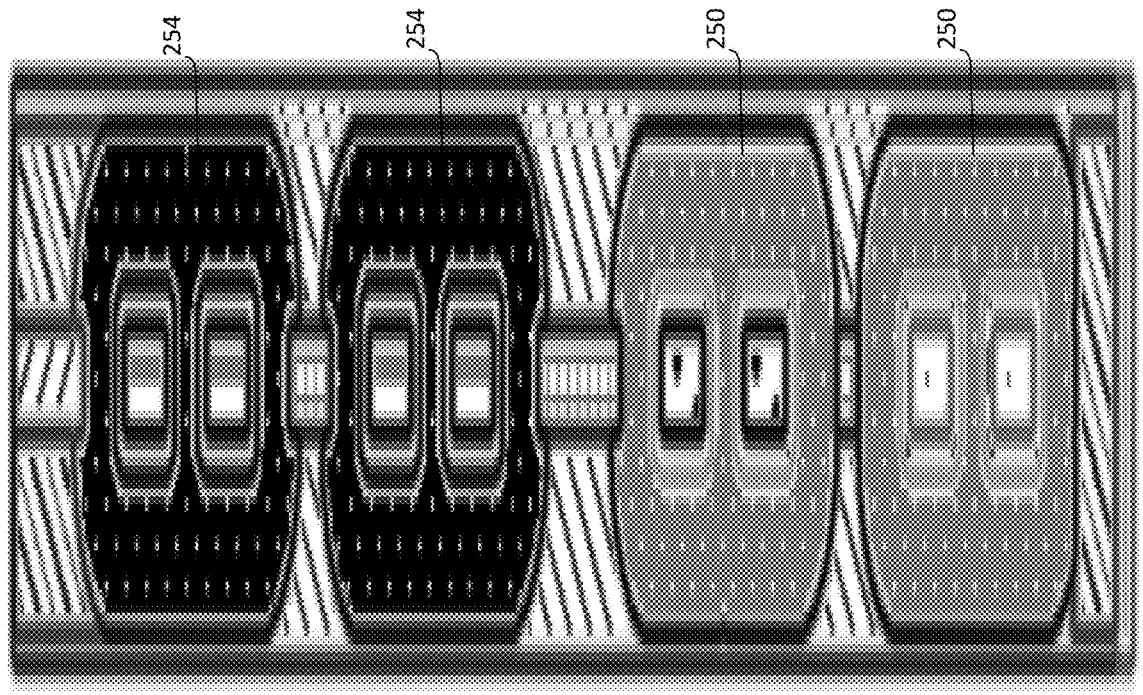
FIG. 56B
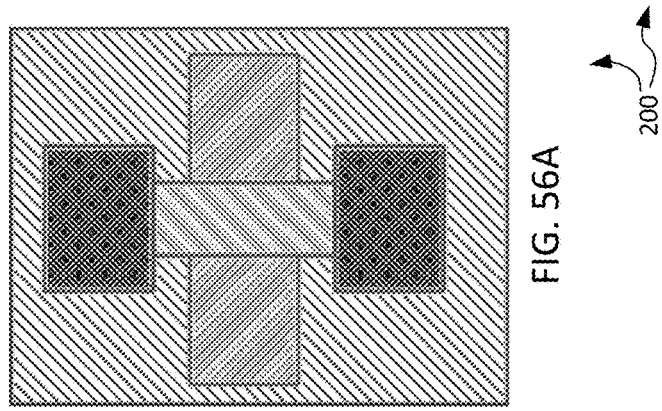
FIG. 56A
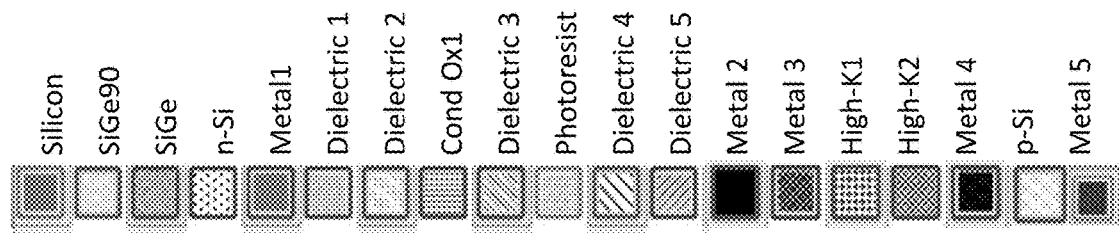

3D HYBRID MEMORY USING HORIZONTALLY ORIENTED CONDUCTIVE DIELECTRIC CHANNEL REGIONS

CROSS-REFERENCE TO RELATED APPLICATIONS

The present application claims the benefit of and priority to U.S. Provisional Patent Application No. 63/222,868, filed Jul. 16, 2021, and entitled "3D Hybrid Memory Using Horizontally Oriented Conductive Dielectric Channel Regions," the contents of which is incorporated by reference in its entirety for all purposes.

FIELD OF THE DISCLOSURE

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other. 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g., CPU (central processing unit), GPU (graphics processing unit), FPGA (field programmable gate array, SoC (System on a chip)) is being pursued.

SUMMARY

The present disclosure relates to non-planar, or 3D, structures and transistors. The channel regions of the transistors may be oriented to conduct current through the channel in a direction generally parallel with the major surface of the system or chip upon which, or within which, these structures are provided. Gate All Around (GAA) structures may be utilized to provide cost, performance, and/or design advantages. The techniques and structures described herein provide a higher density of DRAM using a conductive dielectric channel, which allows for a higher 3D density. In certain implementations, a storage transistor may replace a conventional capacitor, which is typically relatively tall, allowing for a denser and thinner form factor of a DRAM memory array.

One aspect of the present disclosure can be directed to a structure. The structure can include a first transistor and a second transistor. The first transistor can include a first channel region. The first channel region can include one or more first nanostructures formed of a semiconductor material. The second transistor can be disposed vertically with respect to the first transistor. The second transistor can include a second channel region. The second channel region can include one or more second nanostructures formed of a conductive oxide material.

The oxide material of the structure can be a nanosheet. The nanosheet can include indium oxide ($In_2O_3$), tin oxide ($SnO_2$), indium gallium zinc oxide (InGaZnO), zinc oxide (ZnO), or tin oxide (SnO).

The gate of the first transistor of the structure can be coupled to a drain of the second transistor of the structure.

The first and second transistor of the structure can be provided on a substrate. The second transistor can be stacked over the first transistor.

The structure including the stacked transistors can include a conductive via coupling a gate of the first transistor to a drain of the second transistor.

The first and second channel regions of the structure can include at least two parallel nanosheets.

The first and second transistor of the structure can be connected as a DRAM cell. One of the first and second transistors can be a select transistor. The other of the first and second transistor can be a storage node.

Another aspect of the present disclosure can be directed to a method for manufacturing a structure. The method can include providing a stack of layers. The stack of layers can include a layer of a first sacrificial material, a first layer of a second sacrificial material, and at least one semiconductor channel layer. The at least one semiconductor channel layer can be on the first layer of the second sacrificial material with a second or additional layer of the second sacrificial material provided over each semiconductor channel layer. The stack of layers can include an insulation layer. The stack of layers can include alternating layers of an oxide channel layer and a third sacrificial material. The stack of layers can include a lowermost layer and an uppermost layer in the stack of layers comprising the third sacrificial material. The method can include patterning the layers to form a plurality of transistor core stacks isolated from each other by an insulating layer. The method can include etching first openings on first opposing sides of each transistor core stack to access the first sacrificial material. The method can include removing the first sacrificial material and replacing the removed material with an insulating material. The method can include etching second openings on second opposing sides of each transistor core stack. The method can include partially etching the layers of second sacrificial material and third sacrificial material. The method can include selectively forming a dielectric material on the layers of second and third sacrificial materials. The method can include forming first source/drain regions adjacent the at least one semiconductor channel layer and second source/drain regions adjacent the at least one oxide channel layer. The method can include removing the second and third sacrificial materials through the first openings. The method can include forming high-k gate dielectric materials. The high-k gate dielectric materials can be selectively formed around the at least one semiconductor channel layer and the at least one oxide channel layer. The method can include forming a first gate surrounding the at least one semiconductor channel layer. The method can include forming a second gate surrounding the at least one oxide channel layer.

The method can include forming a conductive via coupling one of the second source/drain regions to the first gate.

Yet another aspect of the present disclosure may be directed to a structure. The structure can include at least two first transistors having a first channel region. The first channel region can include one or more first nanostructures formed of a semiconductor material. At least one second transistor can be disposed vertically with respect to the first transistor. The second transistor can include a second channel region. The second channel region can include one or more second nanostructures formed of a conductive oxide material.

The at least two transistors of the structure can have multiple first channel regions comprising the semiconductor material.

The at least two transistors of the structure can have at least one of the plurality of first channel regions. The first channel region can include n-type semiconductor material. At least one other of the at least two transistors can include at least one of the plurality of first channel regions including a p-type semiconductor material.

At least two second transistors of the structure can include second channel regions having an oxide material.

At least one of the at least two transistors of the structure including the plurality of first channel regions can include an n-type semiconductor material. At least one of the at least two transistors having the plurality of first channel regions can include a p-type semiconductor material.

The oxide material structure can be a nanosheet. The nanosheet can include indium oxide ($In_2O_3$), tin oxide ($SnO_2$), indium gallium zinc oxide (InGaZnO), zinc oxide (ZnO), or tin oxide (SnO).

A further aspect of the present disclosure is directed to a structure. The structure can include a first stack of transistors with at least one p-type semiconductor nanostructure. At least one n-type semiconductor nanostructure can be coupled to the at least one p-type semiconductor nanostructure. The transistors can be or include a complementary transistor pair. The structure can include at least one first transistor having at least one first channel region including a semiconductor material or an oxide material. The structure can include at least one second transistor having at least one second channel region comprising an oxide material.

The oxide material structure can be a nanosheet. The nanosheet can include indium oxide ($In_2O_3$), tin oxide ($SnO_2$), indium gallium zinc oxide (InGaZnO), zinc oxide (ZnO), or tin oxide (SnO).

The first and second transistor of the structure can be connected as a DRAM cell. One of the first or second transistors can be a select transistor and the other of the first and second transistor can be a storage node.

The first stack of transistors of the structure can include a third transistor having at least one third channel region comprising the semiconductor material. The first stack of transistors of the structure can include a fourth transistor having at least one fourth channel region comprising the oxide material or the semiconductor material.

The structure of claim can include a second stack of transistors. The second stack of transistors can be disposed laterally from the first stack of transistors. The second stack of transistors can include at least one p-type semiconductor nanostructure and one n-type semiconductor nanostructure coupled to the at least one p-type semiconductor device as a complementary transistor pair. The second stack of transistors can include at least one third transistor having at least one third channel region comprising the semiconductor material or the oxide material. The second stack of transistors can include at least one fourth transistor having at least one fourth channel region including the oxide material.

3D integration, e.g., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs and DRAM is substantially more difficult. 3D integration for logic chips (e.g., CPU (central processing unit), GPU (graphics processing unit), FPGA (field programmable gate array), SoC (System on a chip), and memories thereof) is being pursued.

Techniques herein include methods of forming vertical transistors. Techniques herein enable a memory or logic device to be formed from vertically stacked transistors. The memory cells of a memory device can be two-transistor (2T) cells wherein a storage node is formed on the gate of a conductive oxide-based transistor. A semiconductor based transistor or another conductive oxide-based transistor can be combined with the conductive oxide-based transistor having the storage node to access (e.g., read or write) the storage node. The conductive oxide-based transistor can have a lower leakage current (and thus a lower refresh rate, additional bit levels, etc.), relative to some semiconductor-based transistors. Methods herein are compatible with deposition of dielectric and conductive oxide layers over epitaxially grown layers. Accordingly, an increased number of nanosheet layers (and thus an increased number of transistors formed therefrom) can be formed in a semiconductor device. Higher performance 3D transistors are obtained with such techniques.

Techniques herein can relate to vertical channel transistors in which a current flow path of a transistor channel is perpendicular or vertical to a working surface of a wafer. Techniques herein include the vertical stacking of a plurality of transistors or transistor pairs.

In some embodiments, a semiconductor device can include a first plurality of nanosheet layers to form a semiconductor-based transistor (e.g., to access a memory state) and a second plurality of nanosheet layers to form a conductive oxide-based transistor (e.g., to store a charge). In some embodiments, additional semiconductor-based transistors and conductive oxide-based transistors can be formed along a vertical structure of a semiconductor device to form additional memory cells or additional bits of a memory cell. In some embodiments, the memory cells can be formed over additional circuits. For example, the vertical structures of the semiconductor device can include a first complementary field effect transistor (CFET) pairs, and a memory device can be formed thereupon. Various operations or components of the various embodiments can be substituted, omitted, added, or modified. For example, transistors types can be varied according to a desired application (e.g., p-type or n-type) for semiconductor or conductive oxide-based transistors.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 2A and 2B illustrate a top view and a cross sectional view of a semiconductor device, respectively, during various fabrication stages, made by the method of FIG. 1, in accordance with some embodiments.

FIGS. 3A and 3B illustrate a top view and a cross sectional view of a semiconductor device, respectively, during various fabrication stages, made by the method of FIG. 1, in accordance with some embodiments.

FIGS. 4A and 4B illustrate a top view and a cross sectional view of a semiconductor device, respectively, during various fabrication stages, made by the method of FIG. 1, in accordance with some embodiments.

FIGS. 5A and 5B illustrate a top view and a cross sectional view of a semiconductor device, respectively, during various fabrication stages, made by the method of FIG. 1, in accordance with some embodiments.

FIGS. 6A and 6B illustrate a top view and a cross sectional view of a semiconductor device, respectively, during various fabrication stages, made by the method of FIG. 1, in accordance with some embodiments.

FIGS. 7A and 7B illustrate a top view and a cross sectional view of a semiconductor device, respectively, during various fabrication stages, made by the method of FIG. 1, in accordance with some embodiments.

FIGS. 8A and 8B illustrate a top view and a cross sectional view of a semiconductor device, respectively, during various fabrication stages, made by the method of FIG. 1, in accordance with some embodiments.

FIGS. 9A and 9B illustrate a top view and a cross sectional view of a semiconductor device, respectively, during various fabrication stages, made by the method of FIG. 1, in accordance with some embodiments.

FIGS. 10A and 10B illustrate a top view and a cross sectional view of a semiconductor device, respectively, during various fabrication stages, made by the method of FIG. 1, in accordance with some embodiments.

FIGS. 11A and 11B illustrate a top view and a cross sectional view of a semiconductor device, respectively, during various fabrication stages, made by the method of FIG. 1, in accordance with some embodiments.

FIGS. 13A and 13B illustrate a top view and a cross sectional view of a semiconductor device, respectively, during various fabrication stages, made by the method of FIG. 1, in accordance with some embodiments.

FIGS. 14A and 14B illustrate a top view and a cross sectional view of a semiconductor device, respectively, during various fabrication stages, made by the method of FIG. 1, in accordance with some embodiments.

FIGS. 15A and 15B illustrate a top view and a cross sectional view of a semiconductor device, respectively, during various fabrication stages, made by the method of FIG. 1, in accordance with some embodiments.

FIGS. 16A and 16B illustrate a top view and a cross sectional view of a semiconductor device, respectively, during various fabrication stages, made by the method of FIG. 1, in accordance with some embodiments.

FIGS. 17A and 17B illustrate a top view and a cross sectional view of a semiconductor device, respectively, during various fabrication stages, made by the method of FIG. 1, in accordance with some embodiments.

FIGS. 18A and 18B illustrate a top view and a cross sectional view of a semiconductor device, respectively, during various fabrication stages, made by the method of FIG. 1, in accordance with some embodiments.

FIGS. 19A and 19B illustrate a top view and a cross sectional view of a semiconductor device, respectively, during various fabrication stages, made by the method of FIG. 1, in accordance with some embodiments.

FIGS. 22A and 22B illustrate a top view and a cross sectional view of a semiconductor device, respectively, during various fabrication stages, made by the method of FIG. 21, in accordance with some embodiments.

FIGS. 23A and 23B illustrate a top view and a cross sectional view of a semiconductor device, respectively, during various fabrication stages, made by the method of FIG. 21, in accordance with some embodiments.

FIGS. 24A and 24B illustrate a top view and a cross sectional view of a semiconductor device, respectively, during various fabrication stages, made by the method of FIG. 21, in accordance with some embodiments.

FIGS. 25A and 25B illustrate a top view and a cross sectional view of a semiconductor device, respectively, during various fabrication stages, made by the method of FIG. 21, in accordance with some embodiments.

FIGS. 27A and 27B illustrate a top view and a cross sectional view of a semiconductor device, respectively, during various fabrication stages, made by the method of FIG. 26, in accordance with some embodiments.

FIGS. 28A and 28B illustrate a top view and a cross sectional view of a semiconductor device, respectively, during various fabrication stages, made by the method of FIG. 26, in accordance with some embodiments.

FIGS. 29A and 29B illustrate a top view and a cross sectional view of a semiconductor device, respectively, during various fabrication stages, made by the method of FIG. 26, in accordance with some embodiments.

FIGS. 30A and 30B illustrate a top view and a cross sectional view of a semiconductor device, respectively, during various fabrication stages, made by the method of FIG. 26, in accordance with some embodiments.

FIGS. 32A and 32B illustrate a top view and a cross sectional view of a semiconductor device, respectively, during various fabrication stages, made by the method of FIG. 26, in accordance with some embodiments.

FIGS. 33A and 33B illustrate a top view and a cross sectional view of a semiconductor device, respectively, during various fabrication stages, made by the method of FIG. 26, in accordance with some embodiments.

FIGS. 34A and 34B illustrate a top view and a cross sectional view of a semiconductor device, respectively, during various fabrication stages, made by the method of FIG. 26, in accordance with some embodiments.

FIGS. 35A and 35B illustrate a top view and a cross sectional view of a semiconductor device, respectively, during various fabrication stages, made by the method of FIG. 26, in accordance with some embodiments.

FIGS. 36A and 36B illustrate a top view and a cross sectional view of a semiconductor device, respectively, during various fabrication stages, made by the method of FIG. 26, in accordance with some embodiments.

FIGS. 37A and 37B illustrate a top view and a cross sectional view of a semiconductor device, respectively, during various fabrication stages, made by the method of FIG. 26, in accordance with some embodiments.

FIGS. 39A and 39B illustrate a top view and a cross sectional view of a semiconductor device, respectively, during various fabrication stages, made by the method of FIG. 38, in accordance with some embodiments.

FIGS. 40A and 40B illustrate a top view and a cross sectional view of a semiconductor device, respectively, during various fabrication stages, made by the method of FIG. 38, in accordance with some embodiments.

FIGS. 41A and 41B illustrate a top view and a cross sectional view of a semiconductor device, respectively, during various fabrication stages, made by the method of FIG. 38, in accordance with some embodiments.

FIGS. 43A and 43B illustrate a top view and a cross sectional view of a semiconductor device, respectively, during various fabrication stages, made by the method of FIG. 42, in accordance with some embodiments.

FIGS. 44A and 44B illustrate a top view and a cross sectional view of a semiconductor device, respectively, during various fabrication stages, made by the method of FIG. 42, in accordance with some embodiments.

FIGS. 45A and 45B illustrate a top view and a cross sectional view of a semiconductor device, respectively, during various fabrication stages, made by the method of FIG. 42, in accordance with some embodiments.

FIGS. 46A and 46B illustrate a top view and a cross sectional view of a semiconductor device, respectively, during various fabrication stages, made by the method of FIG. 42, in accordance with some embodiments.

FIGS. 47A and 47B illustrate a top view and a cross sectional view of a semiconductor device, respectively, during various fabrication stages, made by the method of FIG. 42, in accordance with some embodiments.

FIGS. 48A and 48B illustrate a top view and a cross sectional view of a semiconductor device, respectively, during various fabrication stages, made by the method of FIG. 42, in accordance with some embodiments.

FIGS. 49A and 49B illustrate a top view and a cross sectional view of a semiconductor device, respectively, during various fabrication stages, made by the method of FIG. 42, in accordance with some embodiments.

FIGS. 50A and 50B illustrate a top view and a cross sectional view of a semiconductor device, respectively, during various fabrication stages, made by the method of FIG. 42, in accordance with some embodiments.

FIGS. 53A and 53B illustrate a top view and a cross sectional view of a semiconductor device, respectively, during various fabrication stages, made by the method of FIG. 52, in accordance with some embodiments.

FIGS. 54A and 54B illustrate a top view and a cross sectional view of a semiconductor device, respectively, during various fabrication stages, made by the method of FIG. 52, in accordance with some embodiments.

FIGS. 55A and 55B illustrate a top view and a cross sectional view of a semiconductor device, respectively, during various fabrication stages, made by the method of FIG. 52, in accordance with some embodiments.

FIGS. 56A and 56B illustrate a top view and a cross sectional view of a semiconductor device, respectively, during various fabrication stages, made by the method of FIG. 52, in accordance with some embodiments.

DETAILED DESCRIPTION

Figure 1:
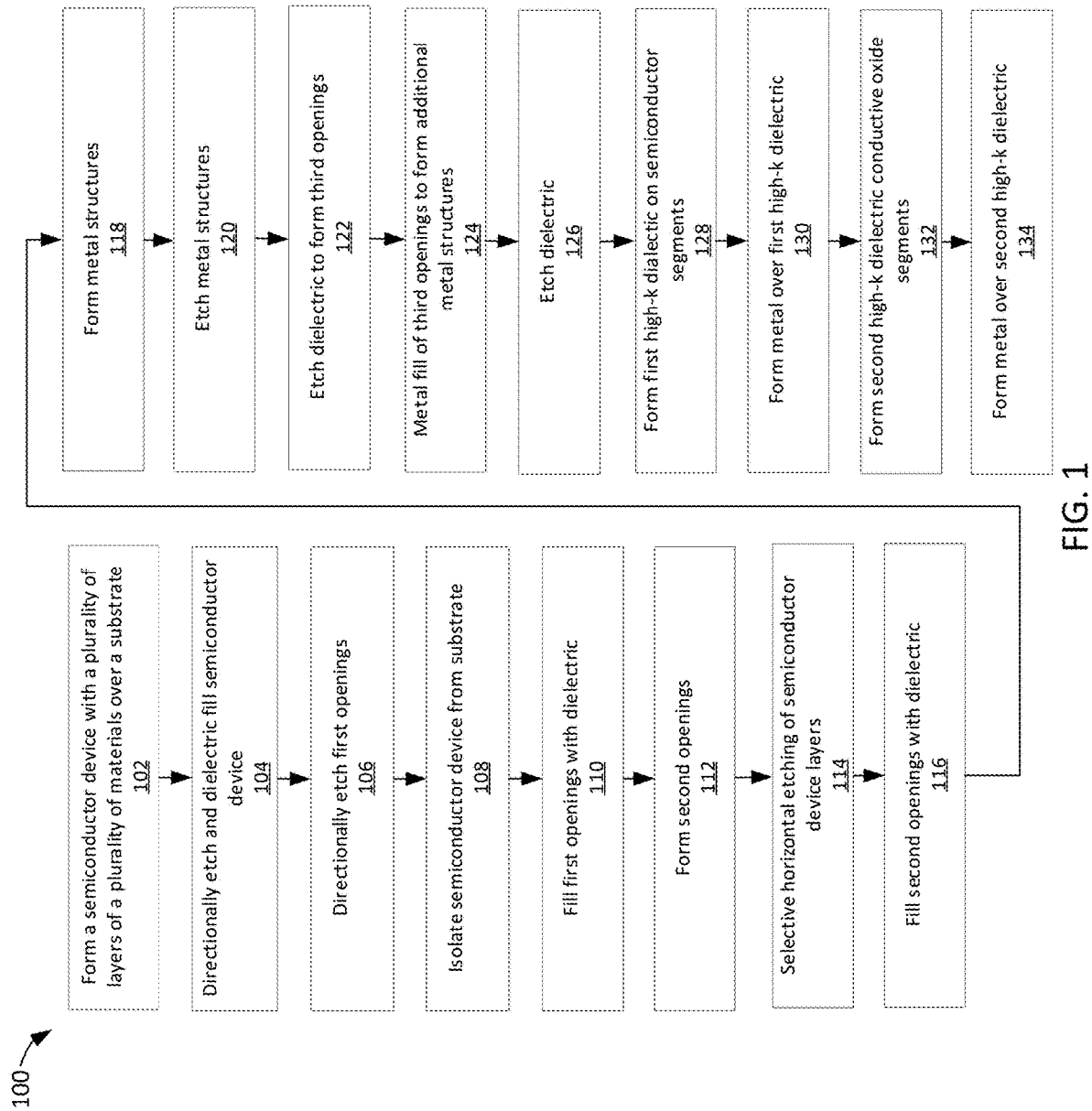
FIG. 1 is a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more vertical transistor structures having one or more conductive oxide or semiconductor nanostructures formed from nanosheets. In some embodiments, conductive oxide nanostructures formed from conductive oxide nanosheets are formed over epitaxially grown semiconductor nanosheets of said vertical transistor structures. Based on such conductive oxide layers, advantageously, the vertical transistor structures, as disclosed herein, may be associated with a low leakage of a charge stored at a gate. In some aspects, any number of the vertical transistor structures can be laterally (e.g., side-by-side) arranged with each other and vertically stacked on top of one another, thereby forming an array of vertical transistor structures having improved characteristics in an area efficient manner. For example, with two different conductive types of the disclosed transistor structure stacked on top of one another, a complementary field-effect-transistor structure can be formed.

Reference will now be made to the figures, which for the convenience of visualizing the 3D fabrication techniques described herein, illustrate a substrate undergoing a process flow in both top and cross-sectional views. Unless expressly indicated otherwise, each figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a rectangular configuration, other shapes are also contemplated, and indeed the techniques described herein may be implemented in any shape or geometry.

FIG. 1 illustrates a flow chart of a method 100 for making a semiconductor memory device (e.g., one or more transistors), based on a vertical stack structure. For example, the vertical stack structure can be formed by a plurality of nanosheets to form a memory device. The vertical stack structure can include two transistors and an electrical connection therebetween. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with top views and cross-sectional views of an example semiconductor device (also referred to herein as a structure) at various fabrication stages as shown in FIGS. 2A to 19A and FIGS. 2B to 19B, respectively, which will be discussed in further detail below. It should be understood that the semiconductor device, shown in FIGS. 2A to 19A and FIGS. 2B to 19B, may include a number of other devices such as inductors, fuses, capacitors, coils, etc., while remaining within the scope of the present disclosure.

In brief overview, the method 100 starts with operation 102 of forming a semiconductor device comprising a plurality of materials formed over a substrate. The method 100 continues to operation 104 of directionally etching a portion of the semiconductor device, and filling the etched portion with a dielectric fill. The method 100 proceeds to operation 106 of directionally etching first openings into the semiconductor device. The method 100 proceeds to operation 108 of isolating a portion of the semiconductor device from the substrate. The method 100 proceeds to operation 110 of filling the first openings with a dielectric fill. The method 100 proceeds to operation 112 of directionally etching second openings into the semiconductor device. The method 100 proceeds to operation 114 of selectively etching horizontal portions of one or more layers of the semiconductor device. The method 100 proceeds to operation 116 wherein the second openings are filled with a dielectric. The method 100 proceeds to operation 118 of forming metal structures (e.g., within the second openings). The method 100 proceeds to operation 120 of etching the metal structures. The method 100 proceeds to operation 122 of directionally etching the semiconductor device to form third openings. At operation 124 of the method 100, the third openings are filled with a conductive material such as a metal. At operation 126 of the method 100, a dielectric is etched. The method 100 proceeds to operation 128 wherein a first high-k dielectric is formed over the silicon. The method 100 proceeds to operation 130 wherein a metal is formed over the first high-k dielectric. At operation 132 of the method 100, a second high-k dielectric is formed over conductive oxide layers of the semiconductor device. At operation 134, metal is formed over the second high-k dielectric.

Corresponding to operation 102 of FIG. 1, FIG. 2A is a top view of a semiconductor device 200 in which a plurality of layers (e.g., blanket layers), including a plurality of materials (e.g., conductive and dielectric materials), are formed over a substrate 202 (e.g., a crystalline silicon, a glass substrate, etc.). FIG. 2B is a corresponding cross-sectional view of the semiconductor device 200, in accordance with various embodiments.

As shown in FIG. 2B, a first layer 204 can be formed over the substrate 202. The first layer 204 and the various additional dielectric and conductive layers and materials herein can be placed, grown, (e.g., epitaxially with or without a seed layer), or otherwise formed to create layers of the semiconductor device 200. The formation of the various layers of the semiconductor device 200 can include planarization of the layers, such as by cutting, ablation, chemical mechanical grinding or polishing (CMG/P), or other planarization techniques. The first layer 204 can be or include a material which can be selectively etched, relative to one or more adjacent materials, such as the substrate 202 and a second layer 206. For example, the first layer 204 can be formed from silicon-germanium of a first molar ratio (e.g., SiGe90), the substrate 202 can be formed from crystalline silicon, and the second layer 206 can be formed from silicon-germanium of a second molar ratio, which is referred to herein referred to as SiGe (e.g., SiGe20). Thus, the first layer 204 can be an epitaxially grown sacrificial nanosheet layer which can be selectively removed without removing one or more adjoining layers.

The second layer 206 is formed over the first layer 204. The second layer 206 can include a different material than the first material. For example, the second layer 206 can be an epitaxially grown SiGe layer, as discussed above. A third layer 208 can be formed over the second layer 206. The third layer 208 can be or include a semiconductor material such as silicon, which may be epitaxially grown over the second layer 206. A fourth layer 210 can be formed (e.g., epitaxially grown) over the third layer 208. The fourth layer 210 can be or include a dielectric or semiconductor which can be selectively etched relative to the semiconductor material of the third layer 208. For example, the fourth layer 210 can be SiGe (e.g., may be the same mole ratio of silicon-germanium as the second layer 206). The fifth layer 212 can be a semiconductor material (e.g., silicon). For example, the fifth layer 212 can be the same semiconductor material as the third layer 208. The fifth layer 212 or the third layer 208 can be formed as a doped semiconductor (e.g., epitaxially grown with a dopant or dopant precursor), or formed and thereafter doped such as by diffusion or ion implantation. The doping can render the semiconductor material as either n-type or p-type. The semiconductor material can form a channel region of a semiconductor-based transistor. For example, each of the third layer 208 and the fifth layer 212 can for channel regions of separate transistors or a same dual-channel (e.g., dual-nanosheet) transistor.

The sixth layer 214 can be or include a dielectric or semiconductor which can be selectively etched relative to the semiconductor material of the fifth layer 212. For example, the sixth layer 214 can be silicon-germanium which may be epitaxially grown over the fifth layer 212 (e.g., may be the same mole ratio of silicon-germanium as the second layer 206 or the fourth layer 210). The seventh layer 216 can be formed over the sixth layer 214. The seventh layer 216 can be or include a conductive material such as a metal or a highly doped semiconductor. For example, the seventh layer 216 can be or include aluminum, copper, titanium, tungsten, or the like. The seventh layer 216 can be formed over a seed layer by a deposition process, such as chemical vapor deposition (CVD) or atomic layer deposition (ALD). In some embodiments, the seventh layer 216 can be planed such as by CMG/P. An eighth layer 218 can be formed over the seventh layer 216. The eighth layer 218 can be or include a dielectric material deposited over the seventh layer 216 by the various deposition processes described herein. A ninth layer 220 of the semiconductor device 200 can be formed (e.g., deposited) over the eighth layer 218. The ninth layer 220 can be or include a dielectric which can be selectively etched relative to the dielectric of the eighth layer 218. A tenth layer 222 of the semiconductor device 200 can be or include a conductive oxide. The conductive oxide can be doped to a same type as the semiconductor material of the third layer 208 and the fifth layer 212, or a different type (e.g., can be an n-type conductive oxide or a p-type conductive oxide). For example, n-type conductive oxide nanosheets can include indium oxide ($In_2O_3$), tin oxide ($SnO_2$), indium gallium zinc oxide (InGaZnO), zinc oxide (ZnO), combinations thereof, and the like. P-type conductive oxide nanosheets can include tin oxide (SnO) or the like. The conductive oxide material can form a channel region of a conductive oxide-based transistor. For example, each of the tenth layer 222 and the twelfth layer 226 can for channel regions of separate transistors or a same dual-channel (e.g., dual-nanosheet) transistor.

The eleventh layer 224 can be formed (e.g., deposited) over the tenth layer 222. An eleventh layer 224 can be or include a dielectric material which can be selectively etched relative to the dielectric of the tenth layer 222 or a twelfth layer 226. For example, the eleventh layer 224 can be or include the same dielectric material as the ninth layer 220. The twelfth layer 226 can be or include a conductive oxide. For example, the conductive oxide of the twelfth layer 226 can be the same as the conductive oxide of the tenth layer 222. An thirteenth layer 228 can be or include a dielectric material which can be selectively etched relative to the dielectric of the twelfth layer 226 or a fourteenth layer 230. For example, the thirteenth layer 228 can be or include the same dielectric material as the ninth layer 220 or the eleventh layer 224. The fourteenth layer 230 can be formed over the thirteenth layer 228 to protect the thirteenth layer 228. For example, the fourteenth layer 230 can be or include a hard mask or other protective layer. In some embodiments, additional or fewer conductive oxide or semiconductor nanosheets can be formed. For example, although the transistors of the various embodiments disclosed herein are disclosed as dual nanosheet transistors (e.g., comprising two nanostructures), transistors may be formed of additional or fewer nanostructures (e.g., single-nanosheet transistors or tri-nanosheet transistors).

Corresponding to operation 104 of FIG. 1, FIG. 3A is a top view of the semiconductor device 200 in which the layers of the respective nanosheets are directionally etched and replaced with a dielectric. FIG. 3B is a corresponding cross-sectional view of the semiconductor device 200, in accordance with various embodiments.

As shown in FIG. 3B, a mask (not depicted) defines a first portion of the semiconductor device 200 for etching, and a second portion of the semiconductor device 200 to remain. The remaining portions of each nanosheet of the semiconductor device 200 can be referred to herein as nanostructures. To etch the first portion, a first patternable layer (e.g., a photoresist material) can be formed over the surface of the semiconductor device 200. The layers of the semiconductor device 200 can be etched to a depth of the substrate 202. For example, the etchant can be timed to etch to the substrate 202, the substrate 202 can be non-reactive with the etchant, or an etch stop layer can be disposed along a surface of the substrate 202. The etching process may be anisotropic and/or isotropic. The photoresist material can be stripped from the semiconductor device 200, and a body dielectric 232 can be formed in an etched area. For example, the body dielectric 232 can be formed by a deposition process (e.g., CVD), or another fill process and any dielectric disposed over or at a higher level than the fourteenth layer 230 (e.g., the hard mask) can be removed by a planarization process such as CMG/P. The etching can leave a vertical structures (e.g., columns or transistor core stacks) of the plurality of nanostructures. For example, a plurality of vertical structures can be formed at regular interval to form a memory device wherein at least one transistor pair are formed from each vertical structures to store at least one bit.

Corresponding to operation 106 of FIG. 1, FIG. 4A is a top view of the semiconductor device 200 in which first openings are formed. FIG. 4B is a corresponding cross-sectional view of the semiconductor device 200, in accordance with various embodiments.

As shown in FIG. 4B, first openings are formed in the semiconductor device 200 by directionally etching the surface of the semiconductor device 200 to the substrate 202. For example, a mask (not depicted) can define the openings, and the openings can thereafter be formed according to a similar operation as operation 104. The openings can be disposed along one or more layers of the semiconductor device 200. The first openings can expose the substrate 202 as viewed from the top of the device (e.g., as depicted in FIG. 4A).

Corresponding to operation 108 of FIG. 1, FIG. 5A is a top view of the semiconductor device 200 in which one or more semiconductor segments of the semiconductor device 200 are isolated from the substrate 202. FIG. 5B is a corresponding cross-sectional view of the semiconductor device 200, in accordance with various embodiments.

As shown in FIG. 5B, a bottommost layer (e.g., the first layer 204) of the semiconductor device 200 is selectively removed. For example, the first layer 204 can be a silicon-germanium material of different mole fraction than the second layer 206 or other layers of the semiconductor device 200. An etchant can be introduced to the semiconductor device 200 via the first openings, and the etchant can thereby access and etch the first layer 204 of the semiconductor device 200. The removal of the first layer 204 can isolate additional layers of the semiconductor device 200 from the substrate 202. For example, the etchant can be stripped from the semiconductor device 200 to form an air gap between the substrate 202 and the second layer 206 of the semiconductor device 200. For example, a body dielectric 232 of the semiconductor device 200 can be visible through the air gap in a cross sectional view such as FIG. 5B.

Corresponding to operation 110 of FIG. 1, FIG. 6A is a top view of the semiconductor device 200 in which the first openings are filled with a dielectric fill material 234. FIG. 6B is a corresponding cross-sectional view of the semiconductor device 200, in accordance with various embodiments.

As shown in FIG. 6B, the first openings are filled with a dielectric fill material 234. For example, the dielectric can fill the first openings (e.g., to an upper surface of the semiconductor device 200), and can fill the air gap between the substrate 202 and the second layer 206 of the semiconductor device 200. The dielectric fill material 234 can be deposited and planarized according to the process described with regard to operation 104. The dielectric fill material 234 can be a same dielectric fill material 234 as the body dielectric 232 or can be a different dielectric material.

Corresponding to operation 112 of FIG. 1, FIG. 7A is a top view of the semiconductor device 200 in which second openings are opened. FIG. 7B is a corresponding cross-sectional view of the semiconductor device 200, in accordance with various embodiments.

As shown in FIG. 7B, second openings are formed extending from the surface of the fourteenth layer 230 of the semiconductor device 200 to the substrate 202. The second openings can be formed by the photoresist processes described with regards to operations 104 or 106, or variations thereof. For example, operation 112 can include a masking sub-operation with a mask that is of a different geometry than the mask for operation 106. A photoresist or other etchant can be stripped to form the second openings. The removal of the etchant from the second openings can expose the substrate 202 as viewed from the top of the device (e.g., as viewed in FIG. 7A). The second openings can define a lateral location of source or drain regions of various transistors of the semiconductor device 200, which can be formed at another operation of the method 100.

Corresponding to operation 114 of FIG. 1, FIG. 8A is a top view of the semiconductor device 200 in which various layers of the semiconductor device 200 are selectively etched. FIG. 8B is a corresponding cross-sectional view of the semiconductor device 200, in accordance with various embodiments.

As shown in FIG. 8B, each of the second layer 206, the fourth layer 210, the sixth layer 214, the ninth layer 220, the eleventh layer 224, and the thirteenth layer 228 of the semiconductor device 200 are recess etched. For example, the etchant can selectively etch SiGe and dielectric layers adjacent to the conductive oxide layers (e.g., can be time or volume controlled to etch a defined lateral distance of the respective layers). In some embodiments, operation 114 can include two or more sub-operations. For example, a first sub-operation can etch the conductive oxide and a second sub-operation can etch the SiGe. In some embodiments, a first sub-operation can etch a layer a first lateral distance, and a second sub-operation can etch the layer a second lateral distance. The recess etching laterally reduces the dimension of the layers of the semiconductor device 200 adjacent to the conductive oxide or semiconductor segment layers (e.g., the second layer 206, fourth layer 210, tenth layer 222 and twelfth layer 226 of the semiconductor device 200). The reduction in lateral dimension can create isolation between the source/drain portions (e.g., source/drain portions laterally defined by the second openings), and additional portions of the semiconductor device 200 (e.g., the gates of the respective transistors).

Corresponding to operation 116 of FIG. 1, FIG. 9A is a top view of the semiconductor device 200 in which the second openings are filled with one or more dielectric materials.

FIG. 9B is a corresponding cross-sectional view of the semiconductor device 200, in accordance with various embodiments.

As shown in FIG. 9B, a first dielectric 240 is formed in the second openings. For example, the second openings can be expanded to a first dimension which is depicted as the dimension of the first dielectric 240 immediately over the substrate 202. The opening dimension can be maintained along the vertical opening of the semiconductor device 200 (e.g., can be formed by directional etching). The first dielectric 240 can be the same dielectric as the eighth layer 218 of the semiconductor device 200. The first dielectric 240 can thereafter be etched to a defined depth, wherein the etchant is stripped to reopen the second openings.

Corresponding to operation 118 of FIG. 1, FIG. 10A is a top view of the semiconductor device 200 in which metal structures 242 are formed along the semiconductor materials for the source-drain contacts. FIG. 10B is a corresponding cross-sectional view of the semiconductor device 200, in accordance with various embodiments.

As shown in FIG. 10B, metal structures 242 (e.g., source/drain electrodes) are formed along the lateral edges of at least the semiconductor segments (e.g., the second layer 206, and fourth layer 210 of the semiconductor device 200). In some embodiments, the metal structures 242 are deposited to fill the first openings and the upper surface of the semiconductor device 200 is thereafter planarized. In some embodiments, the metal structures 242 are selectively grown on the semiconductor segments or the conductive oxides. For example, one or more metal materials (e.g., alloys, coatings, or elements) can be grown along each of the semiconductor segments of the third layer 208 and the fifth layer 212 of the semiconductor device 200, and another metal material can be formed along the conductive oxides disposed on the tenth layer 222 and twelfth layer 226 of the semiconductor device 200.

Corresponding to operation 120 of FIG. 1, FIG. 11A is a top view of the semiconductor device 200 in which the metal structures 242 are etched. FIG. 11B is a corresponding cross-sectional view of the semiconductor device 200, in accordance with various embodiments.

As shown in FIG. 11B, the metal structures 242 are etched to disconnect the metal structures 242 from the conductive material disposed on a seventh layer 216 of the semiconductor device 200. For example, the metal is etched to remove the metal from the top of the semiconductor device 200 other than the semiconductor nanostructures (e.g., n-doped silicon) disposed on the third layer 208 and the fifth layer 212 of the semiconductor device 200. The metal structures 242 can electrically connect to the semiconductor nanostructures (e.g., can form source/drain electrodes for transistors formed from the semiconductor nanostructures).

Figure 12B:
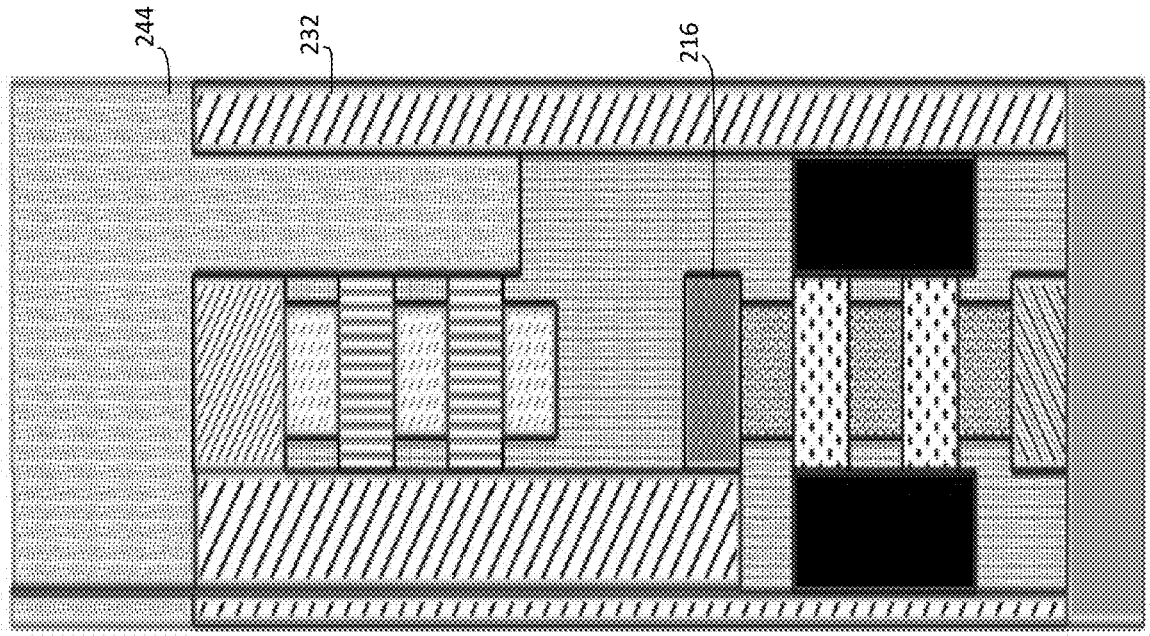
FIGS. 12A and 12B illustrate a top view and a cross sectional view of a semiconductor device, respectively, during various fabrication stages, made by the method of FIG. 1, in accordance with some embodiments.
Figure 12A:
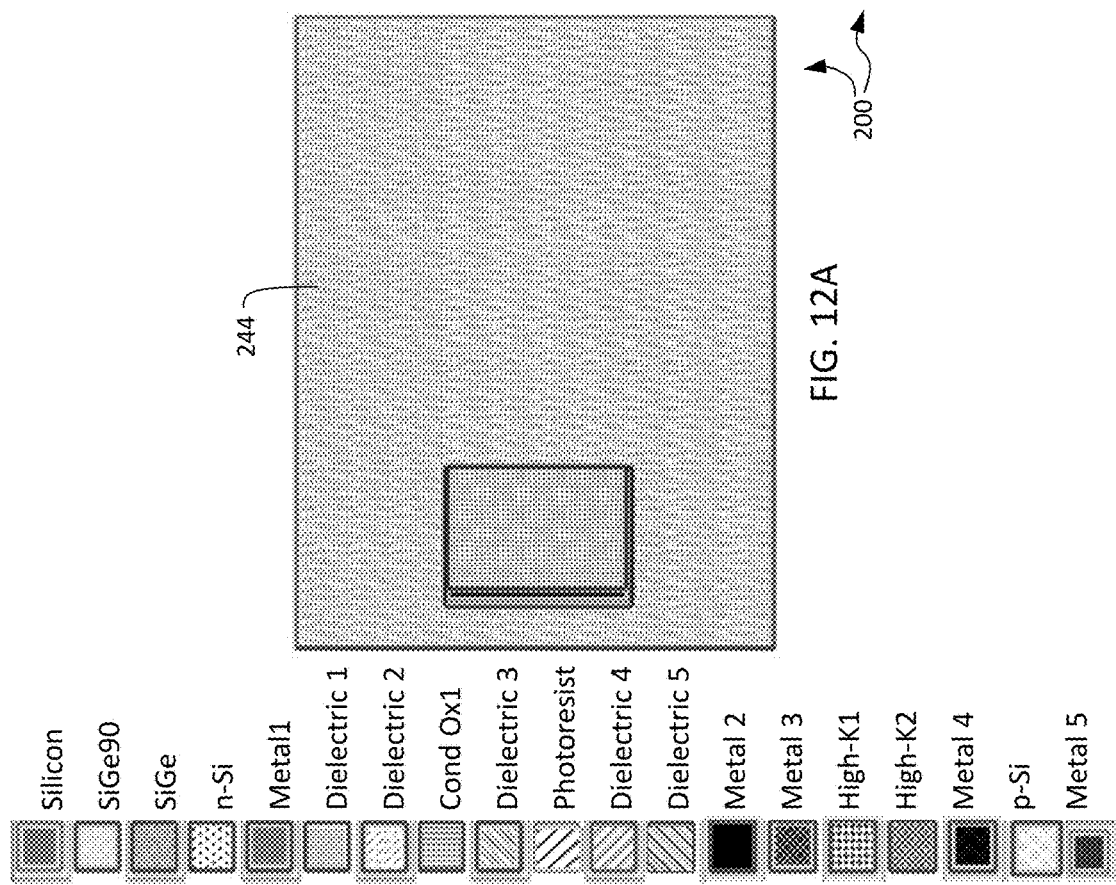

Corresponding to operation 122 of FIG. 1, FIG. 12A is a top view of the semiconductor device 200 in which third openings are formed. FIG. 12B is a corresponding cross-sectional view of the semiconductor device 200, in accordance with various embodiments.

As shown in FIG. 12B, a photoresist 244 is applied to directionally etch the semiconductor device 200 (e.g., the body dielectric 232) with a photoresist 244 to form third openings. The third openings can include a same lateral position as the second openings and be etched to a different depth. For example, the third openings can extend from an upper surface of the semiconductor device 200 to the conductive oxide layers (e.g., the tenth layer 222 and the twelfth layer 226 of the semiconductor device). In some embodiments, one or more of the third openings can extend to the seventh layer 216 of the semiconductor device 200. For example, the third openings can be configured to extend between the seventh layer 216 to one or more conductive oxide layers (e.g., to form an electrical connection therebetween in a subsequent operation).

Corresponding to operation 124 of FIG. 1, FIG. 13A is a top view of the semiconductor device 200 in which metal structures 242 are formed in the third openings along the conductive oxides for the electrodes thereof. FIG. 13B is a corresponding cross-sectional view of the semiconductor device 200, in accordance with various embodiments.

As shown in FIG. 13B, the photoresist is stripped and a conductive material (e.g., a metal) is inserted into the third openings to form metal structures 242. For example, the conductive material can connect to the conductive oxides disposed along the tenth layer 222 and the twelfth layer 226 of the semiconductor device 200, or to the seventh layer 216 of the semiconductor device 200 (e.g., to electrically connect a gate electrode of a lower transistor with a conductive via structure).

Corresponding to operation 126 and 128 of FIG. 1, FIG. 14A is a top view of the semiconductor device 200 in which a plurality of layers of the semiconductor device 200 are etched, and a first high-k dielectric 248 is formed on the semiconductor segments. FIG. 14B is a corresponding cross-sectional view of the semiconductor device 200, in accordance with various embodiments.

As shown in FIG. 14B, at the dielectric fill material 234 can be etched from an upper surface of the semiconductor device 200 to a first layer 204 of the semiconductor device 200 at operation 126. The removal of the dielectric fill material 234 can form voids for the formation of a gate surrounding the semiconductor nanostructures. For example, a GAA transistor can be formed from the semiconductor nanostructures and the various additional semiconductor device 200 elements disclosed herein.

With continued reference to FIG. 14B, at operation 128, a first high-k dielectric 248 is deposited over the semiconductor nanostructures of the third layer 208 and the fifth layer 212 of the semiconductor device 200. For example, the first high-k dielectric 248 can be deposited into openings formed by the removal of the dielectric fill material 234 at operation 126, and can be deposited by a CVD process. The first high-k dielectric 248 formed over the surface of the semiconductor nanostructures (e.g., the silicon segments) can be a gate dielectric for a silicon based transistor wherein the metal structures 242 connected to the silicon comprise source and drain electrodes.

With continued correspondence to operations 126 and 128 of FIG. 1, FIGS. 15A and 15B depict the same semiconductor device 200 as FIGS. 14A and 14B, wherein the semiconductor device 200 is rotated 90°. As shown in FIG. 15B, the dielectric fill material 234 is etched from the top of the semiconductor device 200, leaving a remaining dielectric portion at a first layer 204 of the semiconductor device 200. The first high-k dielectric 248 is as disposed over the semiconductor nanostructures.

Corresponding to operation 130 and 132 of FIG. 1, FIG. 16A is a top view of the semiconductor device 200 in which a metal is selectively deposited over the first high-k dielectric 248 deposited at operation 130, to form a first gate electrode 250 and a second high-k dielectric 252 is formed on the conductive oxide nanostructures of the semiconductor device 200 at operation 132. FIG. 16B is a corresponding cross-sectional view of the semiconductor device 200, in accordance with various embodiments.

As shown in FIG. 16B, at operation 130, metal is deposited over the first high-k dielectric 248 deposited at operation 128. The metal can be deposited by various selective deposition processes, such as an area selective or material selective deposition process (e.g., selective adherence to the first high-k dielectric 248). The metal can form a first gate electrode 250 for a first transistor, which may also be referred to herein as a lower transistor, a semiconductor transistor, or a silicon transistor. The first gate electrode 250 can connect to the conductive material of the seventh layer 216. For example, the first gate electrode 250 can be or include a same conductive material (e.g., a same metal) as the seventh layer 216 of the semiconductor device 200 whereby the first gate electrode 250 of the silicon transistor can connect to drain or source of a second transistor (which may also be referred to herein as a conductive oxide transistor or an upper transistor). Indeed, various connections can be formed between the upper and lower transistors by connecting either of the metal structures 242 comprising the source or drain electrodes of the various transistors described herein, or the gate electrodes of the various transistors.

With continued reference to FIG. 16B, at operation 132, a second high-k dielectric 252 can be formed over the conductive oxide nanostructures disposed along the tenth layer 222 and the twelfth layer 226 of the semiconductor device 200. The second high-k dielectric 252 can be a different high-k dielectric from the first high-k dielectric 248 deposited over the semiconductor segments. For example, the second high-k dielectric 252 can be configured to selectively adhere to the conductive oxide nanostructures of the tenth layer 222 and the twelfth layer 226 of the semiconductor device 200. The second high-k dielectric 252 can be a gate dielectric for a conductive oxide-based transistor.

With continued correspondence to operations 130 and 132 of FIG. 1, FIG. 17A is a top view of the semiconductor device 200 in which a metal is selectively deposited over the first high-k dielectric 248 deposited at operation 128, and a second high-k dielectric 252 is formed on the conductive oxide nanostructures of the semiconductor device 200. FIG. 17B is a corresponding cross-sectional view of the semiconductor device 200, in accordance with various embodiments. Indeed, FIGS. 17A and 17B depict the same semiconductor device 200 as FIGS. 16A and 16B, wherein the semiconductor device 200 is rotated 90° to better illustrate certain features of the semiconductor device 200.

As shown in FIG. 17B, the first gate electrode 250 material is deposited over the first high-k dielectric 248 to form a gate structure surrounding the first high-k dielectric 248 (e.g., the gate dielectric). The first gate electrode 250 surrounds or substantially surrounds the dielectric to form a gate all around (GAA) structure. For example, the metal can be the same metal used in the seventh layer 216 of the semiconductor device 200, and the deposited metal can connect thereto (e.g., thermally, electrically, or mechanically). Also shown is the second high-k dielectric 252 deposited along the conductive oxide layers, as described with reference to FIG. 16B.

Corresponding to operation 134 of FIG. 1, FIG. 18A is a top view of the semiconductor device 200 in which a metal is deposited over the second high-k dielectric 252 deposited at operation 132. FIG. 18B is a corresponding cross-sectional view of the semiconductor device 200, in accordance with various embodiments.

As shown in FIG. 18B, a second gate electrode 254 material is deposited over the second high-k dielectric 252 to form a gate structure surrounding the second high-k dielectric 252 (e.g., the gate dielectric). The second gate electrode 254 surrounds or substantially surrounds the dielectric to form a GAA structure. The second gate electrode 254 can be formed from the same conductive material used to form the first gate electrode 250, or can be a different material (e.g., a different metal). For example, the second gate electrode 254 can be selected according to a second high-k dielectric 252 (e.g., can be selectively deposited over the second high-k dielectric 252).

With continued correspondence to operation 134 of FIG. 1, FIG. 19A is a top view of the semiconductor device 200 in which a metal is selectively deposited over the second high-k dielectric 252 deposited at operation 132. FIG. 19B is a corresponding cross-sectional view of the semiconductor device 200, in accordance with various embodiments. FIGS. 19A and 19B depict the same semiconductor device 200 as FIGS. 18A and 18B, wherein the semiconductor device 200 is rotated 90°. As shown in FIG. 19B, the second gate electrode 254 can be formed over the second high-k dielectric 252 to form a gate electrode of a conductive oxide transistor.

Figure 20:
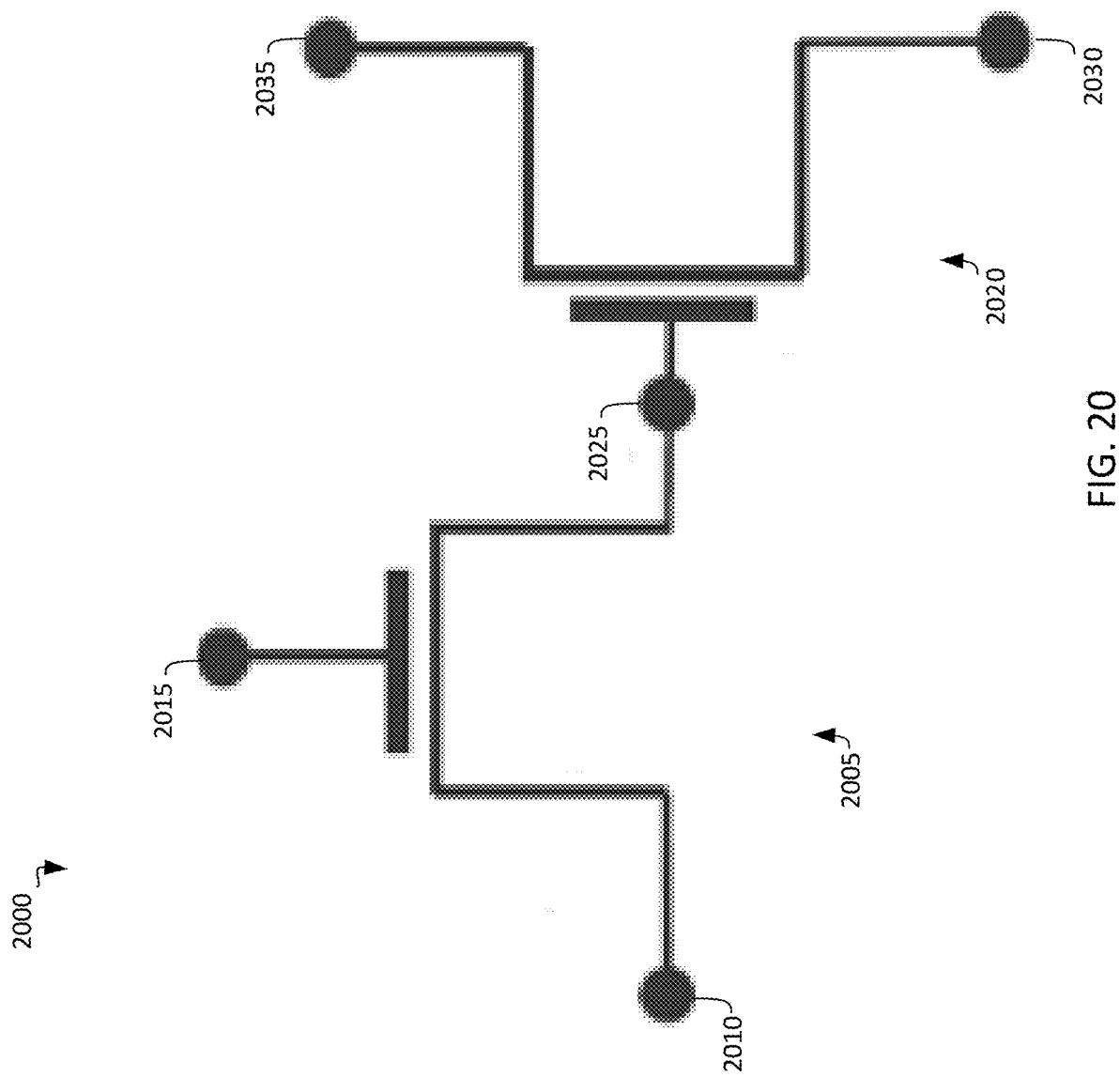
FIG. 20 is a circuit diagram of a memory cell, in accordance with some embodiments.

FIG. 20 is circuit diagram of a memory cell 2000, in accordance with some embodiments. The memory cell 2000 can be or include the transistors formed by the method 100 of FIG. 1 (e.g., an embodiments wherein the gate structure of the upper transistor is connected to the source/drain of the lower transistor). A select transistor 2005 can include semiconductor nanostructures (e.g., silicon) having conductive elements connected thereto, and a gate electrode connected to a dielectric material surrounding the semiconductor segments at a word write line 2015. The memory cell 2000 can include a write bit line 2010 connected to the source/drain of the select transistor 2005, and a drain/source of the select transistor 2005 can be connected to the gate of a read transistor 2020 at the storage node 2025 of the memory cell 2000. The storage node 2025 can store a plurality of electric charges denoting at least two logical states (e.g., a one bit cell can store a logical '0' or a logical '1'). Some memory cells 2000 can store additional logical states. For example, some memory cells 2000 can store multiple bits per storage node 2025 or include multiple storage nodes (e.g., multiple transistor pairs).

The read transistor 2020 can be the conductive oxide transistor. The conductive oxide transistor can exhibit a relatively low leakage current such that a refresh rate of memory cell 2000 can be relatively low (e.g., wherein the memory cell 2000 is a DRAM memory). The read transistor 2020 can include a read bit line 2035 and a read word line 2030 along a source and drain. Various memory cells 2000 can include p-type or n-type semiconductor segments and conductive oxide materials such that the various nodes of the memory cells 2000 can have various voltages and polarities applied thereto to effect reads, writes, refreshes, and other operations.

Figure 21:
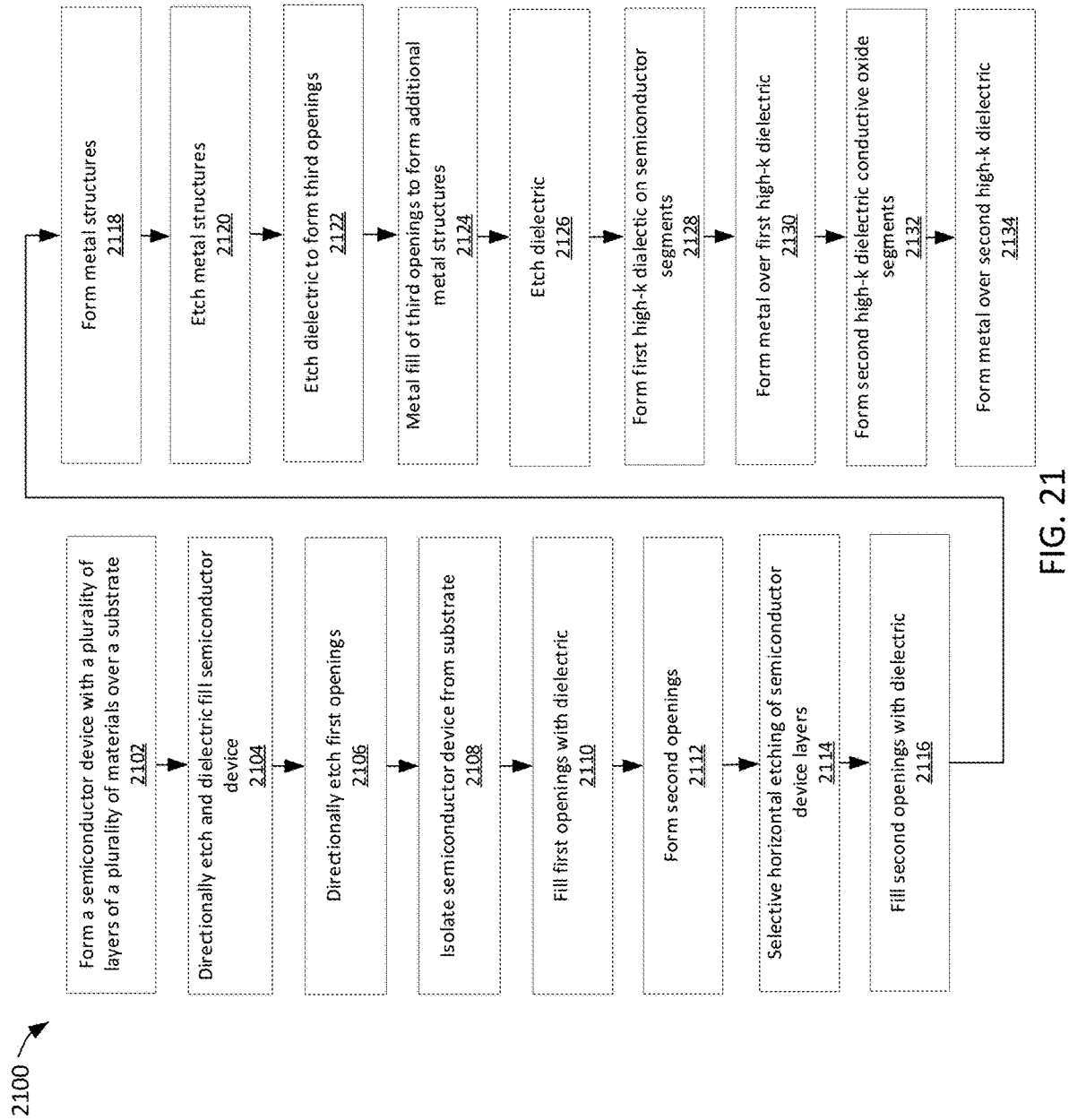
FIG. 21 is a flow chart of a method for making a semiconductor device, in accordance with some embodiments.

FIG. 21 illustrates a flow chart of an example method 2100 for making a semiconductor memory device (e.g., one or more transistors), based on a vertical stack structure. For example, the vertical stack structure can be formed by a plurality of nanosheets to form a memory device. The vertical stack structure can include two transistors, without an electrical connection therebetween. In some embodiments, the two transistors can be connected by an additional operation, such as along a surface of the semiconductor device 200. In some embodiments, respective transistors can be disconnected (e.g., can be independently operated in separate circuits). It is noted that the method 2100 is merely an example, and is not intended to limit the present disclosure. Accordingly, it is understood that additional operations may be provided before, during, and after the method 2100 of FIG. 21, and that some other operations may only be briefly described herein.

In various embodiments, operations of the method 2100 may be associated with top views and cross-sectional views of an example semiconductor device 200 at various fabrication stages as shown in FIGS. 22A to 25A and FIGS. 22B to 25B, respectively, which will be discussed in further detail below. It should be understood that the semiconductor device 200, shown in FIGS. 22A to 25A and FIGS. 22B to 25B, may include a number of other devices such as inductors, fuses, capacitors, coils, etc., while remaining within the scope of the present disclosure.

In brief overview, the method 2100 starts with operation 2102 of forming a semiconductor device comprising a plurality of materials formed over a substrate. The method 2100 continues to operation 2104 of directionally etching a portion of the semiconductor device, and filling the etched portion with a dielectric fill. The method 2100 proceeds to operation 2106 of directionally etching first openings into the semiconductor device. The method 2100 proceeds to operation 2108 of isolating a portion of the semiconductor device from the substrate. The method 2100 proceeds to operation 2110 of filling the first openings with a dielectric fill. The method 2100 proceeds to operation 2112 of directionally etching second openings into the semiconductor device. The method 2100 proceeds to operation 2114 of selectively etching horizontal portions of one or more layers of the semiconductor device. The method 2100 proceeds to operation 2116 wherein the second openings are filled with a dielectric. The method 2100 proceeds to operation 2118 of forming metal structures (e.g., within the second openings). The method 2100 proceeds to operation 2120 of etching the metal structures. The method 2100 proceeds to operation 2122 of directionally etching the semiconductor device to form third openings. At operation 2124 of the method 2100, the third openings are filled with a conductive material such as metal. At operation 2126 of the method 2100, a dielectric is etched. The method 2100 proceeds to operation 2128 wherein a first high-k dielectric is formed over the silicon. The method 2100 proceeds to operation 2130 wherein a metal is formed over the first high-k dielectric. At operation 2132 of the method 2100, a second high-k dielectric is formed over conductive oxide layers of the semiconductor device. At operation 2134, metal is formed over the second high-k dielectric.

Corresponding to operation 2102 of FIG. 21, FIG. 22A is a top view of the semiconductor device 200 in which a plurality of layers are formed of a plurality of materials (e.g., conductive and dielectric materials). FIG. 22B is a corresponding cross-sectional view of the semiconductor device 200, in accordance with various embodiments.

As shown in FIG. 22B, a plurality of layers (e.g., blanket layers) are formed over the substrate 202. A portion of the plurality of layers may be similar to the layers depicted and described with reference to FIGS. 2A and 2B. Some layers can be substituted, omitted, or added. For example, the conductive (e.g., metal) eighth layer 218 can be omitted. The electrical connections formed therefrom can be formed from other connections (e.g., on other layers of the semiconductor device 200, such as an upper surface of the semiconductor device 200) or can be omitted.

Various operations depicted in FIG. 21 may be similar to other operations depicted in this disclosure. For example, in various embodiments, the operations 2104, 2106, 2108, 2110, 2112, 2114, 2116, 2118, 2120, 2122, 2126, 2128, and 2132 may be performed in a fashion as has previously been discussed with regards to operations 104, 106, 108, 110, 112, 114, 116, 118, 120, 122, 126, 128, and 132 as depicted in FIG. 1. The operations can be adjusted based on the layers formed in operation 2102. For example, at operation 2112, the vertical portion of the interconnect structure can be joined to the conductive structure deposited in the semiconductor device 200, and the sub-operation of horizontally etching the dielectric layer can be omitted.

Corresponding to operation 2124 of FIG. 21, FIG. 23A is a top view of the semiconductor device 200 in which metal structures 242 are formed in the third openings along the conductive oxides for the electrodes thereof. FIG. 23B is a corresponding cross-sectional view of the semiconductor device 200, in accordance with various embodiments.

As shown in FIG. 23B, the third openings are filled with a conductive material such as a metal. The third openings can be formed or filled to a depth which is less than the depth of operation 122 (e.g., to a depth that does not reach the eighth layer 218 of the semiconductor device 200). For example, the third openings can connect to the lateral edges of the conductive oxide materials disposed to form metal structures 242 (e.g., source and drain electrodes). The upper portion of the metal structures 242 can be similar to the metal structures 242 of operation 122. The lower portion of the metal structures 242 can be omitted (e.g., because no seventh layer 216 is present to connect to). In some embodiments, another connection or another connection geometry can connect the two or more transistors of the semiconductor device 200.

Corresponding to operation 2130 and 2134 of FIG. 21, FIG. 24A is a top view of the semiconductor device 200 in which a first gate electrode 250 and a second gate electrode 254 are formed over respective first high-k dielectric 248 and second high-k dielectric 252. FIG. 24B is a corresponding cross-sectional view of the semiconductor device 200, in accordance with various embodiments.

As shown in FIG. 24B, the gate electrodes of the upper and lower transistor are deposited by a fill process. For example, a deposit fill process can fill a lateral dimension of the semiconductor device 200. In some embodiments, the first gate electrodes 250 and second gate electrodes 254 can be formed by various processes or combinations thereof. For example, a selective deposition process such as an ALD process over a seed layer can be performed for a first transistor, and a fill (e.g., pour) process can be performed for a second transistor. FIGS. 25A and 25B depict another top view and another side view of the same semiconductor device 200 as FIGS. 24A and 24B.

Figure 26:
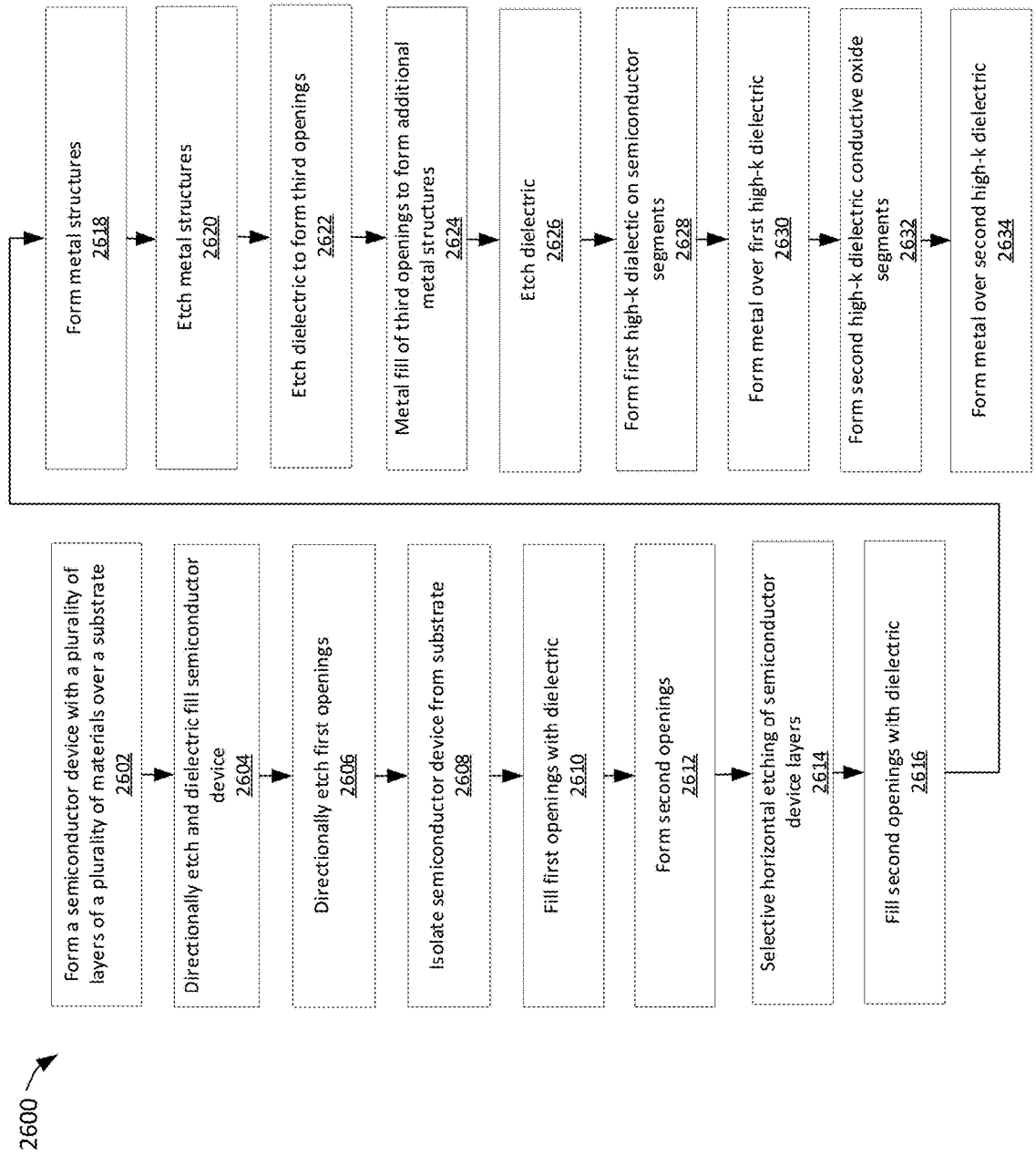
FIG. 26 is a flow chart of a method for making a semiconductor device, in accordance with some embodiments.

FIG. 26 is a flow chart of an example method 2600 for making a semiconductor memory device (e.g., one or more transistors), based on a vertical stack structure. For example, the vertical stack structure can be formed by a plurality of nanosheets to form a memory device. The vertical stack structure can include two or more pairs of transistors (e.g., n paired sets of silicon and conductive oxide transistors to form memory cells having n bits.). In some embodiments, the transistors can be connected by an additional operation, such as along a surface of the semiconductor device 200, or based on one or more conductive layers (e.g., similar to the conductive seventh layer 216 of FIG. 2B). It is noted that the method 2600 is merely an example, and is not intended to limit the present disclosure. Accordingly, it is understood that additional operations may be provided before, during, and after the method 2600 of FIG. 26, and that some other operations may only be briefly described herein.

In various embodiments, operations of the method 2600 may be associated with top views and cross-sectional views of an example semiconductor device 200 at various fabrication stages as shown in FIGS. 27A to 37A and FIGS. 27B to 37B, respectively, which will be discussed in further detail below. It should be understood that the semiconductor device 200, shown in FIGS. 27A to 37A and FIGS. 27B to 37B, may include a number of other devices such as inductors, fuses, capacitors, coils, etc., while remaining within the scope of the present disclosure.

In brief overview, the method 2600 starts with operation 2602 of forming a semiconductor device comprising a plurality of materials formed over a substrate. The method 2600 continues to operation 2604 of directionally etching a portion of the semiconductor device, and filling the etched portion with a dielectric fill. The method 2600 proceeds to operation 2606 of directionally etching first openings into the semiconductor device. The method 2600 proceeds to operation 2608 of isolating a portion of the semiconductor device from the substrate. The method 2600 proceeds to operation 2610 of filling the first openings with a dielectric fill. The method 2600 proceeds to operation 2612 of directionally etching second openings into the semiconductor device. The method 2600 proceeds to operation 2614 of selectively etching horizontal portions of one or more layers of the semiconductor device. The method 2600 proceeds to operation 2616 wherein the second openings are filled with a dielectric. The method 2600 proceeds to operation 2618 of forming metal structures (e.g., within the second openings). The method 2600 proceeds to operation 2620 of etching the metal structures. The method 2600 proceeds to operation 2622 of directionally etching the semiconductor device to form third openings. At operation 2624 of the method 2600, the third openings are filled with a conductive material such as a metal. At operation 2626 of the method 2600, a dielectric is etched. The method 2600 proceeds to operation 2628 wherein a first high-k dielectric is formed over the silicon. The method 2600 proceeds to operation 2630 wherein a metal is formed over the first high-k dielectric. At operation 2632 of the method 2600, a second high-k dielectric is formed over conductive oxide layers of the semiconductor device. At operation 2634, metal is formed over the second high-k dielectric.

Corresponding to operation 2602 of FIG. 26, FIG. 27A is a top view of the semiconductor device 200 in which a plurality of layers are formed of a plurality of materials (e.g., conductive and dielectric materials). FIG. 27B is a corresponding cross-sectional view of the semiconductor device 200, in accordance with various embodiments.

As shown in FIG. 27B, additional nanosheet layers are formed to construct additional transistor devices, relative to the operations described with respect to FIG. 21. Particularly, a first additional layer 2704, a second additional later 2706, a third additional layer 2708, a fourth additional layer 2710, a fifth additional layer 2712, a sixth additional layer 2714, and an eighth additional layer 2718 are formed over the sixth layer 214 of the semiconductor device 200. The aforementioned additional layers can be similar or identical to the second layer 206 through the sixth layer 214 of the semiconductor device 200. For example, the additional layers can form a second semiconductor-based (e.g., silicon-based) transistor disposed vertically over the first transistor. In some embodiments, the additional layers can be formed according to similar methods (e.g., can be epitaxially grown).

A ninth additional layer 2720, a tenth additional layer 2722, an eleventh additional layer 2724, a twelfth additional layer 2726, and a thirteenth additional 2728 layer are formed over the eighth additional layer 2718. The aforementioned additional layers can be similar or identical to the eighth layer 218 through the thirteenth layer 228 of the of the semiconductor device 200. For example, the additional layers can form a second conductive oxide-based transistor disposed vertically under the second transistor. In some embodiments, the additional layers can be formed according to similar methods (e.g., can be deposited in alternating nanosheet layers). In some embodiments, additional, fewer, or different layers can be included in the semiconductor device 200. For example, conductive layers can be included to interconnect the various disclosed layers and transistors formed therefrom.

Various operations depicted in FIG. 26 may be similar to other operations depicted in this disclosure. For example, in various embodiments, the operations 2604, 2606, 2610, 2612, 2614, 2620, 2622, and 2626 may be performed in a fashion as has previously been discussed with regards to operations 104, 106, 110, 112, 114, 120, 122, and 126, as depicted in FIG. 1. The operations can be adjusted based on the additional vertically stacked transistors. For example, at the transistors can be interconnected or connected to additional elements of the semiconductor device 200.

Corresponding to operation 2608 of FIG. 26, FIG. 28A is a top view of the semiconductor device 200 in which a plurality of nanostructures are etched to isolate portions of the semiconductor device 200 from the substrate 202, or other nanostructures of the semiconductor device 200. FIG. 28B is a corresponding cross-sectional view of the semiconductor device 200, in accordance with various embodiments.

As shown in FIG. 28B, a bottommost layer of the semiconductor device 200, which is associated with a first transistor, (e.g., the first layer 204), and a bottommost additional layer (e.g., the first additional layer 2704), which is associated with another transistor is selectively removed. The first layer 204 or the first additional layer 2704 can be a silicon-germanium material of different mole fraction than the second layer 206 or other layers of the semiconductor device 200. An etchant can be introduced to the semiconductor device 200 via the first openings, and the etchant can thereby access and etch the first layer 204 of the semiconductor device 200. The removal of the first layer 204 can isolate additional layers of the semiconductor device 200 from the substrate 202. The removal of the first additional layer 2704 can isolate the two semiconductor-based transistors from each other. For example, the etchant can be stripped from the semiconductor device 200 to form an air gap between the substrate 202 and the second layer 206 of the semiconductor device 200, and between the first additional layer 2704 and the second additional layer 2706 of the semiconductor device 200.

Corresponding to operation 2616 of FIG. 26, FIG. 29A is a top view of the semiconductor device 200 in which second openings are filled with one or more dielectric materials. FIG. 29B is a corresponding cross-sectional view of the semiconductor device 200, in accordance with various embodiments.

As shown in FIG. 29B, a first dielectric 240 is formed in the second openings. For example, the second openings can be expanded to a first dimension which is depicted as the dimension of the first dielectric 240 immediately over the substrate 202. The opening dimension can be maintained along the vertical opening of the semiconductor device 200. The first dielectric 240 can be the same dielectric as the eighth layer 218 or the eighth additional layer 2718 of the semiconductor device 200. The first dielectric 240 can thereafter be etched to a defined depth, wherein the etchant is stripped to reopen the second openings.

Corresponding to operation 2618 of FIG. 26, FIG. 30A is a top view of the semiconductor device 200 in which metal structures 242 are formed along the semiconductor materials for the source-drain contacts. FIG. 30B is a corresponding cross-sectional view of the semiconductor device 200, in accordance with various embodiments.

As shown in FIG. 30B, metal structures 242 (e.g., source/drain electrodes) are formed along the lateral edges of at least the semiconductor segments of the first transistor (e.g., the second layer 206, and fourth layer 210 of the semiconductor device 200). In some embodiments, the metal structures 242 are deposited to fill the first openings and the upper surface of the semiconductor device 200 is thereafter planarized. In some embodiments, dielectric fills and metal structures 242 are formed alternatively, along the various transistors of the vertical device. In some embodiments, the metal structures 242 are selectively grown on the semiconductor nanostructures or the conductive oxide nanostructures. For example, one or more metal materials (e.g., alloys, coatings, or elements) can be grown along each of the semiconductor segments of the third layer 208, the fifth layer 212, the third additional layer 2708, and the fifth additional layer 2712 of the semiconductor device 200, and further metal structures 242 can be formed along the conductive oxides disposed on the tenth layer 222, twelfth layer 226, tenth additional layer 2722, and twelfth additional layer 2726 of the semiconductor device 200.

Figure 31B:
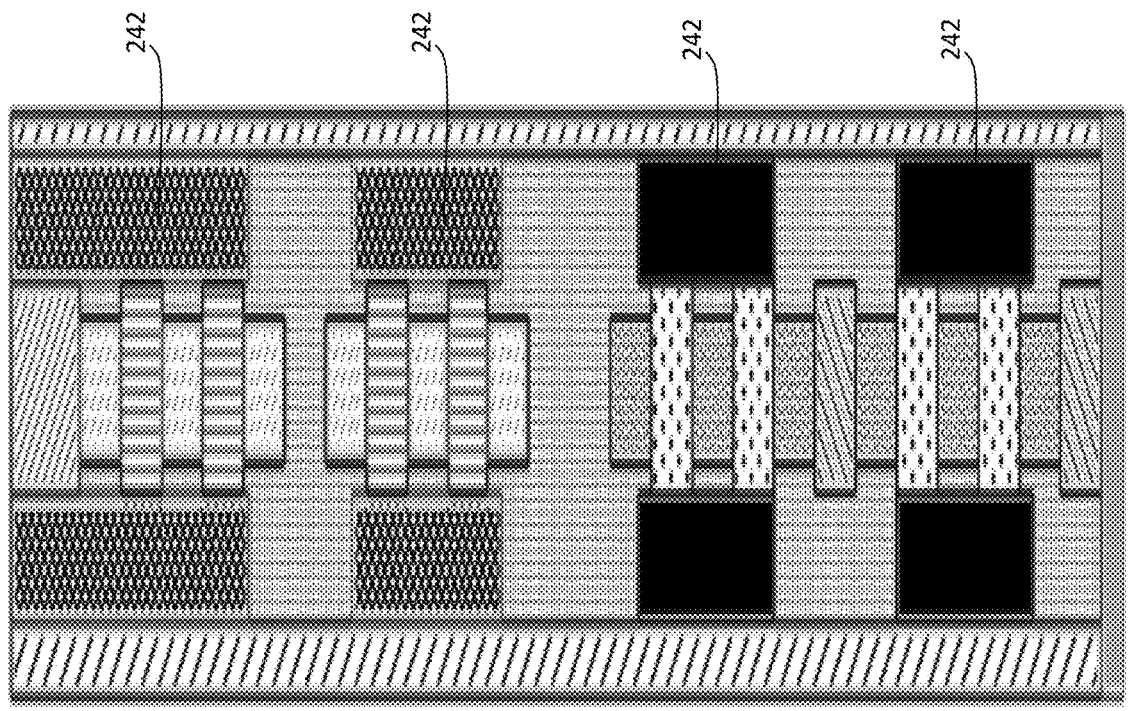
FIGS. 31A and 31B illustrate a top view and a cross sectional view of a semiconductor device, respectively, during various fabrication stages, made by the method of FIG. 26, in accordance with some embodiments.
Figure 31A:
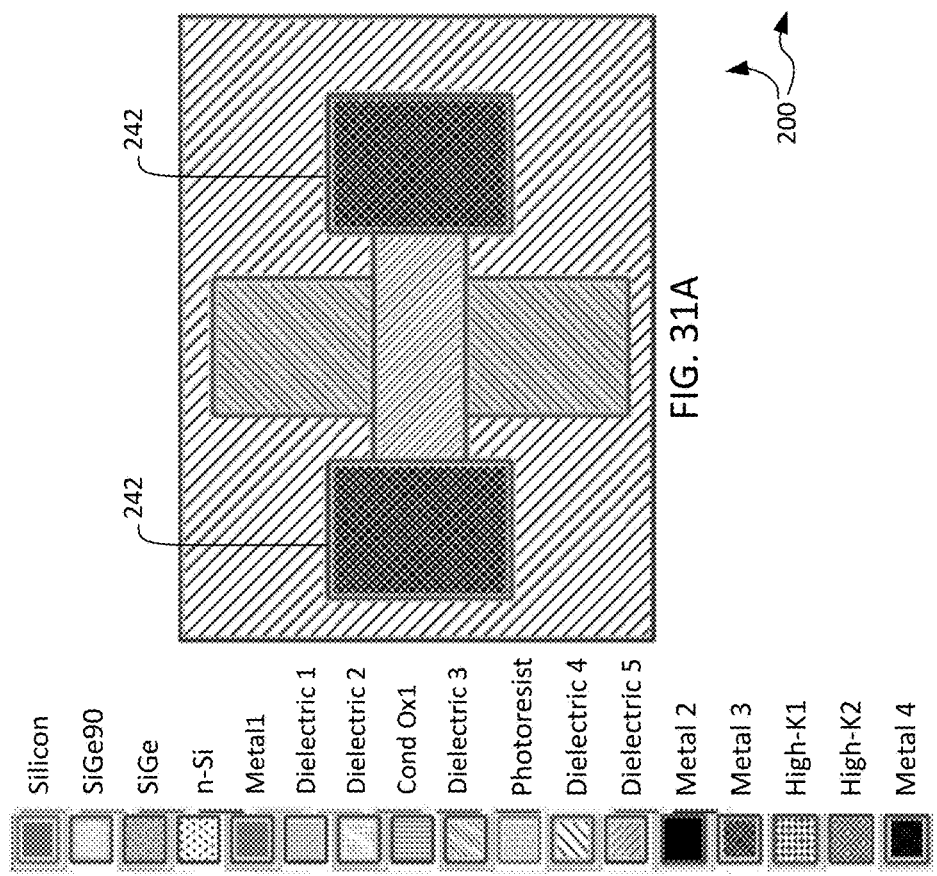

Corresponding to operation 2624 of FIG. 26, FIG. 31A is a top view of the semiconductor device 200 in which metal structures 242 are formed along the semiconductor materials for the source-drain contacts. FIG. 30B is a corresponding cross-sectional view of the semiconductor device 200, in accordance with various embodiments.

As shown in FIG. 31B, additional metal structures 242 are formed for source and drain electrodes for the various transistors of the semiconductor device 200. The metal structures 242 can be formed from one or more materials or processes such as a fill of the third openings. A material for metal structures 242 disposed along the conductive oxide material can be selected according to an interface therewith, and a material for metal structures 242 disposed along the semiconductor segments can be selected according to an interface therewith.

Corresponding to operation 2628 of FIG. 26, FIG. 32A is a top view of the semiconductor device 200 in which a first high-k dielectric 248 is deposited over one or more semiconductor segments. FIG. 32B is a corresponding cross-sectional view of the semiconductor device 200, in accordance with various embodiments.

As shown in FIG. 32B, a first high-k dielectric 248 is deposited over the semiconductor segments of the third layer 208, the fifth layer 212, the third additional layer 2708, and the fifth additional layer 2712 of the semiconductor device 200. For example, the first high-k dielectric 248 can be deposited by into openings formed by the removal of the dielectric fill material 234 at operation 2626, and can be deposited by a CVD process. The first high-k dielectric 248 formed over the surface of the semiconductor segments (e.g., the silicon segments) can be a gate dielectric for a silicon based transistor wherein the metal structures 242 connected to the silicon comprise source and drain electrodes. FIGS. 33A and 33B depict the same semiconductor device 200 as FIGS. 32A and 32B, wherein the semiconductor device 200 is rotated 90° to better illustrate certain features of the semiconductor device 200.

Corresponding to operation 2630 and 2632 of FIG. 26, FIG. 34A is a top view of the semiconductor device 200 in which a metal is selectively deposited over the first high-k dielectric 248 deposited at operation 2630, and a second high-k dielectric 252 is formed on the conductive oxide nanostructures of the semiconductor device 200 at operation 2632. FIG. 34B is a corresponding cross-sectional view of the semiconductor device 200, in accordance with various embodiments.

As shown in FIG. 34B, at operation 2630, metal is deposited over the first high-k dielectric 248 deposited at operation 2628. The metal can be deposited by various selective deposition processes, such as an area selective or material selective deposition process (e.g., selective adherence to the first high-k dielectric 248). The metal can form a first gate electrode 250 (e.g., gate structure) for the lower two depicted transistors which may also be referred to herein as semiconductor transistors, or silicon transistors. At operation 132, a second high-k dielectric 252 is formed over the conductive oxide nanostructures disposed along the tenth layer 222, the twelfth layer 226, the tenth additional layer 2722, and the twelfth additional layer 2726 of the semiconductor device 200. The second high-k dielectric 252 can be a different high-k dielectric as the first high-k dielectric 248 deposited over the semiconductor segments. For example, the second high-k dielectric 252 can be configured to selectively adhere to the conductive oxide nanostructures. The second high-k dielectric 252 can be a gate dielectric for a conductive oxide-based transistor. FIGS. 35A and 35B depict the same semiconductor device 200 as FIGS. 34A and 34B, wherein the semiconductor device 200 is rotated 90° to better illustrate certain features of the semiconductor device 200.

Corresponding to operation 2634 of FIG. 26, FIG. 36A is a top view of the semiconductor device 200 in which a metal is selectively deposited over the second high-k dielectric 252 deposited at operation 2630. FIG. 36B is a corresponding cross-sectional view of the semiconductor device 200, in accordance with various embodiments.

As shown in FIG. 36B, a second gate electrode 254 material is deposited over the second high-k dielectric 252 to form a gate structure surrounding the second high-k dielectric 252 (e.g., the gate dielectric). The second gate electrode 254 (e.g., gate structure) surrounds or substantially surrounds the dielectric to form a GAA structure. The second gate electrode 254 (e.g., gate structure) can be formed from the same conductive material used to form the first gate electrode 250, or can be a different material (e.g., a different metal). For example, the second gate electrode 254 can be selected according to a second high-k dielectric 252 (e.g., can be selectively deposited over the second high-k dielectric 252). In some embodiments, the first gate electrode 250 or the second gate electrode 254 can be formed in a fashion as has previously been discussed with regards to operations 2130, 2134, 2630, or 2634. FIGS. 37A and 37B depict the same semiconductor device 200 as FIGS. 36A and 36B, wherein the semiconductor device 200 is rotated 90° to better illustrate certain features of the semiconductor device 200.

Figure 38:
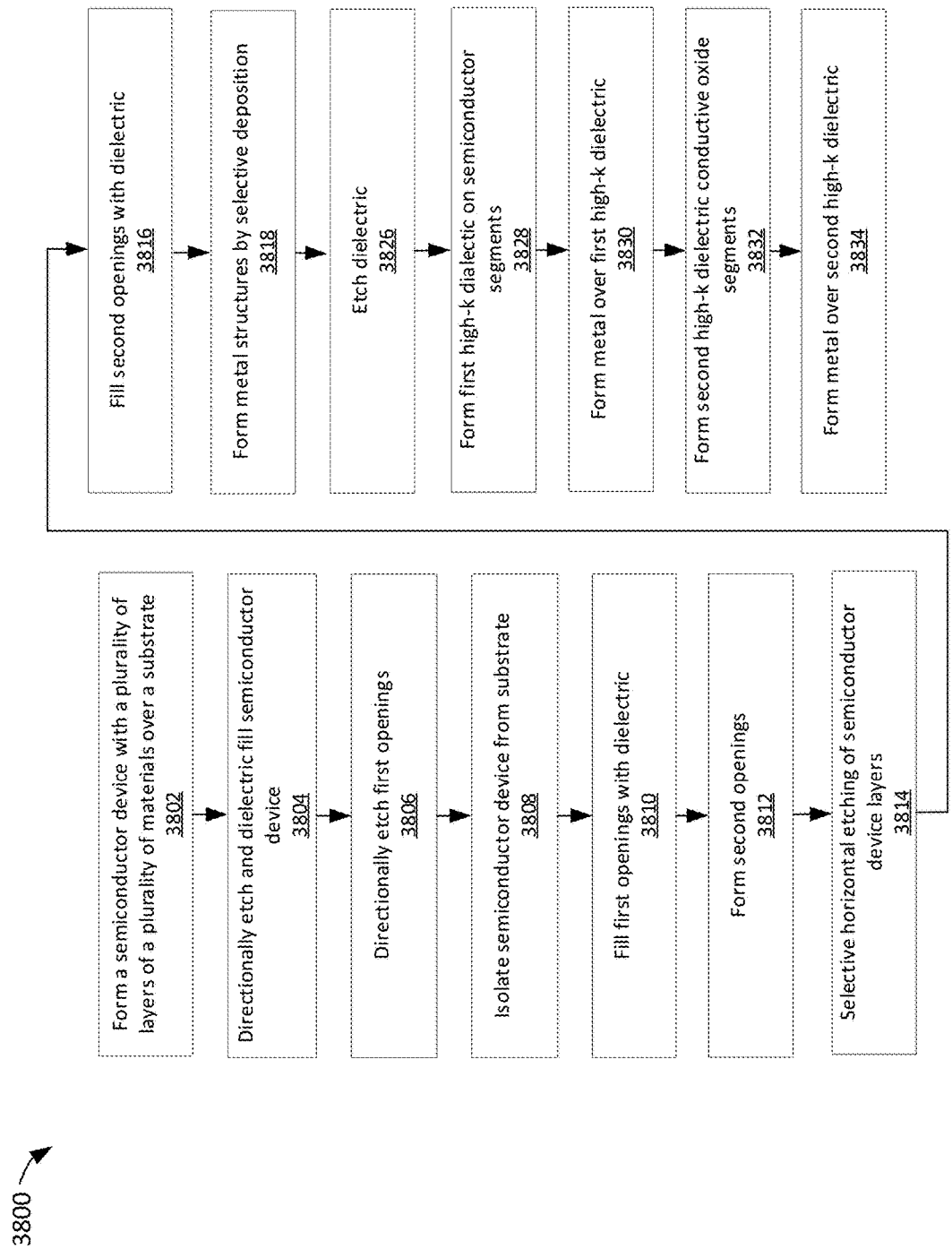
FIG. 38 is a flow chart of a method for making a semiconductor device, in accordance with some embodiments.

FIG. 38 is a flow chart of an example method 3800 for making a semiconductor memory device (e.g., one or more transistors), based on a vertical stack structure. For example, the vertical stack structure can be formed by a plurality of nanosheets to form a memory device. The vertical stack structure can include two or more pairs of transistors (e.g., n paired sets of silicon and conductive oxide transistors to form memory cells having n bits.). The gate electrodes (e.g., gate structures) of the various transistors can be selectively deposited. In some embodiments, the transistors can be connected by an additional operation, such as along a surface of the semiconductor device 200, or based on one or more conductive layers (e.g., similar to the conductive seventh layer 216 of FIG. 2B). It is noted that the method 3800 is merely an example, and is not intended to limit the present disclosure. Accordingly, it is understood that additional operations may be provided before, during, and after the method 3800 of FIG. 38, and that some other operations may only be briefly described herein.

In various embodiments, operations of the method 3800 may be associated with top views and cross-sectional views of an example semiconductor device 200 at various fabrication stages as shown in FIGS. 39A to 41A and FIGS. 39B to 41B, respectively, which will be discussed in further detail below. It should be understood that the semiconductor device 200, shown in FIGS. 39A to 41A and FIGS. 39B to 41B, may include a number of other devices such as inductors, fuses, capacitors, coils, etc., while remaining within the scope of the present disclosure.

In brief overview, the method 3800 starts with operation 3802 of forming a semiconductor device 200 comprising a plurality of materials formed over a substrate. The method 3800 continues to operation 3804 of directionally etching a portion of the semiconductor device, and filling the etched portion with a dielectric fill. The method 3800 proceeds to operation 3806 of directionally etching first openings into the semiconductor device. The method 3800 proceeds to operation 3808 of isolating a portion of the semiconductor device 200 from the substrate. The method 3800 proceeds to operation 3810 of filling the first openings with a dielectric fill. The method 3800 proceeds to operation 3812 of directionally etching second openings into the semiconductor device. The method 3800 proceeds to operation 3814 of selectively etching horizontal portions of one or more layers of the semiconductor device. The method 3800 proceeds to operation 3816 wherein the second openings are filled with a dielectric. The method 3800 proceeds to operation 3818 of forming metal structures by selective deposition. At operation 3826 of the method 3800, a dielectric is etched. The method 3800 proceeds to operation 3828 wherein a first high-k dielectric is formed over the silicon. The method 3800 proceeds to operation 3830 wherein a metal is formed over the first high-k dielectric. At operation 3832 of the method 3800, a second high-k dielectric is formed over conductive oxide layers of the semiconductor device. At operation 3834, metal is formed over the second high-k dielectric.

Various operations depicted in FIG. 38 may be similar to other operations depicted in this disclosure. For example, in various embodiments, the operations 3802, 3804, 3806, 3808, 3810, 3812, 3814, 3816, 3826, 3828, 3830, and 3832 may be performed in a fashion as has previously been discussed with regards to operations 2602, 2604, 2606, 2608, 2610, 2612, 2614, 2616, 2626, 2628, 3630 and 2632 as depicted in FIG. 26.

Corresponding to operation 3818 of FIG. 38, FIG. 39A is a top view of the semiconductor device 200 in which metal structures 242 are formed along the semiconductor materials for the source-drain contacts. FIG. 39B is a corresponding cross-sectional view of the semiconductor device 200, in accordance with various embodiments.

As shown in FIG. 39B, the metal structures 242 are formed by a selective deposition process. The selective deposition process can a form plurality of metal structures 242 without intervening etching process (e.g., can be formed simultaneously). The simultaneous formation of the metal structures 242 or the reduction of etching processes can reduce overall process steps. The reduction in process steps, relative to alternating etch and fill processes, can vary according to a number of vertical transistors of a semiconductor device 200. A semiconductor device 200 including two vertical transistors, such as the semiconductor device 200 of FIG. 1 can omit operations 118, 120, 122, and 124. A semiconductor device 200 including two vertical transistors can include a different, greater number of operations or sub-operations thereof. In some embodiments, a plurality of metals can be selectively deposited. For example a different metal can be deposited to form the metal structures 242 adhered to the conductive oxide nanostructures and the semiconductor nanostructures (e.g., in sequential sub-operations of operation 3818).

Corresponding to operation 3834 of FIG. 38, FIG. 40A is a top view of the semiconductor device 200 in which a metal is deposited over the second high-k dielectric 252 deposited at operation 3832. FIG. 40B is a corresponding cross-sectional view of the semiconductor device 200, in accordance with various embodiments.

As shown in FIG. 40B, second gate electrode 254 material is deposited over the second high-k dielectric 252 to form a gate structure surrounding the second high-k dielectric 252 (e.g., the gate dielectric). The second gate electrode 254 surrounds or substantially surrounds the dielectric to form a GAA structure. The second gate electrode 254 can be formed from the same conductive material used to form the first gate electrode 250, or can be a different material (e.g., a different metal). For example, the second gate electrode 254 can be selected according to a second high-k dielectric 252 (e.g., can be selectively deposited over the second high-k dielectric 252). In some embodiments, the second gate electrodes 254 of each conductive oxide-based transistor can be formed simultaneously by a selective deposition process. In some embodiments, the first gate electrodes 250 can be formed in a similar manner at operation 3830. In some embodiments, a dielectric fill can isolate an upper surface of the semiconductor device 200. FIGS. 41A and 41B depict the same semiconductor device 200 as FIGS. 40A and 40B, wherein the semiconductor device 200 is rotated 90° to better illustrate certain features of the semiconductor device 200.

Figure 42:
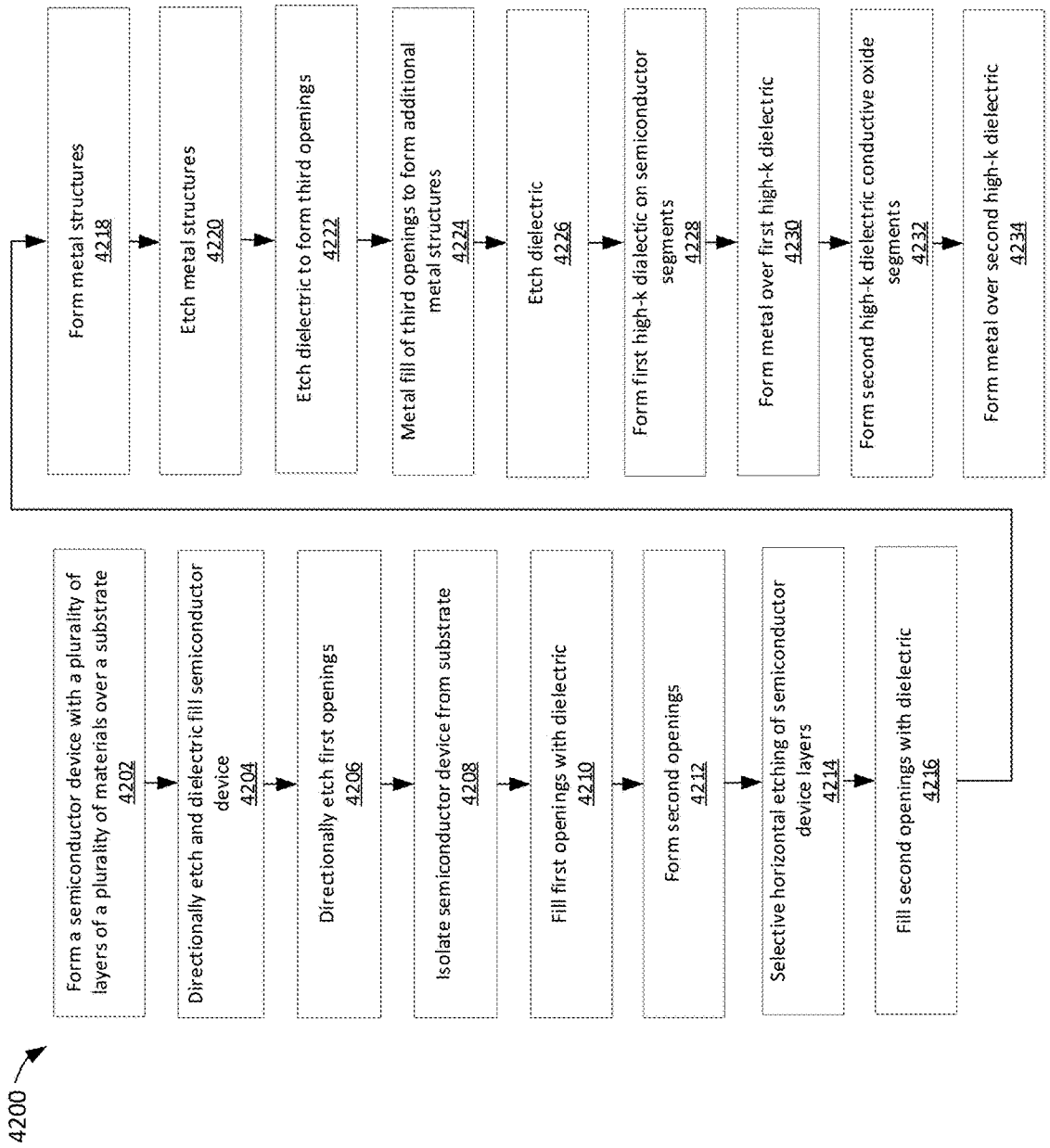
FIG. 42 is a flow chart of a method for making a semiconductor device, in accordance with some embodiments.

FIG. 42 is a flow chart of an example method 4200 for making a semiconductor memory device (e.g., one or more transistors), based on a vertical stack structure over a complementary field effect transistor (CFET). For example, the CFET devices can form a general purpose logic device (e.g., a CPU, GPU, etc.), and the memory device can be formed thereupon (e.g., to provide memory for the general purpose logic device). It is noted that the method 4200 is merely an example, and is not intended to limit the present disclosure. Accordingly, it is understood that additional operations may be provided before, during, and after the method 4200 of FIG. 42, and that some other operations may only be briefly described herein.

In various embodiments, operations of the method 4200 may be associated with top views and cross-sectional views of an example semiconductor device 200 at various fabrication stages as shown in FIGS. 43A to 51A and FIGS. 43B to 51B, respectively, which will be discussed in further detail below. It should be understood that the semiconductor device 200, shown in FIGS. 43A to 51A and FIGS. 43B to 51B, may include a number of other devices such as inductors, fuses, capacitors, coils, etc., while remaining within the scope of the present disclosure.

In brief overview, the method 4200 starts with operation 4202 of forming a semiconductor device comprising a plurality of materials formed over a substrate. The method 4200 continues to operation 4204 of directionally etching a portion of the semiconductor device, and filling the etched portion with a dielectric fill. The method 4200 proceeds to operation 4206 of directionally etching first openings into the semiconductor device. The method 4200 proceeds to operation 4208 of isolating a portion of the semiconductor device from the substrate. The method 4200 proceeds to operation 4210 of filling the first openings with a dielectric fill. The method 4200 proceeds to operation 4212 of directionally etching second openings into the semiconductor device. The method 4200 proceeds to operation 4214 of selectively etching horizontal portions of one or more layers of the semiconductor device. The method 4200 proceeds to operation 4216 wherein the second openings are filled with a dielectric. The method 4200 proceeds to operation 4218 of forming metal structures (e.g., within the second openings). The method 4200 proceeds to operation 4220 of etching the metal structures. The method 4200 proceeds to operation 4222 of directionally etching the semiconductor device to form third openings. At operation 4224 of the method 4200, the third openings are filled with a conductive material such as a metal. At operation 4226 of the method 4200, a dielectric is etched. The method 4200 proceeds to operation 4228 wherein a first high-k dielectric is formed over the silicon. The method 4200 proceeds to operation 4230 wherein a metal is formed over the first high-k dielectric. At operation 4232 of the method 4200, a second high-k dielectric is formed over conductive oxide layers of the semiconductor device. At operation 4234, metal is formed over the second high-k dielectric.

Corresponding to operation 4202 of FIG. 42, FIG. 43A is a top view of the semiconductor device 200 in which a plurality of layers (e.g., blanket layers), including a plurality of materials (e.g., conductive and dielectric materials), are formed over a substrate 202 (e.g., a crystalline silicon, a glass substrate, etc.). FIG. 43B is a corresponding cross-sectional view of the semiconductor device 200, in accordance with various embodiments.

As shown in FIG. 43B, additional nanosheet layers are formed to construct additional transistor devices (e.g., a CFET), relative to the operations described with respect to FIG. 21. Particularly, a first CFET layer 4302 is formed over the substrate 202 which may be similar to the first layer 204. A second CFET layer 4304, which may be similar to the second layer 206, is formed over the first CFET layer 4302. A third CFET layer 4306, which may be similar to the third layer 208, is formed over the second CFET layer 4304. In some embodiments, the third CFET layer 4306 may be of a different type than the third layer 208. For example, the third CFET layer 4306 can be a p-type or an n-type semiconductor material (e.g., a doped silicon segment). A fourth CFET layer 4308, which may be similar to the fourth layer 210, is formed over the third CFET layer 4306. A fifth CFET layer 4310, which may be similar to the fifth layer 212, is formed over the fourth CFET layer 4308. The fifth CFET layer 4310 can be the same type as the third CFET layer 4306. For example, the fifth CFET layer 4310 can be the same material having the same doping applied thereto. A sixth CFET layer 4312, which may be similar to the sixth layer 214, is formed over the fifth CFET layer 4310. Each of a seventh CFET layer 4314, an eighth CFET layer 4316, a ninth CFET layer 4318, a tenth CFET layer 4320, an eleventh CFET layer 4322, and a twelfth CFET layer 4324 can be similar to the first CFET layer 4302 through the sixth CFET layer 4312, excepting the type of the semiconductor segments (e.g., n-type semiconductor segments can be substituted for p-type semiconductors, or vice versa).

Various operations depicted in FIG. 42 may be similar to other operations depicted in this disclosure. For example, in various embodiments, the operations 4204, 4206, 4210, 4212, 4214, 4216, 4220, 4222, 4226, 4228, and 4232 may be performed in a fashion as has previously been discussed with regards to operations 104, 106, 110, 112, 114, 116, 120, 122, 126, 128, and 132 as depicted in FIG. 1. The operations can be adjusted based on the layers formed in operation 4202. For example, at operation 4208, the various transistors of the semiconductor device 200 can be isolated from each other in additional to from the substrate 202.

Corresponding to operation 4208 of FIG. 42, FIG. 44A is a top view of the semiconductor device 200 in which a plurality of nanosheets are etched to isolate portions of the semiconductor device 200 from the substrate 202, or other nanosheets of the semiconductor device 200. FIG. 44B is a corresponding cross-sectional view of the semiconductor device 200, in accordance with various embodiments.

As shown in FIG. 44B, a bottommost layer of the semiconductor device 200, which is associated with a first transistor, (e.g., the first CFET layer 4302), and a bottommost layer of additional semiconductor devices 200 (e.g., the seventh CFET layer 4314 and the first layer 204), are selectively removed. For example, the layers may be removed in a fashion as has previously been discussed with regards to operation 108.

Corresponding to operation 4216 of FIG. 42, FIG. 45A is a top view of the semiconductor device 200 in which second openings are filled with one or more dielectric materials. FIG. 45B is a corresponding cross-sectional view of the semiconductor device 200, in accordance with various embodiments.

As shown in FIG. 45B, a first dielectric 240 is formed in the second openings. For example, the second openings can be expanded to a first dimension which is depicted as the dimension of the first dielectric 240 immediately over the substrate 202. The opening dimension can be maintained along the vertical opening of the semiconductor device 200. The first dielectric 240 can be the same dielectric as the eighth layer 218 of the semiconductor device 200. The first dielectric 240 can thereafter be etched to a defined depth, wherein the etchant is stripped to reopen the second openings. A dielectric fill material 234 can fill air gaps to isolate the various transistors of the semiconductor device 200 (e.g., from the substrate 202 and therebetween).

Corresponding to operation 4218 of FIG. 42, FIG. 46A is a top view of the semiconductor device 200 in which metal structures 242 are formed along the semiconductor segments for the source-drain contacts. FIG. 46B is a corresponding cross-sectional view of the semiconductor device 200, in accordance with various embodiments.

As shown in FIG. 46B, metal structures 242 (e.g., source/drain electrodes) are formed along the lateral edges of at least the semiconductor segments of the bottommost CFET transistor (e.g., the third CFET layer 4306, and the fifth CFET layer 4310 of the semiconductor device 200). In some embodiments, the metal structures 242 are deposited to fill the first openings and the upper surface of the semiconductor device 200 is thereafter planarized. In some embodiments, dielectric fills and metal structures 242 are formed alternatively, along the various transistors of the vertical structure. In some embodiments, the metal structures 242 are selectively grown on the semiconductor segments or the conductive oxides as discussed with regards to FIG. 30B.

Corresponding to operation 4224 of FIG. 42, FIG. 47A is a top view of the semiconductor device 200 in which metal structures 242 are formed along the semiconductor or conductive oxide nanostructures for the source-drain contacts. FIG. 47B is a corresponding cross-sectional view of the semiconductor device 200, in accordance with various embodiments.

As shown in FIG. 47B, additional metal structures 242 are formed along the semiconductor nanostructures and conductive oxide nanostructures of the transistors disposed therein. The various metal structures 242 can be formed according to the various materials and operations described herein, with various modifications, omissions, additions, or substitutions therefrom.

Corresponding to operation 4230 of FIG. 42, FIG. 48A is a top view of the semiconductor device 200 in which metal is deposited over a first high-k dielectric 248. FIG. 48B is a corresponding cross-sectional view of the semiconductor device 200, in accordance with various embodiments.

As shown in FIG. 48B, metal is deposited over the first high-k dielectric 248 deposited at operation 4228. The metal can be deposited by various selective deposition processes or other fill processes, such as an area selective or material selective deposition process (e.g., selective adherence to the first high-k dielectric 248). The metal can form a first gate electrode 250 for the lower three depicted transistors which may also be referred to herein as semiconductor transistors, or silicon transistors. FIGS. 49A and 49B depict the same semiconductor device 200 as FIGS. 48A and 48B, wherein the semiconductor device 200 is rotated 90° to better illustrate certain features of the semiconductor device 200.

Corresponding to operation 4234 of FIG. 42, FIG. 50A is a top view of the semiconductor device 200 in which metal is deposited over a second high-k dielectric 252. FIG. 50B is a corresponding cross-sectional view of the semiconductor device 200, in accordance with various embodiments.

Figure 51B:
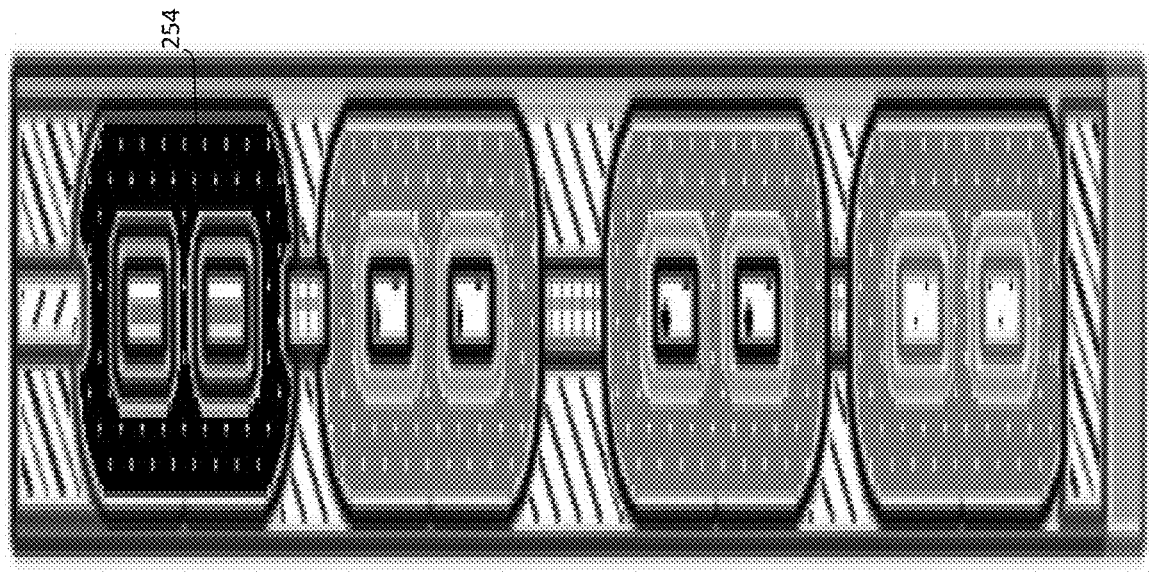
FIGS. 51A and 51B illustrate a top view and a cross sectional view of a semiconductor device, respectively, during various fabrication stages, made by the method of FIG. 42, in accordance with some embodiments.
Figure 51A:
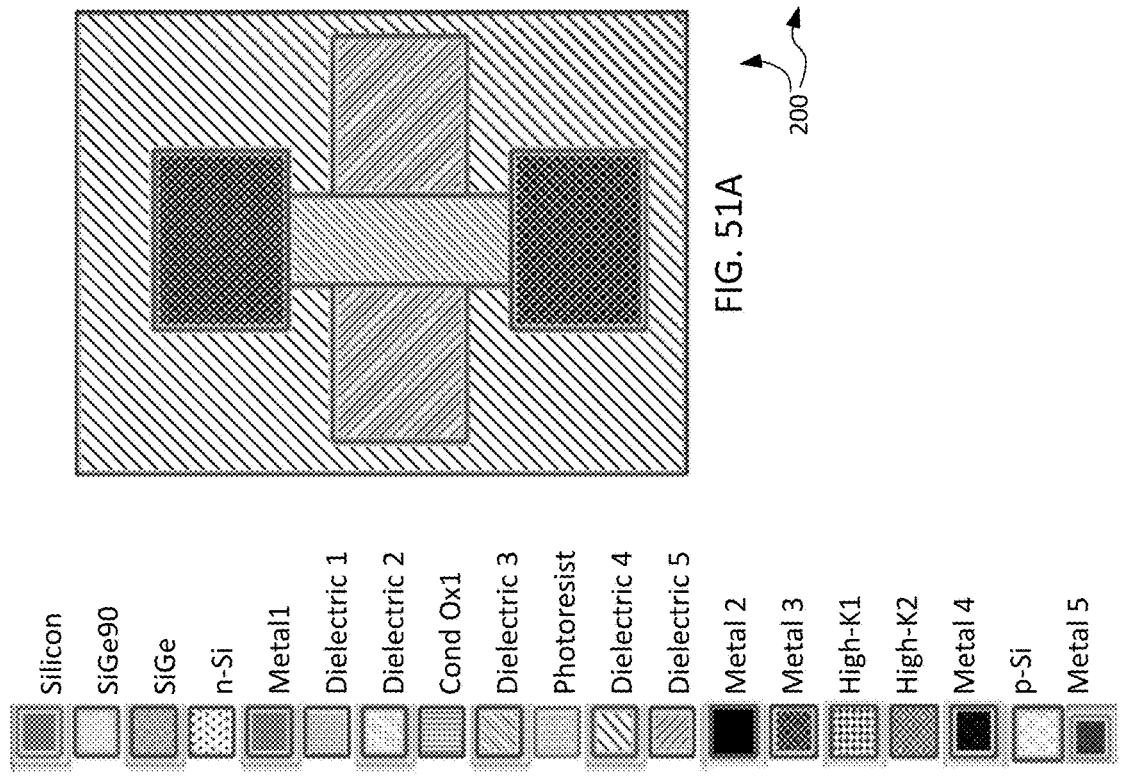

As shown in FIG. 50B, a second gate electrode 254 material is deposited over the second high-k dielectric 252 to form a gate structure surrounding the second high-k dielectric 252 (e.g., the gate dielectric). The second gate electrode 254 surrounds or substantially surrounds the dielectric to form a GAA structure. FIGS. 51A and 51B depict the same semiconductor device 200 as FIGS. 50A and 50B, wherein the semiconductor device 200 is rotated 90° to better illustrate certain features of the semiconductor device 200.

Figure 52:
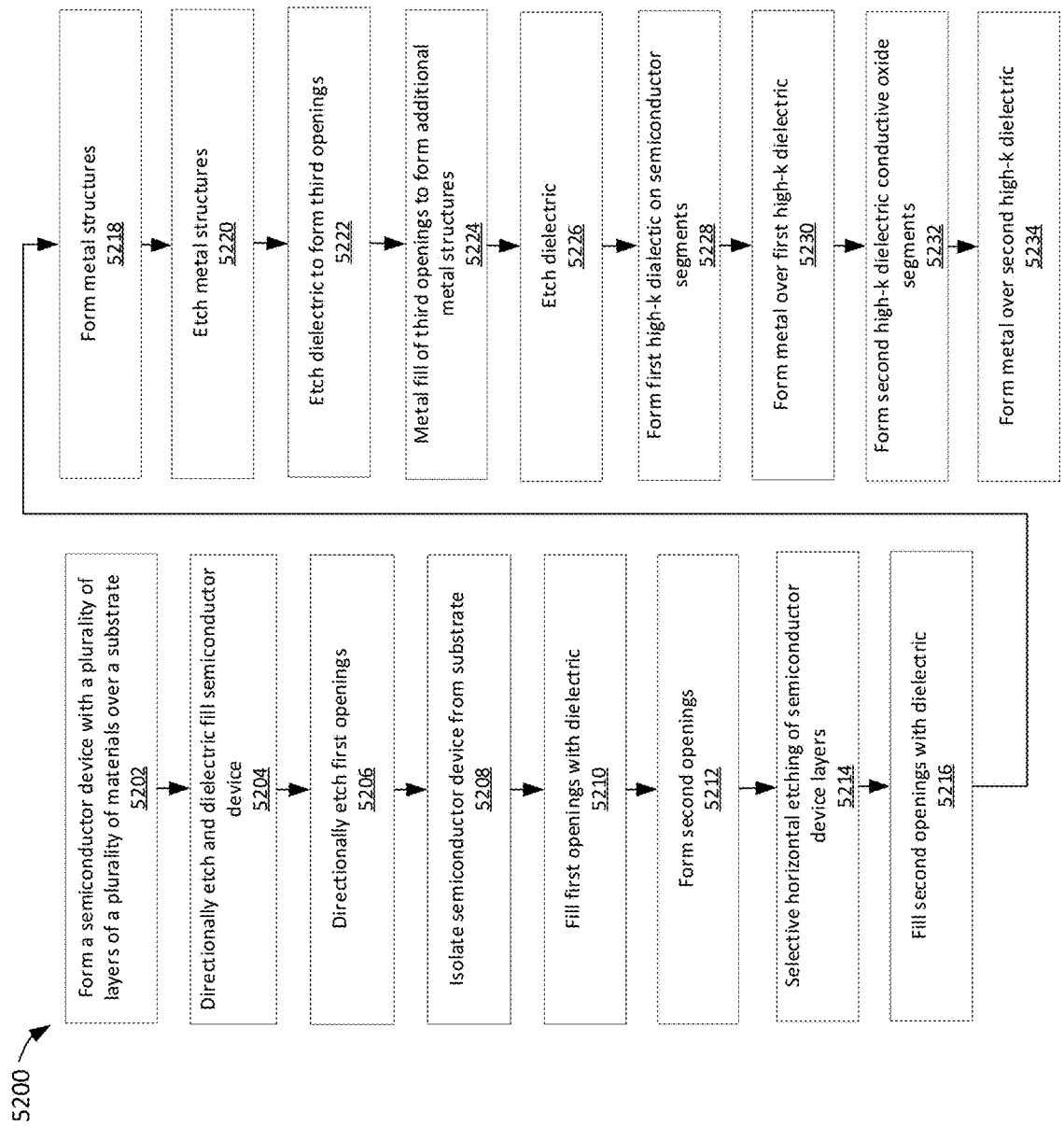
FIG. 52 is a flow chart of a method for making a semiconductor device, in accordance with some embodiments.

FIG. 52 is a flow chart of an example method 5200 for making a memory device (e.g., one or more transistors), based on a vertical stack structure. For example, a conductive oxide CFET can be formed over a semiconductor CFET. The conductive oxide CFET can form a memory device. The semiconductor CFET can form general purpose logic which may connect to the memory device. For example, a memory array can be formed over a processor. It is noted that the method 5200 is merely an example, and is not intended to limit the present disclosure. Accordingly, it is understood that additional operations may be provided before, during, and after the method 5200 of FIG. 52, and that some other operations may only be briefly described herein.

In various embodiments, operations of the method 5200 may be associated with top views and cross-sectional views of an example semiconductor device 200 at various fabrication stages as shown in FIGS. 53A to 56A and FIGS. 53B to 56B, respectively, which will be discussed in further detail below. It should be understood that the semiconductor device 200, shown in FIGS. 53A to 56A and FIGS. 53B to 56B, may include a number of other devices such as inductors, fuses, capacitors, coils, etc., while remaining within the scope of the present disclosure.

In brief overview, the method 5200 starts with operation 5202 of forming a semiconductor device comprising a plurality of materials formed over a substrate. The method 5200 continues to operation 5204 of directionally etching a portion of the semiconductor device, and filling the etched portion with a dielectric fill. The method 5200 proceeds to operation 5206 of directionally etching first openings into the semiconductor device. The method 5200 proceeds to operation 5208 of isolating a portion of the semiconductor device from the substrate. The method 5200 proceeds to operation 5210 of filling the first openings with a dielectric fill. The method 5200 proceeds to operation 5212 of directionally etching second openings into the semiconductor device. The method 5200 proceeds to operation 5214 of selectively etching horizontal portions of one or more layers of the semiconductor device. The method 5200 proceeds to operation 5216 wherein the second openings are filled with a dielectric. The method 5200 proceeds to operation 5218 of forming metal structures (e.g., within the second openings). The method 5200 proceeds to operation 5220 of etching the metal structures. The method 5200 proceeds to operation 5222 of directionally etching the semiconductor device to form third openings. At operation 5224 of the method 5200, the third openings are filled with a conductive material such as a metal. At operation 5226 of the method 5200, a dielectric is etched. The method 5200 proceeds to operation 5228 wherein a first high-k dielectric is formed over the silicon. The method 5200 proceeds to operation 5230 wherein a metal is formed over the first high-k dielectric. At operation 5232 of the method 5200, a second high-k dielectric is formed over conductive oxide layers of the semiconductor device. At operation 5234, metal is formed over the second high-k dielectric.

Corresponding to operation 5202 of FIG. 52, FIG. 53A is a top view of the semiconductor device 200 in which a plurality of layers are formed of a plurality of materials (e.g., conductive and dielectric materials). FIG. 53B is a corresponding cross-sectional view of the semiconductor device 200, in accordance with various embodiments.

As shown in FIG. 53B, nanosheets to form a semiconductor-based transistor are deposited between the substrate 202 and the first layer 204. For example, the third layer 208 and the fifth layer 212 of the semiconductor device 200 can be an n-type semiconductor. A first opposite type (e.g., p-type) semiconductor layer 5308 and a second opposite type semiconductor layer 5312 can be disposed between alternating dielectric layers. For example, a lower semiconductor dielectric layer 5306, a middle semiconductor dielectric layer 5310, and an upper semiconductor dielectric layer 5314 be disposed below, between, and above the semiconductor nanosheets, respectively. A semiconductor sacrificial layer 5304 can separate the additional semiconductor layers from the substrate 202.

Nanosheets to form a conductive oxide-based transistor are deposited between the sixth layer 214 and the eighth layer 218. For example, the tenth layer 222 and the twelfth layer 226 of the semiconductor device 200 can be an n-type conductive oxide. A first opposite type (e.g., p-type) oxide layer 5320 and a second opposite type oxide layer 5324 can be disposed between alternating dielectric layers. For example, a lower oxide dielectric layer 5318, a middle oxide dielectric layer 5322, and an upper oxide dielectric layer 5326 can be disposed below, between, and above the oxide nanosheets, respectively. Another further dielectric layer 5316 can separate the conductive oxide transistors from the semiconductor transistors.

Various operations depicted in FIG. 52 may be similar to other operations depicted in this disclosure. For example, in various embodiments, the operations 5204, 5206, 5208, 5210, 5212, 5214, 5216, 5220, 5222, 5254, 5226, 5228, 5230, and 5232 may be performed in a fashion as has previously been discussed with regards to operations 104, 106, 108, 110, 112, 114, 116, 120, 122, 124, 126, 128, 130 and 132 as depicted in FIG. 1. The operations can be adjusted based on the layers formed in operation 5202. For example, the various transistors can be interconnected along a surface of the semiconductor device 200.

Corresponding to operation 5218 of FIG. 52, FIG. 54A is a top view of the semiconductor device 200 in which metal structures 242 are formed along the semiconductor segments for the source-drain contacts. FIG. 54B is a corresponding cross-sectional view of the semiconductor device 200, in accordance with various embodiments.

As shown in FIG. 54B, metal structures 242 are formed along the conductive oxide and semiconductor segments of the semiconductor device 200. The metal structures 242 can be formed according to the various methods and materials herein. For example, the metal structures 242 can be formed according to the methods and materials described at operations 118, 124, or 3818.

Corresponding to operation 5234 of FIG. 52, FIG. 55A is a top view of the semiconductor device 200 in which gate electrodes are formed along the conductive oxides and the semiconductor nanostructures. FIG. 55A is a corresponding cross-sectional view of the semiconductor device 200, in accordance with various embodiments.

As shown in FIG. 55B, metal is deposited over the first high-k dielectric 248 deposited at operation 5228, and the second high-k dielectric 252 deposited at operation 5252. The metal can be deposited by various selective deposition processes, such as an area selective or material selective deposition process (e.g., selective adherence to the first high-k dielectric 248). The metal can form first gate electrodes 250 for the semiconductor transistors, and second gate electrodes 254 for the conductive oxide transistors. In various embodiments, various conductive oxide or semiconductor types (e.g., n-type or p-type) can be substituted. For example, in some embodiments, all transistors may be of a same type, all semiconductor-based transistors can be of a same type, or all conductive oxide transistors can be of a same type. The various materials used for the metal structures 242 (e.g., the source/drain electrodes) or the gate structures can be selected according to a transistor type. For example, each of a p-type conductive oxide-based transistor, an n-type conductive oxide-based transistor, a p-type semiconductor-based transistor, and an n-type semiconductor-based transistor can have a metal structure 242 material or a gate structure material associated therewith. FIGS. 56A and 56B depict the same semiconductor device 200 as FIGS. 55A and 55B, wherein the semiconductor device 200 is rotated 90° to better illustrate certain features of the semiconductor device 200.

One aspect of the present disclosure may be directed to a semiconductor device. The semiconductor device can include a first transistor having a first channel region. The first channel region can include one or more nanostructures formed of a semiconductor material. The semiconductor device may include a second transistor having a second channel region. The second transistor can be disposed vertically, relative to the first transistor. The second channel region may include one or more nanostructures formed of a conductive oxide material.

The conductive oxide material of the semiconductor device can be selected from a group consisting of indium oxide ($In_2O_3$), tin oxide ($SnO_2$), indium gallium zinc oxide (InGaZnO), zinc oxide (ZnO), tin oxide (SnO), and combinations thereof.

The first transistor of the semiconductor device can include a first metal structure in contact with the one or more first nanostructures; a second metal structure in contact with the one or more first nanostructures; and a first gate structure around each of the one or more first nanostructures. The second transistor of the semiconductor device can include a third metal structure in contact with the one or more second nanostructures; a fourth metal structure also in contact with the one or more second nanostructures; and a second gate structure around each of the one or more second nanostructures.

The third metal structure or the fourth metal structure of the semiconductor device can extend vertically towards the first metal structure or the second metal structure to be in contact with the first gate structure.

The first transistor and the second transistor of the semiconductor device can operatively function as a read transistor, and a select transistor of a memory cell, respectively.

The first metal structure of the semiconductor device can be disposed on one side of the one or more first nanostructures; the second metal structure can be disposed on the other side of the one or more first nanostructures. The third metal structure of the semiconductor device can be disposed on one side of the one or more second nanostructures; the fourth metal structure can be disposed on the other side of the one or more second nanostructures.

The first gate structure of the semiconductor device can be disposed between the first and second metal structures. The second gate structure of the semiconductor device can be disposed between the third and fourth metal structures.

The semiconductor device can include a third transistor disposed vertically between the first transistor and the second transistor. The third transistor can include a third channel region. The third channel region can include one or more third nanostructures formed of the semiconductor material. The semiconductor device can include a fourth transistor disposed vertically above the second transistor. The fourth transistor can include a fourth channel region. The fourth channel region can include one or more fourth nanostructures formed of the conductive oxide material.

The semiconductor device can include a third transistor disposed vertically below the first transistor and the second transistor. The third transistor can include a third channel region. The third channel region can include one or more third nanostructures formed of the semiconductor material. The first channel region and the third channel region can include a first conductive type. The semiconductor device can include a fourth transistor disposed vertically below the third transistor. The fourth transistor can include a fourth channel region. The fourth channel region can include one or more fourth nanostructures formed of the semiconductor material. The fourth channel region can include a second conductive type, opposite from the first conductive type.

The semiconductor device can include a third transistor disposed vertically below the first transistor and the second transistor. The third transistor can include a third channel region. The third channel region can include one or more third nanostructures formed of the semiconductor material. The first channel region can include a first conductive type.

The third channel region can include a second conductive type, opposite from the first conductive type. The semiconductor device can include a fourth transistor disposed vertically above the second transistor. The fourth transistor can include a fourth channel region. The fourth channel region can include one or more fourth nanostructures formed of the conductive oxide material.

Another aspect of the present disclosure may be directed to a semiconductor device. The semiconductor device can include a first transistor. The first transistor can include a first channel region. The first channel region can include one or more first nanostructures formed of a semiconductor material; a first gate structure around a central portion of each of the one or more first nanostructures; a first source structure disposed on one side of the one or more first nanostructures; and a first drain structure disposed on the other side of the one or more first nanostructures. The semiconductor device can include a second transistor disposed vertically above the first transistor. The second transistor can include a second channel region. The second channel region can include one or more second nanostructures formed of a conductive oxide material; a second gate structure around a central portion of each of the one or more second nanostructures; a second source structure disposed on one side of the one or more second nanostructures; and a second drain structure disposed on the other side of the one or more second nanostructures.

The conductive oxide material of the semiconductor device can be selected from a group consisting of $In_2O_3$, $SnO_2$, InGaZnO, ZnO, SnO, and combinations thereof.

The second drain structure of the semiconductor device can extend vertically towards the first drain structure to be in contact with the first gate structure.

The first transistor and the second transistor of the semiconductor device can operatively function as a read transistor, and a select transistor of a dynamic random access memory (DRAM) cell, respectively.

The semiconductor device can include a third transistor disposed vertically below the first transistor. The third transistor can include a third channel region. The third channel region can include one or more third nanostructures formed of the semiconductor material. The third transistor can include a third gate structure around a central portion of each of the one or more third nanostructures. The third transistor can include a third source structure disposed on one side of the one or more third nanostructures. The third transistor can include a third drain structure disposed on the other side of the one or more third nanostructures. The semiconductor device can include a fourth transistor disposed vertically above the second transistor. The fourth transistor can include a fourth channel region. The fourth channel region can include one or more fourth nanostructures formed of the conductive oxide material. The fourth transistor can include a fourth gate structure around a central portion of each of the one or more fourth nanostructures. The fourth transistor can include a fourth source structure disposed on one side of the one or more fourth nanostructures. The fourth transistor can include a fourth drain structure disposed on the other side of the one or more fourth nanostructures.

The semiconductor device can include a third transistor disposed vertically below the first transistor. The third transistor can include a third channel region. The third channel region can include one or more third nanostructures formed of the semiconductor material. The first channel region and the third channel region have a first conductive type. The third transistor can include a third gate structure around a central portion of each of the one or more third nanostructures. The third transistor can include a third source structure disposed on one side of the one or more third nanostructures. The third transistor can include a third drain structure disposed on the other side of the one or more third nanostructures. A fourth transistor can be disposed vertically below the third transistor. The fourth transistor can include a fourth channel region. The fourth channel region can include one or more fourth nanostructures formed of the semiconductor material. The fourth channel region can have a second conductive type, opposite the first conductive type. The fourth transistor can include a fourth gate structure around a central portion of each of the one or more fourth nanostructures. The fourth transistor can include a fourth source structure disposed on one side of the one or more fourth nanostructures. The fourth transistor can include a fourth drain structure disposed on the other side of the one or more fourth nanostructures.

The semiconductor device can include a third transistor disposed vertically below the first transistor. The third transistor can include a third channel region. The third channel region can include one or more third nanostructures formed of the semiconductor material. The first channel region can have a first conductive type and the third channel region can have a second, opposite conductive type. The third transistor can include a third gate structure around a central portion of each of the one or more third nanostructures. The third transistor can include a third source structure disposed on one side of the one or more third nanostructures. The third transistor can include a third drain structure disposed on the other side of the one or more third nanostructures. The semiconductor device can include a fourth transistor disposed vertically above the second transistor. The fourth transistor can include a fourth channel region. The fourth channel region can include one or more fourth nanostructures formed of the conductive oxide material. The fourth transistor can include a fourth gate structure around a central portion of each of the one or more fourth nanostructures. The fourth transistor can include a fourth source structure disposed on one side of the one or more fourth nanostructures. The fourth transistor can include a fourth drain structure disposed on the other side of the one or more fourth nanostructures.

Another aspect of the present disclosure may be directed to a method for manufacturing a semiconductor device. The method can include providing a stack of layers including a plurality of semiconductor channel layers and a plurality of first semiconductor sacrificial layers alternately arranged on top of one another, and a plurality of conductive oxide layers and a plurality of dielectric sacrificial layers alternately arranged on top of one another. The method can include patterning the semiconductor channel layers, the first semiconductor sacrificial layers, the conductive oxide layers, and the dielectric sacrificial layers. The method can include forming a pair of first metal structures disposed on opposite sides of the patterned semiconductor channel layers and the patterned first semiconductor sacrificial layers, respectively. The method can include forming a pair of second metal structures disposed on opposite sides of the patterned conductive oxide layers and the patterned dielectric sacrificial layers, respectively. The method can include removing the patterned first semiconductor sacrificial layers. The method can include forming a first gate structure around each of the patterned semiconductor channel layers. The method can include removing the patterned dielectric sacrificial layers. The method can include forming a second gate structure around each of the patterned conductive oxide layers.

Providing a stack of layers can include epitaxially growing a second semiconductor sacrificial layer from a substrate; epitaxially growing a lower one of the first semiconductor sacrificial layers on the second semiconductor sacrificial layer; epitaxially growing a lower one of the semiconductor channel layers on the lower first semiconductor sacrificial layer; epitaxially growing a middle one of the first semiconductor sacrificial layers on the lower semiconductor channel layer; epitaxially growing an upper one of the semiconductor channel layers on the middle first semiconductor sacrificial layer; epitaxially growing an upper one of the first semiconductor sacrificial layers on the upper semiconductor channel layer; depositing a lower one of the dielectric sacrificial layers over the upper first semiconductor sacrificial layer; depositing a lower one of the conductive oxide layers on the lower dielectric sacrificial layer; depositing a middle one of the dielectric sacrificial layers on the lower conductive oxide layer; depositing an upper one of the conductive oxide layers on the middle dielectric sacrificial layer; and depositing an upper one of the dielectric sacrificial layers on the upper conductive oxide layer.

The first semiconductor sacrificial layers can include silicon germanium with a first molar ratio. The second semiconductor sacrificial layer can include silicon germanium with a second molar ratio. The semiconductor channel layers can include silicon, and the conductive oxide layers include a material can be selected from a group consisting of: $In_2O_3$, $SnO_2$, InGaZnO, ZnO, SnO, and combinations thereof.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A structure, comprising:
   a dielectric layer directly contacting a semiconductor substrate;
   a first transistor disposed on the dielectric layer and comprising a first channel region, wherein the first channel region includes one or more first nanostructures formed of a semiconductor material, and wherein a gate electrode of the first transistor is interposed between the dielectric layer and a gate dielectric layer; and
   a second transistor disposed vertically with respect to the first transistor and comprising a second channel region, wherein the second channel region includes one or more second nanostructures formed of a conductive oxide material.

2. The structure of claim 1, wherein the oxide material is a nanosheet of indium oxide ($In_2O_3$), tin oxide ($SnO_2$), indium gallium zinc oxide (InGaZnO), zinc oxide (ZnO), or tin oxide (SnO).

3. The structure of claim 1, wherein the gate electrode of the first transistor is coupled to a drain of the second transistor.

4. The structure of claim 3, wherein the second transistor is stacked over the first transistor.

5. The structure of claim 1, wherein the second transistor is stacked over the first transistor, the structure further comprising a conductive via coupling a gate of the first transistor to a drain of the second transistor.

6. The structure of claim 1, wherein the first and second channel regions each comprise at least two parallel nanosheets.

7. The structure of claim 1, wherein the first and second transistor are connected as a DRAM cell, one of the first or second transistors being a select transistor and the other of the first or second transistor being a storage node.

8. A method comprising:
   providing a stack of layers comprising:
      a layer of a first sacrificial material;
      a first layer of a second sacrificial material;
      at least one semiconductor channel layer on the first layer of the second sacrificial material with a second or additional layer of the second sacrificial material provided over each semiconductor channel layer;
      an insulation layer;
      the stack of layers having alternating layers of an oxide channel layer and a third sacrificial material; and
      a lowermost layer and an uppermost layer in the stack of layers comprising the third sacrificial material;
   patterning the layers to form a plurality of transistor core stacks isolated from each other by an insulating layer;
   etching first openings on first opposing sides of each transistor core stack to access the first sacrificial material;
   removing the first sacrificial material and replacing the removed material with an insulating material,
   etching second openings on second opposing sides of each transistor core stack;
   partially etching the layers of second sacrificial material and third sacrificial material;
   selectively forming a dielectric material on the layers of second and third sacrificial materials,
   forming first source/drain regions adjacent the at least one semiconductor channel layer and second source/drain regions adjacent the at least one oxide channel layer;
   removing the second and third sacrificial materials through the first openings;
   forming high-k gate dielectric materials selectively around the at least one semiconductor channel layer and the at least one oxide channel layer;
   forming a first gate surrounding the at least one semiconductor channel layer; and
   forming a second gate surrounding the at least one oxide channel layer.

9. The method of claim 8, further comprising forming a conductive via coupling one of the second source/drain regions to the first gate.

10. A structure comprising:
    an insulating layer directly contacting a semiconductor substrate;
    at least two first transistors comprising a first channel region, wherein the first channel region includes one or more first nanostructures formed of a semiconductor material, a gate electrode of one of the at least two first transistors is disposed between the insulating layer and a gate dielectric layer; and
    at least one second transistor disposed vertically with respect to the first transistor and comprising a second channel region, wherein the second channel region includes one or more second nanostructures formed of a conductive oxide material.

11. The structure of claim 10, further comprising at least two transistors having a plurality of first channel regions comprising the semiconductor material.

12. The structure of claim 11, wherein at least one of the at least two transistors has at least one of the plurality of first channel regions comprising the semiconductor material and is an n-type device and at least one other of the at least two transistors has at least one of the plurality of first channel regions comprising the semiconductor material and is a p-type device.

13. The structure of claim 11, further comprising at least two second transistors having second channel regions comprising an oxide material.

14. The structure of claim 13, wherein at least one of the at least two transistors having the plurality of first channel regions comprising the semiconductor material being an n-type device, and at least one of the at least two transistors having the plurality of first channel regions comprising the semiconductor material being a p-type device.

15. The structure of claim 10, wherein the oxide material is a nanosheet of indium oxide (In2O3), tin oxide (SnO2), indium gallium zinc oxide (InGaZnO), zinc oxide (ZnO), or tin oxide (SnO).

16. A structure comprising:
    a semiconductor substrate;
    a dielectric layer disposed on the semiconductor substrate;
    a first stack of transistors with at least one p-type semiconductor nanostructure and one n-type semiconductor nanostructure coupled to the at least one p-type semiconductor nanostructure as a complementary transistor pair, a gate electrode of a bottommost transistor in the first stack interposed between the dielectric layer and a gate dielectric layer;

at least one first transistor having at least one first channel region comprising a semiconductor material or an oxide material; and at least one second transistor having at least one second channel region comprising an oxide material.

17. The structure of claim 16, wherein the oxide material is a nanosheet of indium oxide (In2O3), tin oxide (SnO2), indium gallium zinc oxide (InGaZnO), zinc oxide (ZnO), or tin oxide (SnO).

18. The structure of claim 16, wherein the first and second transistor are connected as a DRAM cell, one of the first or second transistors being a select transistor and the other of the first or second transistor being a storage node.

19. The structure of claim 16, wherein the first stack of transistors further comprises:

a third transistor having at least one third channel region comprising the semiconductor material; and a fourth transistor having at least one fourth channel region comprising the oxide material or the semiconductor material.

20. The structure of claim 16, further comprising a second stack of transistors disposed laterally from the first stack of transistors, the second stack of transistors comprising:

at least one p-type semiconductor nanostructure and one n-type semiconductor nanostructure coupled to the at least one p-type semiconductor device as a complementary transistor pair;

at least one third transistor having at least one third channel region comprising the semiconductor material or the oxide material; and at least one fourth transistor having at least one fourth channel region comprising the oxide material.

* * * * *